US012294041B2

United States Patent
Kim et al.

(10) Patent No.: US 12,294,041 B2
(45) Date of Patent: May 6, 2025

(54) LIGHT EMITTING ELEMENT HAVING A SEMICONDUCTOR MAIN BODY CORE WITH A FIRST END INCLINED AND SECOND END WIDTH SMALLER THAN THE CORE

(71) Applicant: Samsung Display Co., LTD., Yongin-si (KR)

(72) Inventors: Myeong Hee Kim, Yongin-si (KR); Je Won Yoo, Bucheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 474 days.

(21) Appl. No.: 17/757,223

(22) PCT Filed: Dec. 7, 2020

(86) PCT No.: PCT/KR2020/017738
§ 371 (c)(1),
(2) Date: Jun. 10, 2022

(87) PCT Pub. No.: WO2021/118182
PCT Pub. Date: Jun. 17, 2021

(65) Prior Publication Data
US 2023/0006101 A1    Jan. 5, 2023

(30) Foreign Application Priority Data
Dec. 10, 2019  (KR) .................... 10-2019-0163900

(51) Int. Cl.
*H01L 33/38*   (2010.01)
*H01L 27/15*   (2006.01)
(Continued)

(52) U.S. Cl.
CPC .......... *H01L 33/382* (2013.01); *H01L 27/156* (2013.01); *H01L 33/62* (2013.01); *H10K 59/122* (2023.02)

(58) Field of Classification Search
CPC ...... H01L 33/382; H01L 33/62; H10K 59/122
See application file for complete search history.

(56) References Cited

U.S. PATENT DOCUMENTS 7,468,528 B2   12/2008   Suzuki et al.
8,460,952 B2    6/2013   Park
(Continued)

FOREIGN PATENT DOCUMENTS

CN   114127962 A    3/2022
EP   3 855 494 A1   7/2021
(Continued)

OTHER PUBLICATIONS

International Search Report of PCT/KR2020/017738, Mar. 22, 2021, 4 pages.

*Primary Examiner* — Alonzo Chambliss
(74) *Attorney, Agent, or Firm* — Womble Bond Dickinson (US) LLP

(57) ABSTRACT

A light-emitting element extending in one direction includes: a semiconductor core including a main body extending in the one direction, a first end connected to one side of the main body and having an inclined side surface, and a second end connected to an other side of the main body and having a width less than that of the main body; and an insulation film around at least a portion of the outer surface of the semiconductor core, wherein the insulation film includes a first insulation film around the first end of the semiconductor core; and a second insulation film around the second end of the semiconductor core, wherein the diameter
(Continued)

of an outer surface of the first insulation film is the same as a diameter of an outer surface of the second insulation film.

20 Claims, 32 Drawing Sheets

(51) Int. Cl.
  *H01L 33/62* (2010.01)
  *H10K 59/122* (2023.01)

(56) References Cited

U.S. PATENT DOCUMENTS

| | | | |
|---|---|---|---|
| 9,012,941 B2 | 4/2015 | Park | |
| 9,178,106 B2 | 11/2015 | Herner et al. | |
| 9,537,051 B2* | 1/2017 | Cha | H01L 33/24 |
| 9,799,796 B2 | 10/2017 | Herner et al. | |
| 11,670,737 B2* | 6/2023 | Yang | H10K 59/131 |
| | | | 257/79 |
| 11,742,460 B2* | 8/2023 | Lee | H01L 33/54 |
| | | | 257/79 |
| 12,132,141 B2* | 10/2024 | Kim | H01L 33/0075 |
| 2014/0209858 A1* | 7/2014 | Cha | H01L 33/08 |
| | | | 257/13 |
| 2016/0072007 A1* | 3/2016 | Choi | H01L 33/0025 |
| | | | 315/291 |
| 2016/0155897 A1* | 6/2016 | Yoo | H01L 33/145 |
| | | | 257/13 |
| 2018/0019369 A1 | 1/2018 | Cho et al. | |
| 2018/0175104 A1 | 6/2018 | Kang et al. | |
| 2019/0081025 A1 | 3/2019 | Chang et al. | |
| 2021/0273131 A1* | 9/2021 | Kang | H01L 33/0095 |
| 2023/0411560 A1* | 12/2023 | Kang | H01L 33/382 |

FOREIGN PATENT DOCUMENTS

| | | |
|---|---|---|
| EP | 3 996 154 A | 5/2022 |
| JP | 2006-196694 A | 7/2006 |
| KR | 2011-0040035 A | 4/2011 |
| KR | 10-1178468 B1 | 9/2012 |
| KR | 2016-0059569 A | 5/2016 |
| KR | 10-1711187 B1 | 3/2017 |
| KR | 10-1713818 B1 | 3/2017 |
| KR | 10-1742518 B1 | 6/2017 |
| KR | 2018-0007376 A | 1/2018 |
| KR | 2018-0071465 A | 6/2018 |
| KR | 2019-0029343 A | 3/2019 |
| KR | 2019-0097946 A | 8/2019 |
| KR | 2019-0126260 A | 11/2019 |
| TW | 201427080 A | 7/2014 |

* cited by examiner

LIGHT EMITTING ELEMENT HAVING A SEMICONDUCTOR MAIN BODY CORE WITH A FIRST END INCLINED AND SECOND END WIDTH SMALLER THAN THE CORE

CROSS-REFERENCE TO RELATED APPLICATION

This application is a U.S. National Phase Patent Application of International Patent Application Number PCT/KR2020/017738, filed on Dec. 7, 2020, which claims priority to Korean Patent Application Number 10-2019-0163900, filed on Dec. 10, 2019, the entire contents of all of which are incorporated by reference herein.

BACKGROUND

1. Field

The present disclosure relates to a light-emitting element and a display device including the same.

2. Description of Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

Aspects of embodiments of the present disclosure provide a light-emitting element having a flat shape by removing a step difference on an outer surface thereof.

Aspects of embodiments of the present disclosure also provide a display device including the light-emitting element.

It should be noted that aspects of embodiments of the present disclosure are not limited thereto and other aspects, which are not mentioned herein, will be apparent to those of ordinary skill in the art from the following description.

According to one or more embodiments of the present disclosure, a light-emitting element extending in one direction includes a semiconductor core including a main body extending in the one direction, a first end connected to one side of the main body and having an inclined side surface, and a second end connected to an other side of the main body and having a width less than that of the main body, and an insulation film around at least a portion of an outer surface of the semiconductor core, wherein the insulation film includes a first insulation film around the first end of the semiconductor core and a second insulation film around the second end of the semiconductor core, and a diameter of an outer surface of the first insulation film is the same as a diameter of an outer surface of the second insulation film.

A thickness of each of the first insulation film and the second insulation film may increase as a distance from the main body increases, and a maximum thickness of the first insulation film may be greater than a maximum thickness of the second insulation film.

In the semiconductor core, an outer surface of the main body may be exposed, and outer surfaces of the first insulation film, the second insulation film, and the main body may be collinear in cross section.

The insulation film may further include a third insulation film around an outer surface of the main body of the semiconductor core, and outer surfaces of the first insulation film, the second insulation film, and the third insulation film may be collinear in cross section.

The third insulation film may have a constant thickness.

The insulation film may further include inorganic particles.

The semiconductor core may include a first semiconductor layer; an active layer around at least a partial area of the first semiconductor layer, and a second semiconductor layer around the active layer and a partial area of the first semiconductor layer.

The first semiconductor layer may include a first portion extending in the one direction, a second portion located on one side of the first portion, and a third portion located on an other side of the first portion and extending in the one direction, wherein the second portion may have a shape in which an outer surface thereof is inclined.

A diameter of the third portion may be less than a diameter of the first portion, and an outer surface of the third portion may be recessed from an outer surface of the first portion toward a center of the first semiconductor layer.

The active layer may surround an outer surface of the first portion.

According to one or more embodiments of the present disclosure, a display device includes a substrate, a first electrode on the substrate, a second electrode on the substrate and spaced from the first electrode; a first insulation layer between the first electrode and the second electrode and covering at least a portion of each of the first electrode and the second electrode, and a light-emitting element on the first insulation layer between the first electrode and the second electrode and extending in one direction, wherein the light-emitting element includes a semiconductor core including a main body extending in the one direction, a first end connected to one side of the main body and having an inclined side surface, and a second end connected to an other side of the main body and having a width less than that of the main body, and an insulation film around at least a portion of an outer surface of the semiconductor core, wherein the insulation film includes a first insulation film partially surrounding the first end of the semiconductor core and a second insulation film partially surrounding the second end of the semiconductor core.

The first insulation film may be located such that at least a portion of the first end is exposed, the second insulation film may be located such that at least a portion of the second end is exposed, and the light-emitting element may further include a first contact electrode in contact with the exposed first end and the first electrode and a second contact electrode in contact with the exposed second end and the second electrode.

The light-emitting element may be located such that at least a portion of the first end of the semiconductor core is on the first electrode and at least a portion of the second end thereof is on the second electrode, and at least a portion of each of the first insulation film and the second insulation film may be in direct contact with the first insulation layer.

The first insulation film may include a first residue located between the first end and the first insulation layer.

The light-emitting element may include a first surface in which the first contact electrode is in contact with the first end, and a second surface in which the first contact electrode is in contact with the first residue, and the second surface may be not parallel to an upper surface of the substrate.

The display device may further include a second insulation layer on the light-emitting element, wherein a width of the second insulation layer may be greater than a length of the main body of the semiconductor core.

The first insulation film may further include a second residue located between the second insulation layer and the first end.

The light-emitting element may further include a third surface in which the first contact electrode is in contact with the second residue, wherein the third surface may be perpendicular to an upper surface of the substrate.

The second insulation layer may further include an insulation pattern located between the first end of the semiconductor core and the first electrode.

The first contact electrode may be in contact with an upper surface of the insulation pattern.

The details of other embodiments are included in the detailed description and the accompanying drawings.

A light-emitting element according to one embodiment includes a semiconductor core and an insulation film around (e.g.; surrounding) the semiconductor core. The semiconductor core can include portions having different widths, and the insulation film can be disposed to compensate for a step difference on an outer surface of the semiconductor core so that the light-emitting element can have a shape having a constant diameter.

Accordingly, in a display device including the light-emitting element, an outer surface of the light-emitting element can form a flat surface, and a material of a contact electrode in contact with both ends of the light-emitting element can be prevented from being disconnected.

The effects according to the embodiments are not limited by the contents exemplified above, and more various effects are included in this disclosure.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
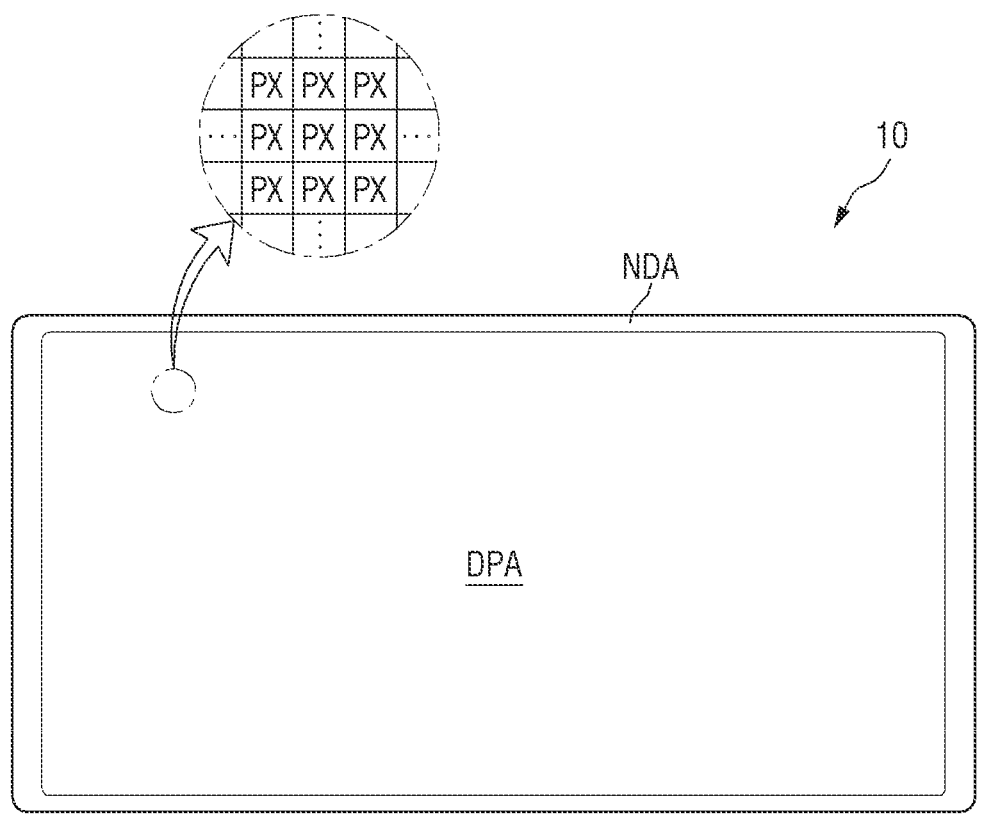
FIG. 1 is a plan view of a display device according to one or more embodiments.
Figure 1:
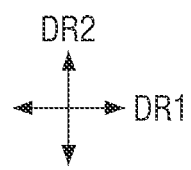

FIG. 1 is a plan view of a display device according to one or more embodiments.

Referring to FIG. 1, a display device 10 displays a video or a still image. The display device 10 may refer to all electronic devices that provide a display screen. For example, the display device 10 may include a television, a notebook, a monitor, an advertising board, an Internet of Things (IoT) device, a mobile phone, a smart phone, a tablet personal computer (PC), an electronic watch, a smart watch, a watch phone, a head mounted display, a mobile communication terminal, an electronic organizer, an electronic book reader, a portable multimedia player (PMP), a navigation device, a game machine, a digital camera, a camcorder, and the like, which provide display screens.

The display device 10 includes a display panel that provides a display screen. Examples of the display panel may include an inorganic light-emitting diode display panel, an organic light-emitting display panel, a quantum dot light-emitting display panel, a plasma display panel, a field emission display panel, and the like. Hereinafter, although a case in which the inorganic light-emitting diode display panel as an example of the display panel is applied is illustrated, the present disclosure is not limited thereto, and when the same technical spirit is applicable, it may be applied to other display panels.

A shape of the display device 10 may be variously modified. For example, the display device 10 may have shapes such as a rectangular shape of which lateral sides are long, a rectangular shape of which longitudinal sides are long, a square shape, a quadrangular shape of which corner portions (vertexes) are round, other polygonal shapes, a circular shape, and the like. A shape of a display area DPA of the display device 10 may also be similar to the overall shape of the display device 10. In FIG. 1, the display device 10 and the display area DPA, which have a rectangular shape of which lateral sides are long, are illustrated.

The display device 10 may include the display area DPA and a non-display area NDA around the edge or periphery of the display area. The display area DPA is an area in which an image may be displayed, and the non-display area NDA is an area in which no image is displayed. The display area DPA may refer to an active area and the non-display area NDA may refer to an inactive area. The display area DPA may generally occupy a center of the display device 10.

The display area DPA may include a plurality of pixels PX. The plurality of pixels PX may be disposed in a matrix direction. For example, the plurality of pixels may be disclosed along rows and columns of a matrix. A shape of each of the pixels PX may be a rectangular shape or a square shape in a plan view, but the present disclosure is not limited thereto, and the shape may be a rhombus shape of which each side is inclined with respect to one direction. The pixels PX may be alternately arranged in a stripe or a PENTILE® arrangement structure, but the present disclosure is not limited thereto. This PENTILE® arrangement structure may be referred to as an RGBG matrix structure (e.g.; a PENTILE® matrix structure or an RGBG structure (e.g.; a PENTILE® structure)). PENTILE® is a registered trademark of Samsung Display Co., Ltd Republic of Korea. In addition, each of the pixels PX may include one or more light-emitting elements 300 that emit light in a specific wavelength range, thereby displaying a specific color.

The non-display area NDA may be disposed around the display area DPA. The non-display area NDA may completely or partially surround the display area DPA. The display area DPA has a rectangular shape, and the non-display area NDA may be disposed adjacent to four sides of the display area DPA. The non-display area NDA may form a bezel of the display device 10. In each non-display area NDA, lines or circuit driving parts included in the display device 10 may be disposed, or external devices may be mounted.

Figure 2:
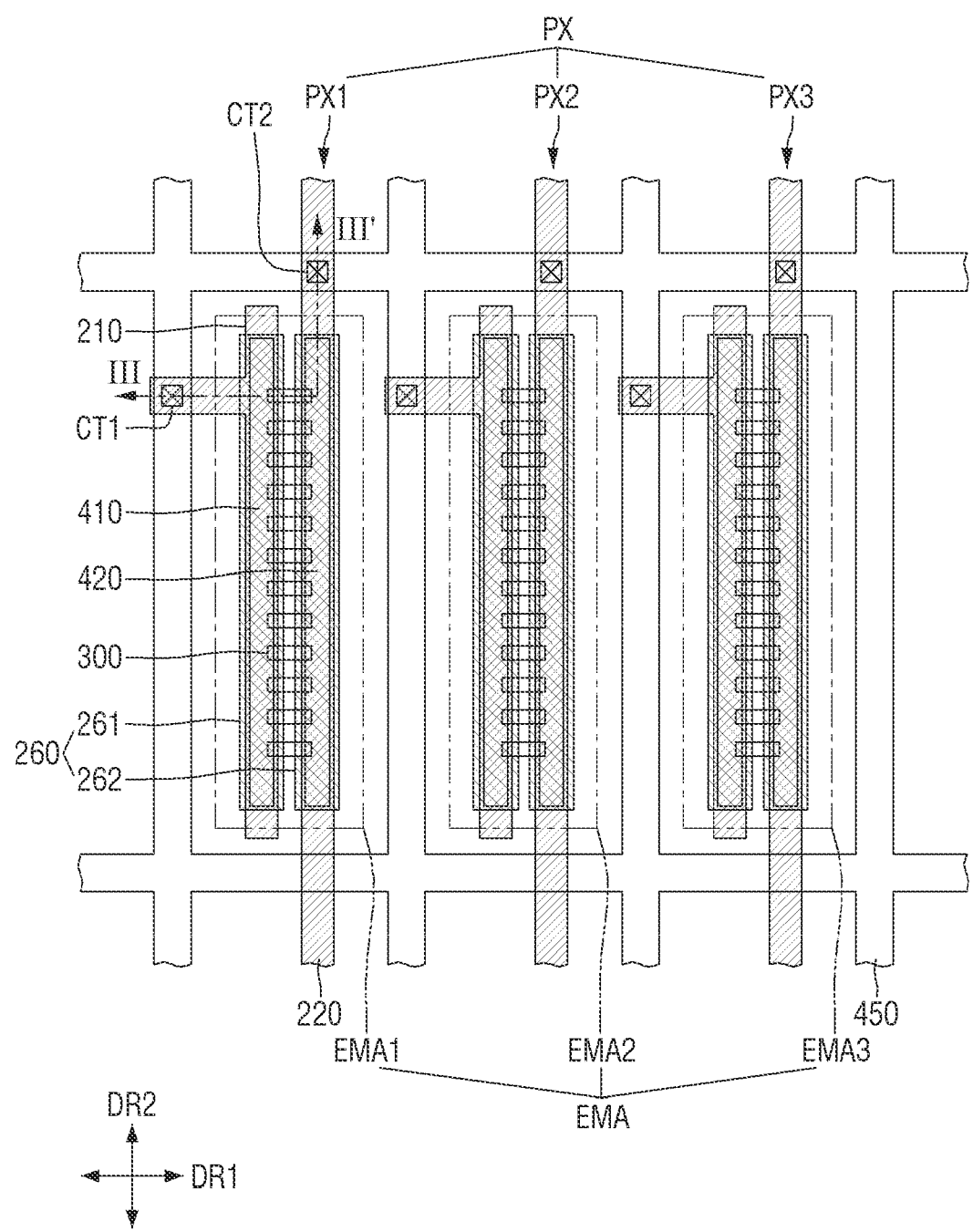
FIG. 2 is a plan view illustrating one pixel of the display device according to one or more embodiments.
Figure 3:
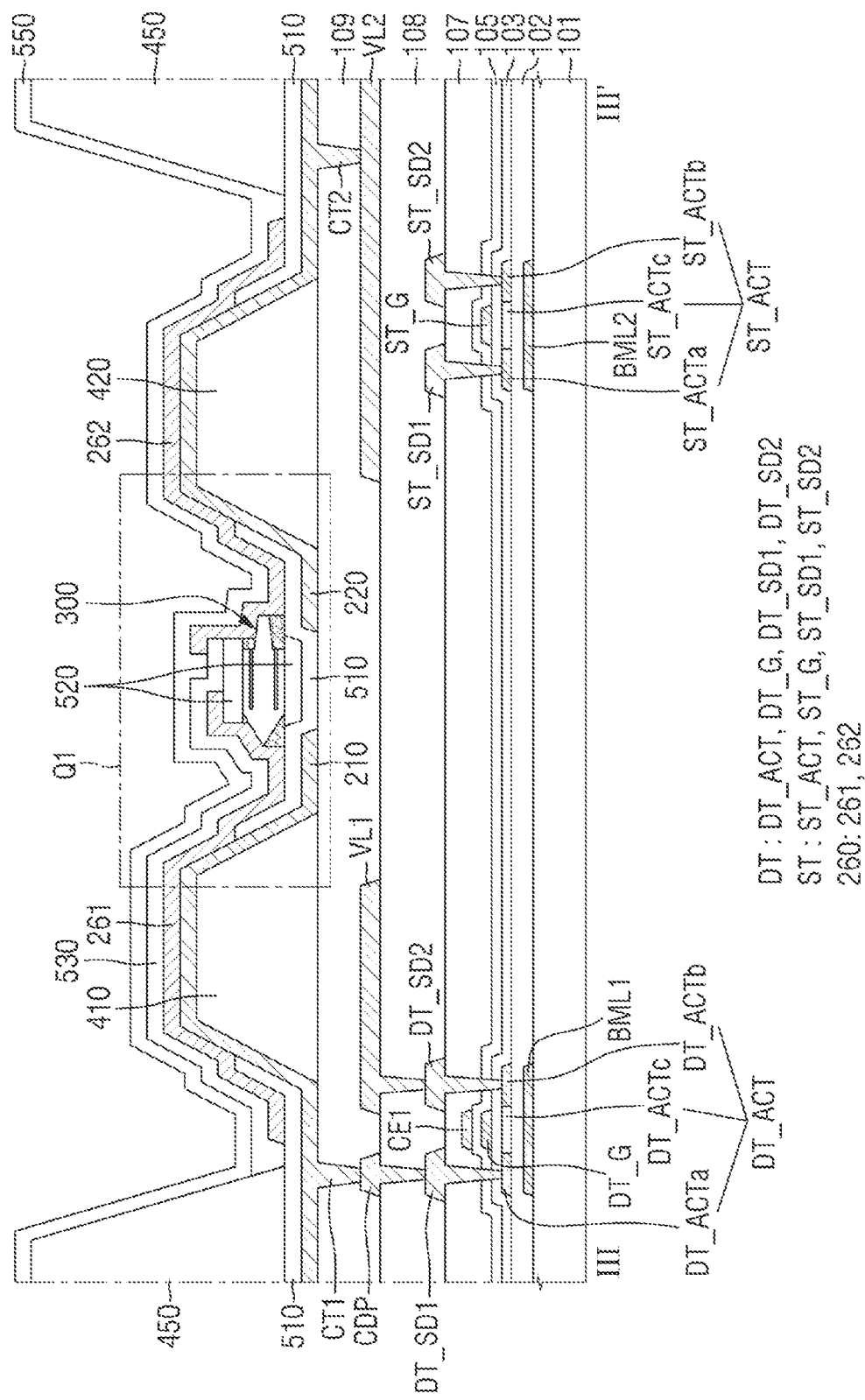
FIG. 3 is a cross-sectional view taken along the line of FIG. 2.

FIG. 2 is a plan view illustrating one pixel of the display device according to one or more embodiments. FIG. 3 is a cross-sectional view taken along the line of FIG. 2.

Referring to FIG. 2, each of the plurality of pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the present disclosure is not limited thereto, and the sub-pixels PXn may emit light having the same color. In addition, in FIG. 2, the pixel PX is illustrated as including three sub-pixels PXn, but is not limited thereto, and may include a larger number of sub-pixels PXn.

Each of the sub-pixels PXn of the display device 10 may include an area defined as a light-emitting area EMA. The first sub-pixel PX1 may include a first light-emitting area EMA1, the second sub-pixel PX2 may include a second light-emitting area EMA2, and the third sub-pixel PX3 may include a third light-emitting area EMA3. The light-emitting area EMA may be defined as an area in which the light-emitting element 300 included in the display device 10 is disposed to emit light in a specific wavelength range. The light-emitting element 300 includes an active layer 330 (see FIG. 4), and the active layer 330 may emit light in a specific wavelength range without directivity. The light emitted from the active layer 330 of the light-emitting element 300 may be emitted toward both side surfaces of the light-emitting element 300. The light-emitting area EMA may include an area in which the light-emitting element 300 is disposed, and may include an area which is adjacent to the light-emitting element 300 and through which the light emitted from the light-emitting element 300 is emitted.

However, the present disclosure is not limited thereto, and the light-emitting area EMA may also include an area in which the light emitted from the light-emitting element 300 is reflected or refracted due to another member to be emitted. A plurality of light-emitting elements 300 may be disposed in each sub-pixel PXn, and the area in which the light-emitting elements 300 are disposed and an area adjacent to the area form the light-emitting area EMA.

In one or more embodiments, each of the sub-pixels PXn of the display device 10 may include a non-light-emitting area which is defined as an area except for the light-emitting area EMA. The non-light-emitting area may be an area in which the light-emitting elements 300 are not disposed and the light emitted from the light-emitting elements 300 does not reach so that light is not emitted.

FIG. 3 illustrates only a cross section of the first sub-pixel PX1 of FIG. 2, but the cross section may be identically applied to other pixels PX or sub-pixels PXn. FIG. 3 illustrates a cross section crossing one end and the other end of the light-emitting element 300 disposed in the first sub-pixel PX1 of FIG. 2.

Referring to FIG. 3 in conjunction with FIG. 2, the display device 10 may include a circuit element layer and a display element layer disposed on a first substrate 101. A semiconductor layer, a plurality of conductive layers, and a plurality of insulation layers are disposed on the first substrate 101, each of which may constitute the circuit element layer and the display element layer. The plurality of conductive layers may include a first gate conductive layer, a second gate conductive layer, a first data conductive layer, and a second data conductive layer disposed below a first planarization layer 109 to form the circuit element layer, and electrodes 210 and 220 and contact electrodes 260 (e.g., 261, 262) disposed on the first planarization layer 109 to form the display element layer. The plurality of insulation layers may include a buffer layer 102, a first gate insulation layer 103, a first protective layer 105, a first interlayer insulation layer 107, a second interlayer insulation layer 108, the first planarization layer 109, a first insulation layer 510, a second insulation layer 520, a third insulation layer 530, a fourth insulation layer 550, and the like.

The circuit element layer may include circuit elements and a plurality of lines for driving the light-emitting element 300, such as, a driving transistor DT, a switching transistor ST, a first conductive pattern CDP, and a plurality of voltage lines VL1 and VL2, and the display element layer may include the light-emitting element 300 and include a first electrode 210, a second electrode 220, a first contact electrode 261, a second contact electrode 262, and the like.

The first substrate 101 may be an insulation substrate. The first substrate 101 may be made of an insulation material such as glass, quartz, a polymer resin, or the like. In addition, the first substrate 101 may be a rigid substrate but may also be a flexible substrate that is bendable, foldable, rollable, or the like.

Lower metal layers BML1 and BML2 may be disposed on the first substrate 101. The lower metal layers BML1 and BML2 may include a first lower metal layer BML1 and a second lower metal layer BML2. The first lower metal layer BML1 and the second lower metal layer BML2 are disposed to at least respectively overlap a first active material layer DT_ACT of the driving transistor DT and a second active material layer ST_ACT of the switching transistor ST in a thickness direction of the first substrate 101. The lower metal layers BML1 and BML2 may include light-blocking materials to prevent light from being incident on the first and second active material layers DT_ACT and ST_ACT. As an example, the first and second lower metal layers BML1 and BML2 may be formed of opaque metal materials that block light from being transmitted. However, the present disclosure is not limited thereto, and in some cases, the lower metal layers BML1 and BML2 may be omitted. In one or more embodiments, the first lower metal layer BML1 may be electrically connected to a first source/drain electrode DT_SD1 of the driving transistor DT, which will be described below, and the second lower metal layer BML2 may be electrically connected to a first source/drain electrode ST_SD1 of the switching transistor ST.

The buffer layer 102 may be entirely disposed on the lower metal layers BML1 and BML2 and the first substrate 101. The buffer layer 102 may be formed on the first substrate 101 to protect the transistors DT and ST of the pixel PX from moisture permeating through the first substrate 101 that is vulnerable to moisture permeation, and may perform a surface planarization function. The buffer layer 102 may be formed as a plurality of alternately stacked inorganic layers, or a single layer. For example, the buffer layer 102 may be formed in a structure in which inorganic layers including at least one of silicon oxide ($SiO_x$), silicon nitride ($SiN_x$), and silicon oxynitride ($SiO_xN_y$) are alternately stacked or a multi-layered structure, or as a single layer made of one inorganic layer.

The semiconductor layer is disposed on the buffer layer 102. The semiconductor layer may include the first active material layer DT_ACT of the driving transistor DT and the second active material layer ST_ACT of the switching transistor ST. The first active material layer DT_ACT and the second active material layer ST_ACT may be disposed to partially overlap gate electrodes DT_G and ST_G or the lke of the first gate conductive layer to be described below.

In one or more embodiments, the semiconductor layer may include polycrystalline silicon, single-crystalline silicon, an oxide semiconductor, and the like. The polycrystalline silicon may be formed by crystallizing amorphous silicon. Examples of the crystallization method may include a rapid thermal annealing (RTA) method, a solid phase crystallization (SPC) method, an excimer laser annealing (ELA) method, a metal induced lateral crystallization (MILL) method, and a sequential lateral solidification (SLS) method, and the like, but the present disclosure is not limited thereto. When the semiconductor layer includes polycrystalline silicon; the first active material layer DT_ACT may include a first doped area DT_ACTa, a second doped area DT_ACTb, and a first channel area DT_ACTc. The first channel area DT_ACTc may be disposed between the first doped area DT_ACTa and the second doped area DT_ACTb. The second active material layer ST_ACT may include a third doped area ST_ACTa, a fourth doped area ST_ACTb, and a second channel area ST_ACTc. The second channel area ST_ACTc may be disposed between the third doped area ST_ACTa and the fourth doped area ST_ACTb. The first doped area DT_ACTa, the second doped area DT_ACTb, the third doped area ST_ACTa; and the fourth doped area ST_ACTb may be areas in which partial areas of each of the first active material layer DT_ACT and the second active material layer ST_ACT are doped with impurities.

In one or more embodiments, the first active material layer DT_ACT and the second active material layer ST_ACT may include an oxide semiconductor. In this case, the doped area of each of the first active material layer DT_ACT and the second active material layer ST_ACT may be an area that has become conductive. The oxide semiconductor may be an oxide semiconductor including indium (In). In one or more embodiments, the oxide semiconductor may be indium-tin oxide (ITO), indium-zinc oxide (IZO); indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), or the like. However, the present disclosure is not limited thereto.

The first gate insulation layer 103 is disposed on the semiconductor layer and the buffer layer 102. The first gate insulation layer 103 may serve as gate insulation films of the driving transistor DT and the switching transistor ST. The first gate insulation layer 103 may be formed as a single inorganic layer including an inorganic material such as silicon oxide ($SiO_x$), silicon nitride ($SiN_x$), and silicon oxynitride ($SiO_xN_y$), or may be formed in a structure in which the inorganic layers are alternately stacked or are stacked in multiple layers.

The first gate conductive layer is disposed on the first gate insulation layer 103. The first gate conductive layer may include a first gate electrode DT_G of the driving transistor DT and a second gate electrode ST_G of the switching transistor ST. The first gate electrode DT_G may be disposed to overlap the first channel area DT_ACTc of the first active material layer DT_ACT in a thickness direction, and the second gate electrode ST_G may be disposed to overlap the second channel area ST_ACTc of the second active material layer ST_ACT in the thickness direction.

The first gate conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first protective layer 105 is disposed on the first gate conductive layer and the first gate insulation layer 103. The first protective layer 105 may be disposed to cover the first gate conductive layer and may perform a function of protecting the first gate conductive layer. The first protective layer 105 may be formed as a single inorganic layer including an inorganic material such as silicon oxide ($SiO_x$), silicon nitride ($SiN_x$), and silicon oxynitride ($SiO_xN_y$), or may be formed in a structure in which the inorganic layers are alternately stacked or are stacked in multiple layers.

The second gate conductive layer is disposed on the first protective layer 105. The second gate conductive layer may include a first capacitor electrode CE1 of a storage capacitor disposed so that at least a partial area thereof overlaps the first gate electrode DT_G in the thickness direction. The first capacitor electrode CE1 and the first gate electrode DT_G may overlap each other in the thickness direction with the first protective layer 105 interposed therebetween, and the storage capacitor may be formed therebetween. The second gate conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first interlayer insulation layer 107 is disposed on the second gate conductive layer. The first interlayer insulation layer 107 may serve as an insulation layer between the second gate conductive layer and other layers disposed thereon. The first interlayer insulation layer 107 may be formed as a single inorganic layer including an inorganic material such as silicon oxide ($SiO_x$), silicon nitride ($SiN_x$), and silicon oxynitride ($SiO_xN_y$), or may be formed in a structure in which the inorganic layers are alternately stacked or are stacked in multiple layers.

The first data conductive layer is disposed on the first interlayer insulation layer 107. The first data conductive layer may include the first source/drain electrode DT_SD1 and a second source/drain electrode DT_SD2 of the driving transistor DT, and the first source/drain electrode ST_SD1 and a second source/drain electrode ST_SD2 of the switching transistor ST.

The first source/drain electrode DT_SD1 and the second source/drain electrode DT_SD2 of the driving transistor DT may be respectively in contact with the first doped area DT_ACTa and the second doped area DT_ACTb of the first active material layer DT_ACT through contact holes passing through the first interlayer insulation layer 107, the first protective layer 105, and the first gate insulation layer 103. The first source/drain electrode ST_SD1 and the second source/drain electrode ST_SD2 of the switching transistor ST may be respectively in contact with the third doped area ST_ACTa and the fourth doped area ST_ACTb of the second active material layer ST_ACT through contact holes passing through the first interlayer insulation layer 107, the first protective layer 105, and the first gate insulation layer 103. In addition, in one or more embodiments, the first source/drain electrode DT_SD1 of the driving transistor DT and the first source/drain electrode ST_SD1 of the switching transistor ST may be electrically connected to the first lower metal layer BIWA and the second lower metal layer BML2, respectively, through other contact holes passing through the first interlayer insulation layer 107, the first protective layer 105, the first gate insulation layer 103 and the buffer layer 102. In one or more embodiments, in the first source/drain electrodes DT_SD1 and ST_SD1 and the second source/drain electrodes DT_SD2 and ST_SD2 of the driving transistor DT and the switching transistor ST, when one electrode is a source electrode, the other electrode may be a drain electrode. However, the present disclosure is not limited thereto, and in the first source/drain electrodes DT_SD1 and ST_SD1 and the second source/drain electrodes DT_SD2 and ST_SD2, when one electrode is a drain electrode, the other electrode may be a source electrode.

The first data conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The second interlayer insulation layer 108 may be disposed on the first data conductive layer and the first interlayer insulation layer 107. The second interlayer insulation layer 108 may be entirely disposed on the first interlayer insulation layer 107 while covering the first data conductive layer and may sever to protect the first data conductive layer. The second interlayer insulation layer 108 may be formed as a single inorganic layer including an inorganic material such as silicon oxide ($SiO_x$), silicon nitride ($SiN_x$), and silicon oxynitride ($SiO_xN_y$), or may be formed in a structure in which the inorganic layers are alternately stacked or are stacked in multiple layers.

The second data conductive layer is disposed on the second interlayer insulation layer 108. The second data conductive layer may include a second voltage line VL2, a first voltage line VIA and the first conductive pattern CDP. A high potential voltage (a first power voltage VDD) to be supplied to the driving transistor DT may be applied to the first voltage line VL1, and a low potential voltage (a second power voltage VSS) to be supplied to the second electrode 220 may be applied to the second voltage line VL2. During a manufacturing process of the display device 10, an alignment signal necessary to align the light-emitting element 300 may be applied to the second voltage line VL2.

The first conductive pattern CDP may be electrically connected to the first source/drain electrode DT_SD1 of the driving transistor DT through a contact hole formed in the second interlayer insulation layer 108. The first conductive pattern CDP may also be in contact with the first electrode 210, which will be described below, and the driving transistor DT may transmit the first power voltage VDD applied from the first voltage line VL1 to the first electrode 210 through the first conductive pattern CDP. In the drawing, the second data conductive layer is illustrated as including one first voltage line VL1 and one second voltage line VL2, but the present disclosure is not limited thereto. The second data conductive layer may include a larger number of first voltage lines VL1 and a larger number of second voltage lines VL2.

The second data conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first planarization layer 109 is disposed on the second data conductive layer. The first planarization layer 109 may include an organic insulation material, for example, an organic material such as polyimide (PI), and may perform a surface planarization function.

Inner banks 410 and 420, a plurality of electrodes 210 and 220, an outer bank 450, a plurality of contact electrodes 260 (e.g., 261, 262), and the light-emitting element 300 are disposed on the first planarization layer 109. Further, a plurality of insulation layers 510, 520, 530, and 550 may be further disposed on the first planarization layer 109.

The inner banks 410 and 420 are disposed directly on the first planarization layer 109. The inner banks 410 and 420 may include a first inner bank 410 and a second inner bank 420 disposed adjacent to a center portion of each pixel PX or sub-pixel PXn.

As shown in FIG. 2, the first inner bank 410 and the second inner bank 420 may be disposed to be spaced from each other and face (e.g., oppose) each other in a first direction DR1. In addition, the first inner bank 410 and the second inner bank 420 may extend in a second direction DR2, and may be separated and terminated at a boundary between the sub-pixels PXn so as not to extend to another sub-pixel PXn adjacent in the second direction DR2. Accordingly, the first inner bank 410 and the second inner bank 420 may be disposed in each sub-pixel PXn to form a pattern on the entire surface of the display device 10. By disposing the inner banks 410 and 420 to be spaced from each other and face (e.g., oppose) each other, an area in which the light-emitting element 300 is disposed may be formed therebetween. In the drawing, it is illustrated that one first inner bank 410 and one second inner bank 420 are disposed, but the present disclosure is not limited thereto. In some cases, a larger number of inner banks 410 and 420 may be further disposed according to the number of electrodes 210 and 220, which will be described below.

Further, as shown in FIG. 3, each of the first inner bank 410 and the second inner bank 420 may have a structure in which at least a portion thereof protrudes with respect to an upper surface of the first planarization layer 109. The protruding portion of each of the first inner bank 410 and the second inner bank 420 may have inclined side surfaces, and light emitted from the light-emitting element 300 disposed between the first inner bank 410 and the second inner bank 420 may travel toward the inclined side surfaces of the inner banks 410 and 420. As will be described below, when the electrodes 210 and 220 respectively disposed on the inner banks 410 and 420 include a material having a high reflectance, the light emitted from the light-emitting element 300 may be reflected from the electrodes 210 and 220 disposed on the side surfaces of the inner banks 410 and 420 to be emitted in an upward direction with respect to the first substrate 101. That is, the inner banks 410 and 420 may provide an area in which the light-emitting element 300 is disposed and may concurrently (e.g., simultaneously) serve as a reflective partition wall that reflects the light emitted from the light-emitting element 300 upward. In one or more embodiments, the inner banks 410 and 420 may include an organic insulation material such as polyimide (PI), but the present disclosure is not limited thereto.

The plurality of electrodes 210 and 220 are disposed on the inner banks 410 and 420 and the first planarization layer 109. The plurality of electrodes 210 and 220 may include the first electrode 210 disposed on the first inner bank 410 and the second electrode 220 disposed on the second inner bank 420.

For example, the first electrode 210 may be disposed in each sub-pixel PXn in a form extending in the second direction DR2. However, the first electrode 210 may not extend to another sub-pixel PXn adjacent in the second direction DR2, and may be disposed to be partially spaced from the outer bank 450 surrounding each sub-pixel PXn. The first electrode 210 may further include a portion disposed to overlap the outer bank 450, and the first electrode 210 may be electrically connected to the driving transistor DT at a portion overlapping the outer bank 450. For example, the first electrode 210 may be in contact with the first conductive pattern CDP through a first contact hole CT1 formed in an area overlapping the outer bank 450 and passing through the first planarization layer 109, and through this, the first electrode 210 may be electrically connected to the first source/drain electrode DT_SD1 of the driving transistor DT.

The second electrode 220 may be disposed to extend in the second direction DR2 in each sub-pixel PXn. Unlike the first electrode 210, the second electrode 220 may be disposed to extend to another sub-pixel PXn adjacent in the second direction DR2. That is, one connected second electrode 220 may be disposed in the plurality of sub-pixels PXn adjacent in the second direction DR2. The second electrode 220 may partially overlap the outer bank 450 at a boundary of the sub-pixels PXn adjacent in the second direction DR2, and the second electrode 220 may be electrically connected to the second voltage line VL2 in an area overlapping the outer bank 450. For example, the second electrode 220 may be in contact with the second voltage line VL2 through a second contact hole CT2 formed in an area overlapping the outer bank 450 and passing through the first planarization layer 109. As shown in the drawing, the second electrodes 220 of the sub-pixels PXn adjacent in the first direction DR1 are electrically connected to the second voltage lines VL2 through the second contact holes CT2, respectively.

However, the present disclosure is not limited thereto. In some cases, each of the first electrode 210 and the second electrode 220 may further include a stem portion extending in the first direction DR1. In the first electrode 210, different stem portions may be disposed for each sub-pixel PXn, and in the second electrode 220, one stem portion extends to the sub-pixels PXn adjacent in the second direction DR2 so that the second electrodes 220 of the sub-pixels PXn may be electrically connected to each other through the stem portion. In this case, the second electrode 220 may be electrically connected to the second voltage line VL2 in the non-display area NDA located at a peripheral portion of the display area DPA in which the plurality of pixels PX or sub-pixels PXn are disposed.

Although in the drawing, it is illustrated that one first electrode 210 and one second electrode 220 are disposed in each sub-pixel PXn, the present disclosure is not limited thereto. In one or more embodiments, a larger number of first electrodes 210 and second electrodes 220 may be disposed in each sub-pixel PXn. In addition, the first electrode 210 and the second electrode 220 disposed in each sub-pixel PXn may not necessarily have a shape extending in one direction, and the first electrode 210 and the second electrode 220 may be disposed in various structures. For example, the first electrode 210 and the second electrode 220 may each have a partially curved or bent shape, and one electrode of the first electrode 210 and the second electrode 220 may be disposed to be around (or to surround) the other electrode thereof. As long as at least a partial area of the first electrode 210 and at least a partial area of the second electrode 220 are spaced from each other and face (e.g., oppose) each other to form an area in which the light-emitting element 300 is to be disposed therebetween, the arrangement structures and shapes of the first electrode 210 and the second electrode 220 are not particularly limited.

The plurality of electrodes 210 and 220 may be electrically connected to the light-emitting elements 300 and may receive a suitable voltage (e.g. a set or predetermined voltage) to allow the light-emitting element 300 to emit light. For example; the plurality of electrodes 210 and 220 may be electrically connected to the light-emitting element 300 through the contact electrodes 260 (e.g., 261, 261), which will be described below, and may transmit an electrical signal applied to the electrodes 210 and 220 to the light-emitting element 300 through the contact electrodes 260 (e.g., 261, 262).

In one or more embodiments, the first electrode 210 may be a pixel electrode separated for each sub-pixel PXn, and the second electrode 220 may be a common electrode connected in common along each sub-pixel PXn. One of the first electrode 210 and the second electrode 220 may be an anode of the light-emitting element 300, and the other one thereof may be a cathode of the light-emitting element 300. However; the present disclosure is not limited thereto, and the reverse of the above description may be possible.

Further, each of the electrodes 210 and 220 may be utilized to form an electric field in the sub-pixel PXn, thereby aligning the light-emitting element 300. The light-emitting element 300 may be disposed between the first electrode 210 and the second electrode 220 through a process of forming an electric field between the first electrode 210 and the second electrode 220 by applying an alignment signal to the first electrode 210 and the second electrode 220. As will be described below, the light-emitting elements 300 may be sprayed onto the first electrode 210 and the second electrode 220 in a state of being dispersed in ink through an inkjet printing process, and may be aligned between the first electrode 210 and the second electrode 220 through a method of applying a dielectrophoretic force to the light-emitting elements 300 by applying the alignment signal between the first electrode 210 and the second electrode 220.

As shown in FIG. 3, the first electrode 210 and the second electrode 220 may be disposed on the first inner bank 410 and the second inner bank 420, respectively, and may be spaced from each other and may face (e.g., oppose) each other. In each of the plurality of light-emitting elements 300 disposed between the first inner bank 410 and the second inner bank 420, at least one end may be electrically connected to the first electrode 210 and the second electrode 220.

In some embodiments; the first electrode 210 and the second electrode 220 may be formed to have greater widths in the first direction DR1 than the first inner bank 410 and the second inner bank 420, respectively. For example, the first electrode 210 and the second electrode 220 may be disposed to cover outer surfaces of the first inner bank 410 and the second inner bank 420, respectively. The first electrode 210 and the second electrode 220 may be disposed on side surfaces of the first inner bank 410 and the second inner bank 420, respectively, and a separation distance between the first electrode 210 and the second electrode 220 may be less than a separation distance between the first inner bank 410 and the second inner bank 420. In addition, at least a partial area of each of the first electrode 210 and the second electrode 220 may be disposed directly on the first planarization layer 109.

Each of the electrodes 210 and 220 may include a transparent conductive material. As an example, each of the electrodes 210 and 220 may include materials such as indium tin oxide (ITO), indium zinc oxide (IZO), indium tin-zinc oxide (ITZO); and the like, but the present disclosure is not limited thereto. In one or more embodiments, each of the electrodes 210 and 220 may include a conductive material having a high reflectance. For example, each of the electrodes 210 and 220 may include a metal such as silver (Ag), copper (Cu), aluminum (Al), or the like as the material having a high reflectance. In this case, each of the electrodes 210 and 220 may reflect light, which is emitted from the light-emitting element 300 and travels to the side surfaces of the first inner bank 410 and the second inner bank 420, in an upward direction with respect to each sub-pixel PXn.

However, the present disclosure is not limited thereto, and each of the electrodes 210 and 220 may be formed in a structure, in which one or more layers of a transparent conductive material and a metal layer having a high reflectance are stacked, or formed as a single layer including the transparent conductive material and the metal layer. In one or more embodiments, each of the electrodes 210 and 220 may have a stacked structure of ITO/Ag/ITO/IZO or may be an alloy including Al, Ni, lanthanum (La), and the like.

The first insulation layer 510 is disposed on the first planarization layer 109, the first electrode 210, and the second electrode 220. The first insulation layer 510 may be disposed on a side opposite to the area between the inner banks 410 and 420 with respect to the inner banks 410 and 420 in addition to the area between the electrodes 210 and 220 or between the inner banks 410 and 420 that are spaced from each other. In addition, the first insulation layer 510 is disposed to partially cover the first electrode 210 and the second electrode 220. For example, the first insulation layer 510 may be entirely disposed on the first planarization layer 109, including the first electrode 210 and the second electrode 220, and may be disposed to expose a portion of an upper surface of each of the first electrode 210 and the second electrode 220. An opening partially exposing the first electrode 210 and the second electrode 220 may be formed in the first insulation layer 510, and the first insulation layer 510 may be disposed to cover only one side and the other side of each of the first electrode 210 and the second electrode 220. Some of portions of the first electrode 210 and the second electrode 220, which are disposed on the inner banks 410 and 420, may be partially exposed due to the opening.

The first insulation layer 510 may protect the first electrode 210 and the second electrode 220 and, concurrently (e.g., simultaneously), insulate the first electrode 210 from the second electrode 220. In addition, the light-emitting element 300 disposed on the first insulation layer 510 may be prevented from being damaged by being in direct contact with other members. However, the shape and structure of the first insulation layer 510 are not limited thereto.

In one or more embodiments, a step difference may be formed on a portion of an upper surface of the first insulation layer 510 between the first electrode 210 and the second electrode 220. In one or more embodiments, the first insulation layer 510 may include an inorganic insulation material, and a portion of the upper surface of the first insulation layer 510 disposed to partially cover the first electrode 210 and the second electrode 220 may be stepped due to the step difference that is formed by the electrodes 210 and 220 disposed below the first insulation layer 510. Accordingly, an empty space may be formed between the light-emitting element 300, which is disposed on the first insulation layer 510 between the first electrode 210 and the second electrode 220, and the upper surface of the first insulation layer 510. The empty space may be filled with a material forming the second insulation layer 520, which will be described below.

However, the present disclosure is not limited thereto. The first insulation layer 510 may be formed such that a portion thereof disposed between the first electrode 210 and the second electrode 220 has a flat upper surface. The upper surface extends in one direction toward the first electrode 210 and the second electrode 220, and the first insulation layer 510 may also be disposed in areas in which the electrodes 210 and 220 overlap the inclined side surfaces of the first inner bank 410 and the second inner bank 420, respectively. The contact electrodes 260 (e.g., 261, 262), which will be described below, may be in contact with the exposed areas of the first electrode 210 and the second electrode 220 and may be smoothly in contact with ends of the light-emitting element 300 on the flat upper surface of the first insulation layer 510.

The outer bank 450 may be disposed on the first insulation layer 510. As shown in FIGS. 2 and 3, the outer bank 450 may be disposed at a boundary between the sub-pixels PXn. The outer bank 450 may be disposed to extend at least in the second direction DR2 and may be around (or may surround)

some of the inner banks 410 and 420 and the electrodes 210 and 220, including the area in which the light-emitting element 300 is disposed between the inner banks 410 and 420 and between the electrodes 210 and 220. In addition, the outer bank 450 may further include a portion extending in the first direction DR1, and may form a grid pattern on the entire surface of the display area DPA.

According to one or more embodiments, a height in the thickness direction of the outer bank 450 may be greater than a height of each of the inner banks 410 and 420. Unlike the inner banks 410 and 420, the outer bank 450 may divide adjacent sub-pixels PXn, and concurrently (e.g. simultaneously), as will be described below, prevent the ink from overflowing to the adjacent sub-pixel PXn in the inkjet printing process for disposing the light-emitting element 300 during the manufacturing process of the display device 10. That is, the outer bank 450 may separate inks in which different light-emitting elements 300 are dispersed in different sub-pixels PXn from each other so as to prevent the inks from being mixed with each other. Like the inner banks 410 and 420 the outer bank 450 may include polyimide (PI), but the present disclosure is not limited thereto.

The light-emitting element 300 may be disposed in an area formed between the first electrode 210 and the second electrode 220, or between the first inner bank 410 and the second inner bank 420. One end of the light-emitting element 300 may be electrically connected to the first electrode 210, and the other end thereof may be electrically connected to the second electrode 220. The light-emitting element 300 may be electrically connected to the first electrode 210 and the second electrode 220, respectively, through the contact electrodes 260 (e.g., 261, 262).

The plurality of light-emitting elements 300 may be disposed to be spaced from each other and aligned to be substantially parallel to each other. A separation distance between the light-emitting elements 300 is not particularly limited. In some cases, the plurality of light-emitting elements 300 may be disposed adjacent to each other to form a group and a plurality of other light-emitting elements 300 may be grouped in a state of being spaced at a suitable interval (e.g.; a set or predetermined interval), and may be oriented and aligned in one direction with a nonuniform density. In addition, in one or more embodiments, the light-emitting element 300 may have a shape extending in one direction, and a direction in which each of the electrodes 210 and 220 extends may be substantially perpendicular to a direction in which the light-emitting element 300 extends. However, the present disclosure is not limited thereto, and the light-emitting element 300 may be obliquely disposed without being perpendicular to the direction in which each of the electrodes 210 and 220 extends.

The light-emitting elements 300 according to one or more embodiments may include active layers 330 having different materials to emit light in different wavelength ranges to the outside. The display device 10 according to one or more embodiments may include the light-emitting elements 300 emitting light in different wavelength ranges. The light-emitting element 300 of the first sub-pixel PX1 may include an active layer 330 that emits light of a first color having a first wavelength at a central wavelength range, the light-emitting element 300 of the second sub-pixel PX2 may include an active layer 330 that emits light of a second color having a second wavelength at a central wavelength range, and the light-emitting element 300 of the third sub-pixel PX3 may include an active layer 330 that emits light of a third color having a third wavelength at a central wavelength range.

Thus, the light of the first color may be emitted from the first sub-pixel PX1, the light of the second color may be emitted from the second sub-pixel PX2, and the light of the third color may be emitted from the third sub-pixel PX3. In one or more embodiments, the light of the first color may be blue light having a central wavelength range ranging from 450 nm to 495 nm, the light of the second color may be green light having a central wavelength range ranging from 495 nm to 570 nm, and the light of the third color may be red light having a central wavelength range ranging from 620 nm to 752 nm. However, the present disclosure is not limited thereto. In some cases, the first sub-pixel PX1, the second sub-pixel PX2, and the third sub-pixel PX3 may include the same type of light-emitting elements 300 to emit light of the substantially same color.

The light-emitting element 300 may be disposed on the first insulation layer 510 between the inner banks 410 and 420 or between the electrodes 210 and 220. For example, the light-emitting element 300 may be disposed on the first insulation layer 510 disposed between the inner banks 410 and 420. At the same time, the light-emitting element 300 may be disposed such that a partial area thereof overlaps each of the electrodes 210 and 220 in the thickness direction. One end of the light-emitting element 300 may overlap the first electrode 210 in the thickness direction and may be placed on the first electrode 210, and the other end thereof may overlap the second electrode 220 in the thickness direction and may be placed on the second electrode 220. However, the present disclosure is not limited thereto, and in one or more embodiments, at least some of the light-emitting elements 300 disposed in each sub-pixel PXn may be disposed in areas other than an area formed between the inner banks 410 and 420, for example, areas between the inner banks 410 and 420 and the outer bank 450.

The light-emitting element 300 may include a plurality of layers disposed therein in a direction perpendicular to an upper surface of the first substrate 101 or the first planarization layer 109. The light-emitting element 300 of the display device 10 according to one or more embodiments may have a shape extending in one direction and have a structure in which a plurality of semiconductor layers are sequentially disposed in the one direction. The light-emitting element 300 may be disposed such that the one direction, in which the light-emitting element 300 extends, is parallel to the first planarization layer 109, and a plurality of semiconductor layers included in the light-emitting element 300 may be sequentially disposed in the direction parallel to the upper surface of the first planarization layer 109. However, the present disclosure is not limited thereto. In some cases, when the light-emitting element 300 has a different structure, the plurality of layers may be disposed in a direction perpendicular to the first planarization layer 109.

In one or more embodiments, the light-emitting element 300 may include a semiconductor core SC (see FIG. 5) including a plurality of semiconductor layers and an insulation film 380 (see FIG. 4) that partially surrounds the semiconductor core. The semiconductor core SC may include a portion having partially different diameters, and the insulation film 380 may be disposed to compensate for a slope or step difference of an outer surface (e.g., the outer peripheral or circumferential surface) of the semiconductor core SC so that the light-emitting element 300 has a constant diameter. As shown in the drawing, the light-emitting element 300 disposed on the first insulation layer 510 may have a flat surface on at least a surface thereof in contact with the first insulation layer 510. A detailed description for the structure of the light-emitting element 300 will be provided below with reference to other drawings.

The second insulation layer 520 may be partially disposed on the light-emitting element 300 disposed between the first electrode 210 and the second electrode 220. That is, the second insulation layer 520 may be disposed on the first insulation layer 510 between the first electrode 210 and the second electrode 220, and the light-emitting element 300 may be disposed between the first insulation layer 510 and the second insulation layer 520. In one or more embodiments, in the light-emitting element 300, the insulation film 380 (see FIG. 4) formed on the outer surface of the light-emitting element 300 may be in direct contact with the first insulation layer 510 and the second insulation layer 520. For example, the second insulation layer 520 may be disposed to partially surround the outer surface (e.g., the outer peripheral or circumferential surface) of the light-emitting element 300 and thus may protect the light-emitting element 300, and may concurrently (e.g., simultaneously) fix the light-emitting element 300 during the manufacturing process of the display device 10.

A portion of the second insulation layer 520 disposed on the light-emitting element 300 may have a shape extending in the second direction DR2 between the first electrode 210 and the second electrode 220 in a plan view. As an example, the second insulation layer 520 may form a stripe or island type pattern in each sub-pixel PXn.

The second insulation layer 520 may be disposed on the light-emitting element 300 and may expose one end and the other end of the light-emitting element 300. The exposed ends of the light-emitting element 300 may be in contact with the contact electrodes 260, which will be described below. Such a shape of the second insulation layer 520 may be formed by a patterning process using a material forming the second insulation layer 520 by using a typical mask process. A mask for forming the second insulation layer 520 has a width less than a length of the light-emitting element 300, and the material forming the second insulation layer 520 may be patterned to expose both ends of the light-emitting element 300. However, the present disclosure is not limited thereto.

Further, in one or more embodiments, a portion of the material of the second insulation layer 520 may be disposed between the first insulation layer 510 and a lower surface of the light-emitting element 300. The second insulation layer 520 may be formed to fill a space between the first insulation layer 510 and the light-emitting element 300, which is formed during the manufacturing process of the display device 10. Accordingly, the second insulation layer 520 may be formed to surround the outer surface (e.g., the outer peripheral or circumferential surface) of the light-emitting element 300. However, the present disclosure is not limited thereto.

The plurality of contact electrodes 260 (e.g., 261, 262) and the third insulation layer 530 may be disposed on the second insulation layer 520.

The plurality of contact electrodes 260 (e.g., 261, 262) may have a shape extending in one direction. The plurality of contact electrodes 260 may be in contact with the respective electrodes 210 and 220 and the light-emitting elements 300, and the light-emitting elements 300 may receive electrical signals from the first electrode 210 and the second electrode 220 through the contact electrodes 260 (e.g., 261, 262).

The contact electrodes 260 (e.g., 261, 262) may include the first contact electrode 261 and the second contact electrode 262. The first contact electrode 261 and the second contact electrode 262 may be disposed on the first electrode 210 and the second electrode 220, respectively. The first contact electrode 261 may be disposed on the first electrode 210, the second contact electrode 262 may be disposed on the second electrode 220, and the first contact electrode 261 and the second contact electrode 262 may each have a shape extending in the second direction DR2. The first contact electrode 261 and the second contact electrode 262 may be spaced from each other and face (e.g., oppose) each other in the first direction DR1 and may form a stripe pattern in the light-emitting area EMA of each sub-pixel PXn.

In one or more embodiments, a width of each of the first contact electrode 261 and the second contact electrode 262, which is measured in one direction, may be greater than or equal to a width of each of the first electrode 210 and the second electrode 220, which is measured in the one direction. The first contact electrode 261 and the second contact electrode 262 may be disposed to be in contact with one end and the other end of the light-emitting element 300, respectively, and may concurrently (e.g., simultaneously) cover both side surfaces of the first electrode 210 and the second electrode 220, respectively. As described above, the upper surface of each of the first electrode 210 and the second electrode 220 may be partially exposed, and the first contact electrode 261 and the second contact electrode 262 may be in contact with the exposed upper surfaces of the first electrode 210 and the second electrode 220, respectively. For example, the first contact electrode 261 may be in contact with a portion of the first electrode 210, which is located on the first inner bank 410, and the second contact electrode 262 may be in contact with a portion of the second electrode 220, which is located on the second inner bank 420. However, the present disclosure is not limited thereto, and in some cases, the widths of the first contact electrode 261 and the second contact electrode 262 may be formed to be less than those of the first electrode 210 and the second electrode 220, respectively, and the first contact electrode 261 and the second contact electrode 262 may be disposed to cover only the exposed portions of the upper surfaces of the first electrode 210 and the second electrode 220, respectively. In addition, at least a partial area of each of the first contact electrode 261 and the second contact electrode 262 is disposed on the first insulation layer 510.

According to one or more embodiments, the light-emitting element 300 has the semiconductor layer exposed on both end surfaces thereof in an extending direction, and the first contact electrode 261 and the second contact electrode 262 may be in contact with the light-emitting element 300 on the end surfaces where the semiconductor layer is exposed. However, the present disclosure is not limited thereto. In some cases, both end side surfaces of the light-emitting element 300 may be partially exposed. During the manufacturing process of the display device 10, the insulation film 380 (see FIG. 4) surrounding an outer surface (e.g., an outer peripheral or circumferential surface) of the semiconductor layer of the light-emitting element 300 may be partially removed in a process of forming the second insulation layer 520 covering the outer surface of the light-emitting element 300, and the exposed side surface of the light-emitting element 300 may be in contact with the first contact electrode 261 and the second contact electrode 262. One end of the light-emitting element 300 may be electrically connected to the first electrode 210 through the first contact electrode 261, and the other end thereof may be electrically connected to the second electrode 220 through the second contact electrode 262.

In the drawing, it is illustrated that one first contact electrode 261 and one second contact electrode 262 are disposed in one sub-pixel PXn, but the present disclosure is not limited thereto. The number of the first contact electrodes 261 and second contact electrodes 262 may vary depending on the number of the first electrodes 210 and second electrodes 220 disposed in each sub-pixel PXn.

Further, as shown in FIG. 3, the first contact electrode 261 is disposed on the first electrode 210 and the second insulation layer 520. The first contact electrode 261 may be in contact with one end of the light-emitting element 300 and the exposed upper surface of the first electrode 210. The one end of the light-emitting element 300 may be electrically connected to the first electrode 210 through the first contact electrode 261.

The third insulation layer 530 is disposed on the first contact electrode 261. The third insulation layer 530 may electrically insulate the first contact electrode 261 and the second contact electrode 262 from each other. The third insulation layer 530 may be disposed to cover the first contact electrode 261 and may not be disposed on the other end of the light-emitting element 300 so that the light-emitting element 300 may be in contact with the second contact electrode 262. The third insulation layer 530 may be partially in contact with the first contact electrode 261 and the second insulation layer 520 at an upper surface of the second insulation layer 520. A side surface of the third insulation layer 530 in a direction in which the second electrode 220 is disposed may be aligned with one side surface of the second insulation layer 520. In addition, the third insulation layer 530 may also be disposed in a non-light-emitting area, for example, on the first insulation layer 510 disposed on the first planarization layer 109. However, the present disclosure is not limited thereto.

The second contact electrode 262 is disposed on the second electrode 220, the second insulation layer 520, and the third insulation layer 530. The second contact electrode 262 may be in contact with the other end of the light-emitting element 300 and the exposed upper surface of the second electrode 220. The other end of the light-emitting element 300 may be electrically connected to the second electrode 220 through the second contact electrode 262.

That is, the first contact electrode 261 may be disposed between the first electrode 210 and the third insulation layer 530, and the second contact electrode 262 may be disposed on the third insulation layer 530. The second contact electrode 262 may be partially in contact with the second insulation layer 520, the third insulation layer 530, the second electrode 220, and the light-emitting element 300. One end of the second contact electrode 262 in a direction in which the first electrode 210 is disposed may be disposed on the third insulation layer 530. The first contact electrode 261 and the second contact electrode 262 may not be in contact with each other due to the second insulation layer 520 and the third insulation layer 530. However, the present disclosure is not limited thereto, and in some cases, the third insulation layer 530 may be omitted.

The contact electrode 260 may include a conductive material. For example, the contact electrodes 261 and 262 may include ITO, IZO, ITZO, aluminum (Al), or the Ike. As an example, the contact electrode 260 may include a transparent conductive material, and light emitted from the light-emitting element 300 may pass through the contact electrode 260 and travel toward the electrodes 210 and 220. Each of the electrodes 210 and 220 may include a material having a high reflectance, and the electrodes 210 and 220 disposed on the inclined side surfaces of the inner banks 410 and 420 may reflect incident light in an upward direction with respect to the first substrate 101. However, the present disclosure is not limited thereto.

The fourth insulation layer 550 may be entirely disposed on the first substrate 101. The fourth insulation layer 550 may serve to protect members disposed on the first substrate 101 from an external environment.

Each of the first insulation layer 510, the second insulation layer 520, the third insulation layer 530, and the fourth insulation layer 550, which are described above, may include an inorganic insulation material or an organic insulation material. In one or more embodiments, the first insulation layer 510, the second insulation layer 520, the third insulation layer 530, and the fourth insulation layer 550 may each include an inorganic insulation material such as silicon oxide ($SiO_x$), silicon nitride ($SiN_x$), silicon oxynitride ($SiON_y$), aluminum oxide ($Aix O_y$), aluminum nitride ($Al_x N_y$), or the like. Alternatively, the first insulation layer 510, the second insulation layer 520, the third insulation layer 530, and the fourth insulation layer 550 may each include an organic insulation material such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited thereto.

In one or more embodiments, the light-emitting element 300 may be a light-emitting diode, and specifically, may be an inorganic light-emitting diode having a size of a micrometer unit or a nanometer unit and made of an inorganic material. The inorganic light-emitting diode may be aligned between two electrodes in which polarity is formed by forming an electric field in a specific direction between the two electrodes facing (e.g., opposing) each other. The light-emitting element 300 may be aligned between the two electrodes due to the electric field formed between the two electrodes.

The light-emitting element 300 according to one or more embodiments may have a shape extending in one direction. The light-emitting element 300 may have a shape of a rod, a wire, a tube, or the like. In one or more embodiments, the light-emitting element 300 may have a cylindrical shape or a rod shape. However, the shape of the light-emitting element 300 is not limited thereto, and the light-emitting element 300 may have a shape of a cube, a rectangular parallelepiped, a polygonal pillar such as a hexagonal pillar or the like or have a shape that extends in one direction and has a partially inclined outer surface. Thus, the light-emitting element 300 may have various shapes.

The light-emitting element 300 may include the semiconductor core SC (see FIG. 5) and the insulation film 380 (see FIG. 4) that is around (e.g., surrounds) the semiconductor core. The semiconductor core of the light-emitting element 300 may include a semiconductor layer doped with an arbitrary conductive-type (for example, p-type or n-type) impurity. The semiconductor layer may receive an electrical signal applied from an external power source and emit light in a specific wavelength range.

Figure 4:
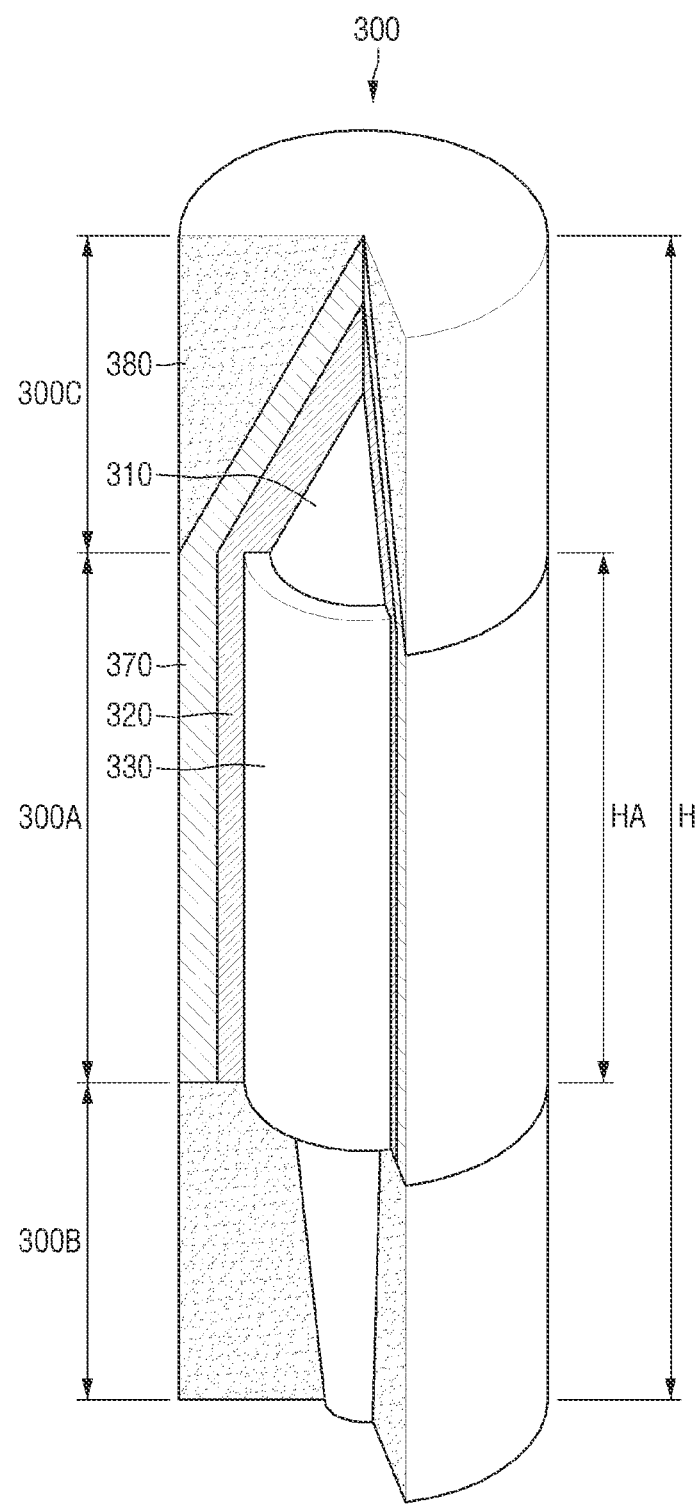
FIG. 4 is a schematic cutaway view of a light-emitting element according to one or more embodiments.
Figure 5:
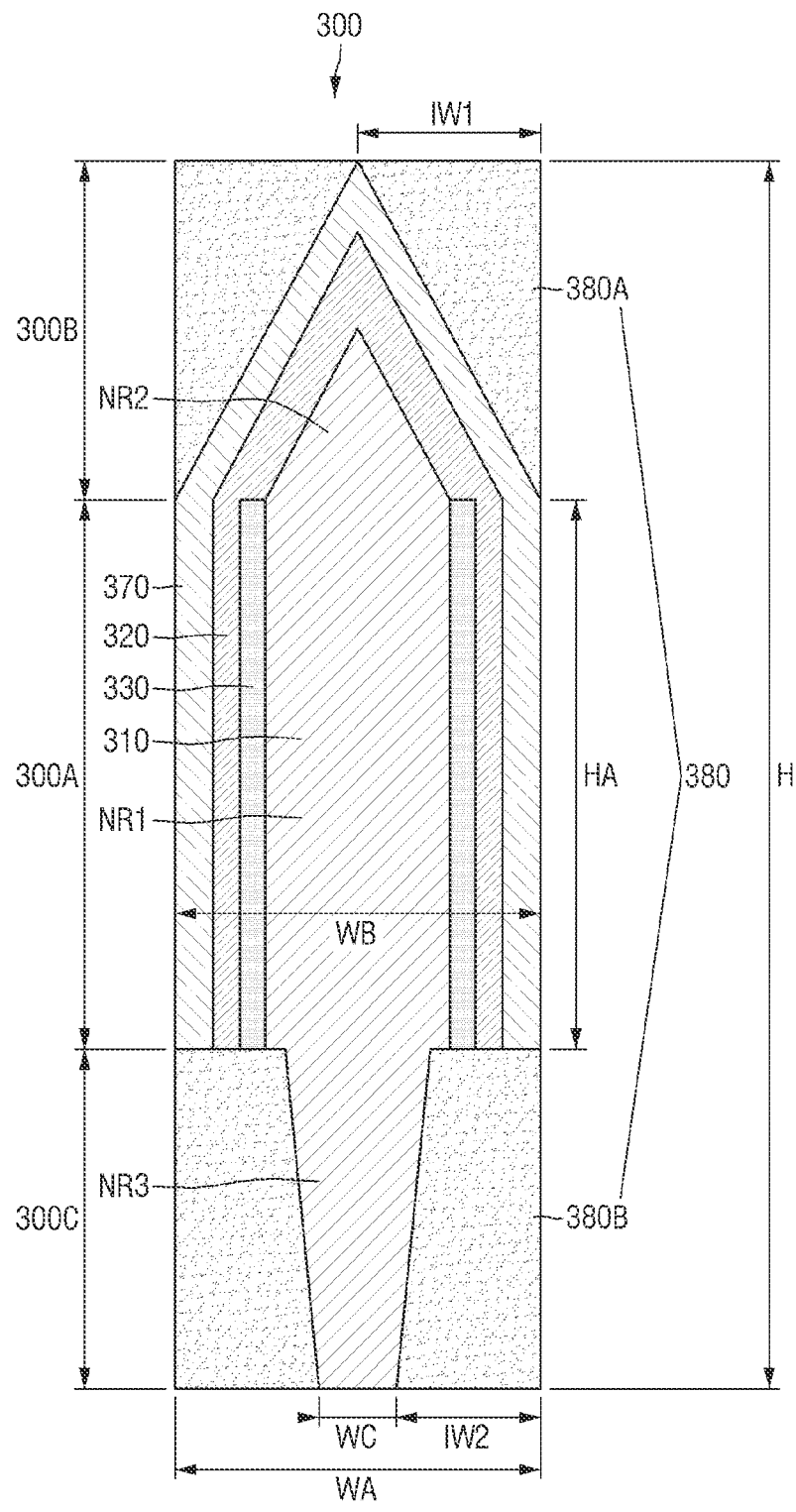
FIG. 5 is a schematic cross-sectional view of the light-emitting element of FIG. 4.

FIG. 4 is a schematic cutaway view of the light-emitting element according to one or more embodiments. FIG. 5 is a schematic cross-sectional view of the light-emitting element of FIG. 4. FIG. 4 is a schematic cutaway view in which a partial area of the light-emitting element 300 is cut, and FIG. 5 is a cross-sectional view of the light-emitting element 300 taken along an extending direction.

Referring to FIGS. 4 and 5, the light-emitting element 300 may be formed such that each of a plurality of semiconductor layers partially surrounds an outer surface of another layer. The light-emitting element 300 may include the semiconductor core SC of which at least a partial area extends in one direction, and the insulation film 380 partially surrounding an outer surface (e.g., an outer peripheral or circumferential surface) of the semiconductor core SC.

The light-emitting element 300 may include a first semiconductor layer 310, a second semiconductor layer 320, the active layer 330, an electrode layer 370, and the insulation film 380. The semiconductor core SC of the light-emitting element 300 may include at least the first semiconductor layer 310, the second semiconductor layer 320, and the active layer 330. In addition, as shown in the drawing, the semiconductor core SC may further include the electrode layer 370. The semiconductor core SC may include the first semiconductor layer 310 extending in one direction, and the active layer 330 and the second semiconductor layer 320 that are sequentially stacked while surrounding the outer surface (e.g., the outer peripheral or circumferential surface) of the first semiconductor layer 310.

According to one or more embodiments, the semiconductor core SC of the light-emitting element 300 may include a main body 300A, and a first end 300B and a second end 300C that are connected to the main body 300A. The main body 300A, the first end 300B, and the second end 300C are referred to define the semiconductor core SC, the light-emitting element 300, or some of the semiconductor layers constituting the semiconductor core SC or the light-emitting element 300, and may be integrally formed to configure one semiconductor core SC rather than separated from each other. That is, the main body 300A, the first end 300B, and the second end 300C may be referred to as partial areas of the semiconductor core SC distinguished from each other. In addition, it may be understood that the main body 300A, the first end 300B, and the second end 300C, which will be described below, are not necessarily limited to referring to partial areas of the semiconductor core SC including all of the plurality of semiconductor layers, and refer to some components, for example, partial areas of the first semiconductor layer 310, the active layer 330, the second semiconductor layer 320, and the like.

The main body 300A of the semiconductor core SC may have a shape extending in one direction. A cross-sectional outer surface of the main body 300A extending in the one direction may be formed to be flat. In one or more embodiments, the main body 300A may have a cylindrical shape, a rod shape, or a polygonal columnar shape, but the present disclosure is not limited thereto.

The first end 300B of the semiconductor core SC may be a portion connected to one side of the main body 300A. Unlike the main body 300A, the first end 300B may have a shape in which an outer surface (e.g., an outer peripheral or circumferential surface) thereof is inclined. The first end 300B may have a conical shape such that the inclined outer surface (e.g., the inclined outer peripheral or circumferential surface) thereof meets one side end of the semiconductor core SC. In the main body 300A and the first end 300B, the active layer 330, the second semiconductor layer 320, and the electrode layer 370 may be sequentially disposed around the first semiconductor layer 310 disposed at a center portion of the main body 300A and the first end 300B.

The second end 300C of the semiconductor core SC may be a portion connected to the other side of the main body 300A. The second end 300C has substantially the same shape as the main body 300A and may have a different diameter therefrom. According to one or more embodiments, a diameter WB of the main body 300A of the semiconductor core SC may be greater than a minimum diameter WC and the maximum diameter of the second end 300C. The second end 300C may be formed to have a smaller width than the main body 300A, and may have a shape in which an outer surface thereof is recessed toward the center portion from an outer surface of the main body 300A at a portion connected to the main body 300A. Accordingly, a step difference may be formed on the semiconductor core SC at the portion at which the main body 300A and the second end 300C are connected.

Unlike the main body 300A of the semiconductor core SC, the second end 300C may include only the first semiconductor layer 310. That is, the main body 300A and the second end 300C may have different layers, which are sequentially disposed, toward the outer surface (e.g., the outer peripheral or circumferential surface) of the semiconductor core SC with respect to the first semiconductor layer 310. Accordingly, the diameter WB of the main body 300A may be greater than the diameter WC of the second end 300C. In addition, as will be described below, in the first semiconductor layer 310, a portion corresponding to the main body 300A may be greater in diameter than a portion corresponding to the second end 300C. This may be caused by a structure formed when the first semiconductor layer 310 is grown in a manufacturing process of the light-emitting element 300.

When describing the plurality of layers constituting the semiconductor core SC in more detail, the first semiconductor layer 310 may be an n-type semiconductor. As an example, when the light-emitting element 300 emits light in a blue wavelength range, the first semiconductor layer 310 may include a semiconductor material having a chemical formula of $Al_xGa_yIn_{1-x-y}N$ ($0<=x<=1$, $0<=y<=1$, and $0<=x+y<=1$). For example, the semiconductor material may be one or more among AlGaInN, GaN, AlGaN, InGaN, AlN, and InN that are doped with an n-type impurity. The first semiconductor layer 310 may be doped with an n-type dopant. As an example, the n-type dopant may be Si, Ge, Sn, or the like. In one or more embodiments, the first semiconductor layer 310 may be n-GaN doped with n-type Si. A length of the first semiconductor layer 310 may range from 1.5 μm to 5 μm, but the present disclosure is not limited thereto.

According to one or more embodiments, the first semiconductor layer 310 may include a first portion NR1 corresponding to the main body 300A of the semiconductor core SC, a second portion NR2 corresponding to the first end 300B, and a third portion NR3 corresponding to the second end 300C. The first portion NR1 may have a shape extending in one direction, like the main body 300A of the semiconductor core SC. The first portion NR1 may have substantially the same shape as the main body 300A, but the present disclosure is not limited thereto, and the main body 300A may have a different diameter depending on the location. Although the first portion NR1 is illustrated in the drawing as having a constant diameter, in one or more embodiments, the first portion NR1 may have a shape in which the diameter increases toward the second portion NR2.

The second portion NR2 may be a portion located on one side of the first portion NR1, and may be formed such that an outer surface (e.g., an outer peripheral or circumferential surface) thereof is inclined. The second portion NR2 may extend to one side of the first portion NR1 and may be formed such that a cross-sectional side surface thereof is inclined. That is, the second portion NR2 may have a conical shape, and the first end 300B may have a conical shape depending on the shape of the second portion NR2. However, the present disclosure is not limited thereto.

The third portion NR3 may be a portion located at the other side of the first portion NR1. The third portion NR3 may have a shape extending in one direction like the first portion NR1. According to one or more embodiments, in the first semiconductor layer 310, the diameter of the first portion NR1 may be greater than a diameter of the third portion NR3. As shown in the drawing, the third portion NR3 of the first semiconductor layer 310 has a smaller diameter than the first portion NR1, and may have a shape in which an outer surface (e.g., an outer peripheral or circumferential surface) thereof is recessed toward a center from an outer surface of the first portion NR1. This structure may be formed by forming the third portion NR3 and then further depositing a material constituting the first semiconductor layer 310 to form the first portion NR1 in a formation process of the first semiconductor layer 310. When the first semiconductor layer 310 is formed, the first portion NR1 may be formed by further growing a semiconductor crystal only in a partial area of the semiconductor crystal extending in one direction. Furthermore, the third portion NR3 may be smaller in diameter from an area adjacent to the first portion NR1 toward the opposite area. However, the present disclosure is not limited thereto.

The second semiconductor layer 320 is disposed to be around (e.g., surround) the first portion NR1 and the second portion NR2 of the first semiconductor layer 310, including an active layer 330 to be described below. The second semiconductor layer 320 may be a p-type semiconductor. As an example, when the light-emitting element 300 emits light in a blue or green wavelength range, the second semiconductor layer 320 may include a semiconductor material having a chemical formula of $Al_xGa_yIn_{1-x-y}N$ ($0<=x<=1$, $0<=y<=1$, and $0<=x+y<=1$). For example, the semiconductor material may be one or more among AlGaInN, GaN, AlGaN, InGaN, AlN, and InN that are doped with a p-type impurity. The second semiconductor layer 320 may be doped with a p-type dopant. As an example, the p-type dopant may be Mg, Zn, Ca, Se, Ba, or the like. In one or more embodiments, the second semiconductor layer 320 may be p-GaN doped with p-type Mg. A thickness of the second semiconductor layer 320 may range from 0.05 μm to 0.10 μm, but the present disclosure is not limited thereto.

In one or more embodiments, each of the first semiconductor layer 310 and the second semiconductor layer 320 is illustrated in the drawing as being formed as one layer, but the present disclosure is not limited thereto. According to one or more embodiments, each of the first semiconductor layer 310 and the second semiconductor layer 320 may further include a larger number of layers, e.g., a clad layer or a tensile strain barrier reducing (TSBR) layer according to a material of the active layer 330.

The active layer 330 is disposed between the first semiconductor layer 310 and the second semiconductor layer 320. The active layer 330 may be disposed to be around (e.g., to surround) the first portion NR1 of the first semiconductor layer 310 and disposed between the first semiconductor layer 310 and the second semiconductor layer 320 in the main body 300A of the semiconductor core SC. As will be described below, the active layer 330 may include a quantum layer to emit light in a specific wavelength range. The wavelength range of the light emitted from the active layer 330 may vary depending on the content of a material included in the quantum layer. Furthermore, the content of the material included in the quantum layer of the active layer 330 may vary depending on a lattice constant of the first semiconductor layer 310 on which the active layer 330 is disposed. The lattice constant of the first semiconductor layer 310 may vary depending on a material of the first semiconductor layer 310 or the diameter or shape of the first semiconductor layer 310.

The first semiconductor layer 310 may include the first portion NR1 having a flat outer surface in cross section and the second portion NR2 and the third portion NR3 each having an inclined outer surface (e.g., an inclined outer peripheral or circumferential surface) or a different diameter in cross section, each of which may have a different lattice constant. When the active layer 330 entirely surrounds the first semiconductor layer 310, the content of the material included in the quantum layer may vary depending on the location at which the active layer 330 is disposed, thereby emitting light having different wavelength ranges. Because the active layer 330 is disposed only on the first portion NR1 of the first semiconductor layer 310, the light-emitting element 300 according to one or more embodiments may emit light at a desirable wavelength range (e.g., a set or predetermined wavelength range) by including a quantum layer having the same content of material. In addition, the active layer 330 is not disposed in the second portion NR2, and the second portion NR2 of the first semiconductor layer 310 may be in contact with the second semiconductor layer 320. However, the present disclosure is not limited thereto, and in one or more embodiments, the active layer 330 may be disposed on the second portion NR2 of the first semiconductor layer 310.

The active layer 330 may include a material having a single or multiple quantum well structure. When the active layer 330 includes a material having a multiple quantum well structure, the active layer 330 may have a structure in which quantum layers and well layers are alternately stacked. The active layer 330 may emit light due to a combination of electron-hole pairs in response to electrical signals applied through the first semiconductor layer 310 and the second semiconductor layer 320. As an example, when the active layer 330 emits light in a blue wavelength range, the active layer 330 may include a material such as AlGaN, AlGaInN, or the like. For example, when the active layer 330 has a multiple quantum well structure in which quantum layers and well layers are alternately stacked, the quantum layer may include a material such as AlGaN or AlGaInN, and the well layer may include a material such as GaN or AlInN. In one or more embodiments, the active layer 330 includes AlGaInN as a quantum layer and AlInN as a well layer. As described above, the active layer 330 may emit blue light having a central wavelength range ranging from 450 nm to 495 nm.

However, the present disclosure is not limited thereto, and the active layer 330 may have a structure in which a semiconductor material having large bandgap energy and a semiconductor material having small bandgap energy are alternately stacked or include other Group III or Group V semiconductor materials according to the wavelength range of emitted light. The light emitted by the active layer 330 is not limited to light in a blue wavelength range, and the active layer 330 may also emit light in a red or green wavelength range in some cases. A thickness of the active layer 330 may range from 0.05 μm to 0.10 μm, but the present disclosure is not limited thereto.

In one or more embodiments, the light emitted from the active layer 330 may be emitted to not only an outer surface (e.g., an outer peripheral or circumferential surface) of the light-emitting element 300 in a length direction but also both side surfaces of the light-emitting element 300. Directivity of the light emitted from the active layer 330 is not limited to one direction.

The electrode layer 370 may be an ohmic contact electrode. However, the present disclosure is not limited thereto, and the electrode layer 370 may also be a Schottky contact electrode. The light-emitting element 300 may include at least one electrode layer 370. Although the light-emitting element 300 is illustrated in FIGS. 4 and 5 as including a single electrode layer 370, the present disclosure is not limited thereto. In some cases, the light-emitting element 300 may include a larger number of electrode layers 370, or the electrode layer 370 may be omitted. The description of the light-emitting element 300, which will be provided below, may be identically applied even when the number of the electrode layers 370 is varied or another structure is further included.

The electrode layer 370 may be disposed on the second semiconductor layer 320. For example; the electrode layer 370 may be disposed directly on the second semiconductor layer 320 to be formed to be around (e.g., to surround) an outer surface (e.g., an outer peripheral or circumferential surface) of the second semiconductor layer 320. The electrode layer 370 may have substantially the same shape as the second semiconductor layer 320. That is, the electrode layer 370 may be disposed on the main body 300A and the first end 300B of the semiconductor core SC to correspond to the first portion NR1 and the second portion NR2 of the first semiconductor layer 310.

When the light-emitting element 300 is electrically connected to the electrodes 210 and 220 or the contact electrodes 260 (e.g., 261, 262), the electrode layer 370 may reduce resistance between the light-emitting element 300 and the electrodes (e.g., 210, 220) or contact electrodes (e.g., 261, 262). The electrode layer 370 may include a conductive metal. For example; the electrode layer 370 may include at least one of aluminum (Al), titanium (Ti), indium (In), gold (Au), silver (Ag), indium tin oxide (ITO), indium zinc oxide (IZO), and indium tin-zinc oxide (ITZO). Further, the electrode layer 370 may include a semiconductor material doped with an n-type or p-type impurity. However, the present disclosure is not limited thereto.

The insulation film 380 is disposed on the outer surface (e.g., the outer peripheral or circumferential surface) of the semiconductor core SC. The insulation film 380 is disposed to be around (e.g., to surround) the outer surface (e.g., the outer peripheral or circumferential surface) of the semiconductor core SC, and may serve to protect the semiconductor core SC. As described above, the light-emitting element 300 may be electrically connected to the first electrode 210 and the second electrode 220, and the outer surface of the light-emitting element 300 may be in direct contact with other layers, for example, the first insulation layer 510, the second insulation layer 520, and the contact electrode 260 (e.g.; 261, 262). The insulation film 380 may protect the semiconductor core SC from the other layers in contact with the light-emitting element 300.

A thickness of the insulation film 380 may range from 10 nm to 1.0 nm, but the present disclosure is not limited thereto. In one or more embodiments, the thickness of the insulation film 380 may be about 40 nm.

The insulation film 380 may include materials having insulating properties, for example, silicon oxide ($SiO_x$), silicon nitride ($SiN_x$), silicon oxynitride ($SiO_xN_y$), aluminum nitride ($Al_xN_y$), and aluminum oxide ($Al_xO_y$), or an organic insulation material, and the like. Accordingly, it is possible to prevent an electrical short circuit which may occur when the active layer 330 is in direct contact with the electrode through which an electrical signal is transmitted to the light-emitting element 300. Further, because the insulation film 380 protects the outer surface of the light-emitting element 300, including the active layer 330, it is possible to prevent degradation in light-emitting efficiency.

Further, in one or more embodiments, an outer surface (e.g., an outer peripheral or circumferential surface) of the insulation film 380 may be surface treated. When the display device 10 is manufactured, the light-emitting element 300 may be aligned by being sprayed on the electrodes in a state of being dispersed in a suitable ink (e.g., a set or predetermined ink). Here, in order to maintain a state in which the light-emitting element 300 is dispersed in the ink without aggregating with another adjacent light-emitting element 300, the surface of the insulation film 380 may be treated to be hydrophobic or hydrophilic.

In one or more embodiments, the insulation film 380 may include a portion surrounding an area of the outer surface (e.g., the outer peripheral or circumferential surface) of the semiconductor core SC, in which at least a side surface of the semiconductor core SC is inclined or stepped. According to one or more embodiments, the insulation film 380 may include a first insulation film 380A around (e.g., surrounding) the first end 300B of the semiconductor core SC and a second insulation film 380B around (e.g., surrounding) the second end 300C. The first insulation film 380A may be disposed directly on the electrode layer 370 of the semiconductor core SC, and the second insulation film 380B may be disposed to be around (e.g., to surround) the third portion NR3 of the first semiconductor layer 310.

The insulation film 380 may be disposed to be around (e.g., to surround) the outer surface (e.g., the outer peripheral or circumferential surface) of the semiconductor core SC having an inclined or stepped portion so that the light-emitting element 300 may have a constant diameter. In one or more embodiments, the insulation film 380 may not be disposed on the outer surface (e.g., the outer peripheral or circumferential surface) of the main body 300A of the semiconductor core SC, and may include the first insulation film 380A around (e.g., surrounding) the first end 300B, that has an inclined outer surface, and the second insulation film 380B around (e.g., surrounding) the outer surface of the second end 300C, on which a step difference is formed. According to one or more embodiments, a thickness of each of the first insulation film 380A and the second insulation film 380B may vary depending on the shape of the outer surface of the semiconductor core SC, and the light-emitting element 300 may have a constant diameter regardless of the shape of the semiconductor core SC.

For example, the first end 300B may have a smaller diameter from one side thereof connected to the main body 300A toward the other side thereof, and the first insulation film 380A around (e.g., surrounding) the first end 300B may increase in thickness from one side to the other side of the first end 3008. That is, the sum of the diameter of the first end 300B and the thickness of the first insulation film 380A may be substantially constant. Similarly, the second end 300C may have a smaller width than the main body 300A, and may concurrently (e.g., simultaneously) formed to be inclined on a side surface thereof, and the thickness of the second insulation film 380B may vary depending on the location. However, the sum of the diameter of the second end 300C and the thickness of the second insulation film 380B may be substantially constant.

According to one or more embodiments, a maximum thickness IW1 of the first insulation film 380A may be greater than a maximum thickness IW2 of the second insulation film 380B, and each of the first insulation film 380A and the second insulation film 380B may have a constant diameter so that an outer surface (e.g., an outer peripheral or circumferential surface) thereof is not inclined. As described above, the thickness of each of the first insulation film 380A and the second insulation film 380B may vary so that the sum of the thickness of the first insulation film 380A and the diameter of the first end 300B and the sum of the thickness of the second insulation film 380B and the diameter of the second end 300C are constant, respectively. Because the first end 300B has a conical shape from the main body 300A toward the opposite side of the main body 300A, the minimum diameter of the first end 300B may be less than the minimum diameter WC of the second end 300C. Accordingly, the maximum thickness IW1 of the first insulation film 380A around (e.g., surrounding) the first end 300B may be greater than the maximum thickness IW2 of the second insulation film 380B around (e.g., surrounding) the second end 300C. In contrast; the first end 300B has the same diameter as the main body 300A at a portion connected to the main body 300A, and the second end 300C has a diameter less than a diameter WA of the main body 300A. Accordingly, the minimum thickness of the first insulation film 380A may be less than the minimum thickness of the second insulation film 380B.

In one or more embodiments; the outer surface (e.g., the outer peripheral or circumferential surface) of each of the first insulation film 380A and the second insulation film 380B may form a flat surface in cross section with the outer surface of the main body 300A of the semiconductor core SC. That is; a cross-sectional outer surface of each of the first insulation film 380A, the second insulation film 380B, and the main body 300A may be collinear with each other. The semiconductor core SC may include the first end 300B having an inclined side surface, and the second end 300C recessed from the outer surface (e.g., the outer peripheral or circumferential surface) of the main body 300A and having a smaller width than the main body 300A. That is, the side surface of the semiconductor core SC may be inclined or stepped on the basis of the main body 300A according to the shape of the first semiconductor layer 310. In the light-emitting element 300 according to one or more embodiments, the insulation film 380 may be formed to correspond to the inclined or stepped portion of the semiconductor core SC.

The first insulation film 380A and the second insulation film 380B may be around (e.g., may surround) the first end 300B and the second end 300C, respectively, and the outer surfaces (e.g., the outer peripheral or circumferential surfaces) thereof may be coplanar with the outer surfaces (e.g., the outer peripheral or circumferential surfaces) of the main body 300A. That is, the thickness of each of the first insulation film 380A and the second insulation film 380B may vary depending on the location, and the diameter of the outer surface (e.g., the outer peripheral or circumferential surface) thereof may be constant. According to one or more embodiments, the first insulation film 380A and the second insulation film 380B may be disposed to compensate for the step difference of the outer surface of the semiconductor core SC, and the light-emitting element 300 may have a shape extending in one direction with a constant diameter.

When the side surface of the light-emitting element 300 is inclined or stepped, an empty space may be formed between the light-emitting element 300 and the first insulation layer 510 disposed below the light-emitting element 300. However, the light-emitting element 300 according to one or more embodiments includes the insulation film 380 disposed on the outer surface (e.g., the outer peripheral or circumferential surface) of the semiconductor core SC and the light-emitting element 300 may be disposed on the first insulation layer 510 without having an empty space formed therebelow, and disconnection or contact failure may be reduced or minimized in a material of the contact electrodes 260 (e.g., 261, 262) in contact with both ends of the light-emitting element 300.

The second insulation film 380B may be disposed to be around (e.g., to surround) the third portion NR3 of the first semiconductor layer 310, and a lower surface of the first semiconductor layer 310 may be disposed to be exposed. The exposed lower surface of the first semiconductor layer 310 may be in direct contact with the second contact electrode 262 of the display device 10. In addition, the second insulation film 380B may also be in direct contact with the active layer 330, the second semiconductor layer 320, and the electrode layer 370 that are exposed at a lower surface of the main body 300A. The second insulation film 380B is one end portion of the light-emitting element 300, and may prevent the second contact electrode 262 in contact with the first semiconductor layer 310 from being in direct contact with the second semiconductor layer 320. That is, the insulation film 380 may be disposed to be around (e.g., to surround) the outer surface (e.g., the outer peripheral or circumferential surface) of the semiconductor core SC to prevent a short circuit between the first contact electrode 261 and the second contact electrode 262. Further; because the second insulation film 380B is disposed to be around (e.g., to surround) the side surface of the second end 300C of the semiconductor core SC, the second insulation film 380B may prevent the second end 300C of the semiconductor core SC; that is, the first semiconductor layer 310 from being damaged during a manufacturing process of the light-emitting element 300.

In one or more embodiments, as shown in the drawing; the insulation film 380 may not be disposed on the main body 300A of the semiconductor core SC having a flat outer surface. Accordingly, in the light-emitting element 300, the insulation film 380 may be disposed so that the outer surface of the main body 300A, which is a portion of the semiconductor core SC, is exposed. However, the present disclosure is not limited thereto. In one or more embodiments, the insulation film 380 may further include a portion disposed to be around (e.g., to surround) the main body 300A of the semiconductor core SC. In this case, the first insulation film 380A and the second insulation film 380B may form a flat outer surface (e.g., a flat outer peripheral or circumferential surface) together with the portion around (e.g., surrounding) the main body 300A. This will be described below with reference to other embodiments.

The light-emitting element 300 may have a length H ranging from 1 μm to 10 μm or from 2 μm to 6 μm, and preferably from 3 μm to 5 μm. In addition, the diameter of the light-emitting element 300 may range from 300 nm to 700 nm, and an aspect ratio of the light-emitting element 300 may range from 1.2 to 100. However, the present disclosure is not limited thereto, and the plurality of light-emitting elements 300 included in the display device 10 may have different diameters according to a composition difference of the active layer 330. In one or more embodiments, the diameter of the light-emitting element 300 may have a range of about 500 nm.

Figure 6:
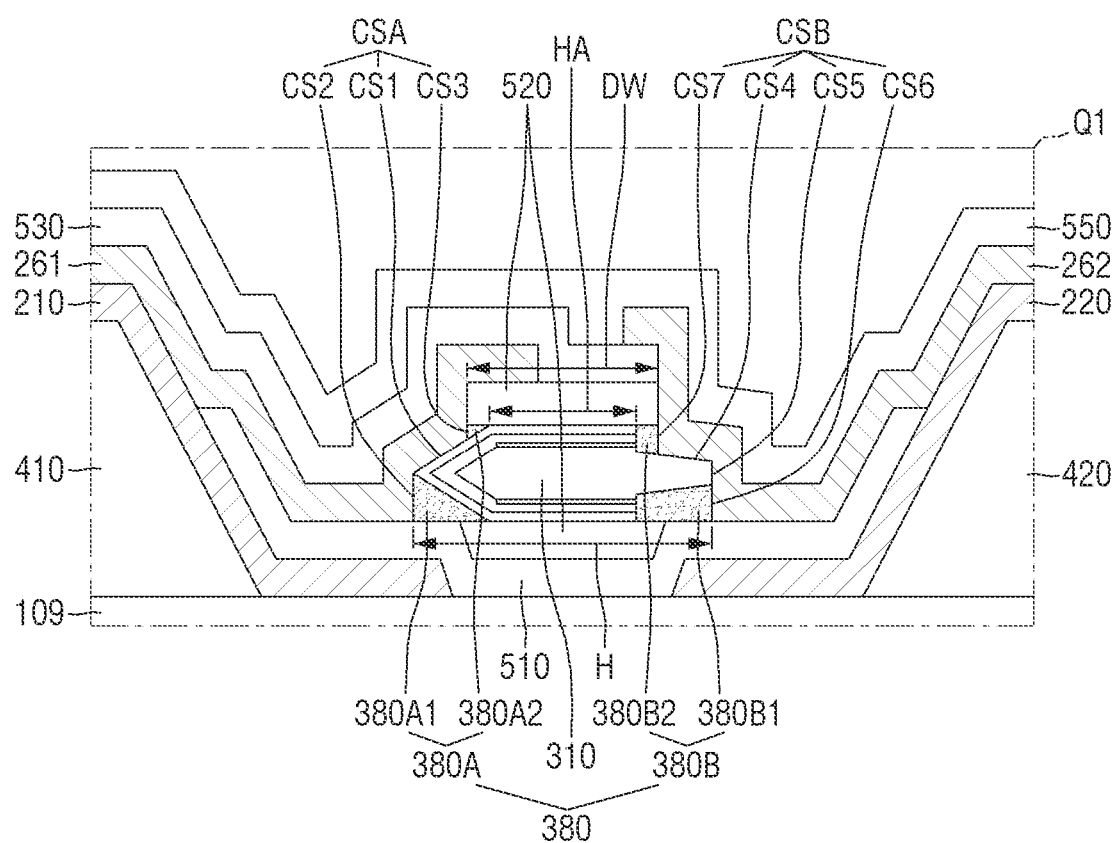
FIG. 6 is an enlarged view of a portion Q1 of FIG. 3.

FIG. 6 is an enlarged view of a portion Q1 of FIG. 3.

FIG. 6 illustrates an enlarged view of the light-emitting element 300 disposed between the first electrode 210 and the second electrode 220 in FIG. 3. Referring to FIG. 6, the light-emitting element 300 may be disposed on the first insulation layer 510 between the first electrode 210 and the second electrode 220. The light-emitting element 300 may be disposed between the first insulation layer 510 and the second insulation layer 520, and the outer surface thereof may be partially in direct contact with each of the first insulation layer 510 and the second insulation layer 520.

The active layer 330 of the light-emitting element 300 may be disposed to surround the first portion NR1 of the first semiconductor layer 310, and light generated from the active layer 330 may be emitted to at least the side surface of the light-emitting element 300. The light passes through the second insulation layer 520, the third insulation layer 530, and the like to travel in an upward direction with respect to the first substrate 101. However, the present disclosure is not limited thereto, and some of the light emitted from the light-emitting element 300 may be emitted through both ends of the light-emitting element 300. In this case, the light emitted from the both ends of the light-emitting element 300 may be reflected by the electrodes 210 and 220 disposed on the first inner bank 410 and the second inner bank 420.

In one or more embodiments, the light-emitting element 300 includes the semiconductor core SC of which the outer surface is inclined or stepped, and the insulation film 380 disposed to compensate for the step difference of the outer surface of the semiconductor core SC. According to one or more embodiments, at least one surface of the light-emitting element 300 included in the display device 10, which is in contact with the first insulation layer 510, may have a flat surface. As shown in the drawing, the light-emitting element 300, shown in cross section, may include a lower surface facing the first insulation layer 510 and an upper surface facing the second insulation layer 520.

A portion of the outer surface of the light-emitting element 300, that is, at least a portion of the lower surface thereof may be in direct contact with the first insulation layer 510. In one or more embodiments, the surface of the light-emitting element 300 in direct contact with the first insulation layer 510 may include the main body 300A and the insulation film 380 of the semiconductor core SC and thus include a flat surface. As described above, the insulation film 380 of the light-emitting element 300 may be disposed to compensate for an inclined surface or step difference formed on the outer surface of the semiconductor core SC, and the light-emitting element 300 disposed on the first insulation layer 510 may form a flat surface on at least a surface thereof in contact with the first insulation layer 510. The portion of the light-emitting element 300, which is in direct contact with the first insulation layer 510, may be the first insulation film 380A and the second insulation film 380B, but the present disclosure is not limited thereto. In some cases, in the light-emitting element 300, the insulation film 380 may not be disposed, and the exposed main body 300A of the semiconductor core SC may be in direct contact with the first insulation layer 510.

Further, as described above, an upper surface of the first insulation layer 510 may have a step difference formed along the electrodes 210 and 220 disposed therebelow, and a space may be formed between the lower surface of the light-emitting element 300 and the first insulation layer 510. In one or more embodiments, the space may be filled with the second insulation layer 520, and in this case, the lower surface of the light-emitting element 300 may be partially in direct contact with the second insulation layer 520. The portion in contact with the second insulation layer 520 may be the main body 300A of the semiconductor core SC, including the insulation film 380, but the present disclosure is not limited thereto.

In one or more embodiments, in the light-emitting element 300, the first end 300B of the semiconductor core SC may be disposed to overlap the first electrode 210 in the thickness direction, and the second end 300C may be disposed to overlap the second electrode 220 in the thickness direction. According to one or more embodiments, the length H of the light-emitting element 300 may be greater than a separation distance between the first electrode 210 and the second electrode 220. However, the present disclosure is not limited thereto.

In one or more embodiments, one end of the light-emitting element 300 may be in contact with the first contact electrode 261 and the other end thereof may be in contact with the second contact electrode 262. For example, in the light-emitting element 300, one end thereof on which the first end 300B of the semiconductor core SC is located, may be in contact with the first contact electrode 261, and the other end thereof on which the second end 300C of the semiconductor core SC is located, may be in contact with the second contact electrode 262.

As will be described below, in a process of forming the first contact electrode 261 and the second contact electrode 262, the light-emitting element 300 may be patterned together with the second insulation layer 520 and a portion of the insulation film 380 may be removed. As an example, in the insulation film 380 of the light-emitting element 300, a portion in contact with the second insulation layer 520, or the first insulation film 380A and the second insulation film 380B located on an upper portion in cross section may be partially removed, and the semiconductor core SC may be partially exposed. For example, the first insulation film 380A may be removed so that the side surface of the first end 300B of the semiconductor core SC is partially exposed, and may include a first residue 380A1 located between the first end 300B and the first insulation layer 510 and a second residue 380A2 located between the first end 300B and the second insulation layer 520. The second insulation film 380B may be removed so that the side surface of the second end 300C of the semiconductor core SC is partially exposed, and may include a third residue 380B1 located between the second end 300C and the first insulation layer 510, and a fourth residue 380B2 located between the second end 300C and the second insulation layer 520. In the semiconductor core SC, a portion of the electrode layer 370 of the first end 300B and a portion of the first semiconductor layer 310 of the second end 300C may be exposed.

The first contact electrode 261 may be in contact with the exposed first end 300B and the first residue 380A1 and the second residue 380A2 of the first insulation film 380A, as one end of the light-emitting element 300. The second contact electrode 262 may be in contact with the exposed second end 300C and the third residue 380B1 and the fourth residue 380B2 of the second insulation film 380B, as the other end of the light-emitting element 300. The first contact electrode 261 and the second contact electrode 262 may be respectively in contact with one end and the other end of the light-emitting element 300 to form a plurality of contact surfaces CSA and CSB.

The contact surfaces CSA and CSB may include a first contact surface CSA formed by the first contact electrode 261 and a second contact surface CSB formed by the second contact electrode 262. In addition, according to one or more embodiments, the first contact surface CSA and the second contact surface CSB may include surfaces that are in contact with the semiconductor core SC and the insulation film 380 of the light-emitting element 300, respectively, and not parallel to each other. For example, the first contact surface CSA may include a first surface CS1 formed due to the first end 300B of the semiconductor core SC, a second surface CS2 formed due to the first residue 380A1 of the first insulation film 380A, and a third surface CS3 formed due to the second residue 380A2. The second contact surface CSB may include a fourth surface CS4 and a fifth surface CS5 formed by the second end 300C of the semiconductor core SC, a sixth surface CS6 formed by the third residue 380B1 of the second insulation film 380B, and a seventh surface CS7 formed by the fourth residue 380B2.

The first surface CS1 of the first contact surface CSA may be a surface in which the first contact electrode 261 is in contact with the first end 300B of the semiconductor core SC, and the light-emitting element 300 may receive an electrical signal at the first surface CS1 through the first contact electrode 261. The first surface CS1 may be formed along the inclined surface of the first end 300B. According to one or more embodiments, the first contact surface CSA formed by the first contact electrode 261 in contact with one end of the light-emitting element 300 may include the first surface CS1 that is not parallel to the upper surface of the first substrate 101 or the first planarization layer 109.

Similarly, the fourth surface CS4 and the fifth surface CS5 of the second contact surface CSB are surfaces in which the second contact electrode 262 is in contact with the second end 300C of the semiconductor core SC, and the light-emitting element 300 may receive the electrical signal at the fourth surface CS4 and the fifth surface CS5 through the second contact electrode 262. The fourth surface CS4 may be a portion of the second end 300C or the side surface of the first semiconductor layer 310 exposed in a process of forming the second insulation layer 520, and the fifth surface CS5 may be a portion of the lower surface of the light-emitting element 300 and may be the lower surface of the first semiconductor layer 310. The fourth surface CS4 may be formed along the inclined surface of the second end 300C. According to one or more embodiments, the second contact surface CSB formed by the second contact electrode 262 in contact with the other end of the light-emitting element 300 may include the fourth surface CS4 that is not parallel to the upper surface of the first substrate 101 or the first planarization layer 109.

In addition, the first contact surface CSA and the second contact surface CSB may further include contact surfaces perpendicular to the upper surface of the first substrate 101 or the first planarization layer 109. For example, the second surface CS2 formed by the first contact electrode 261 and the first residue 380A1 and the third surface CS3 formed by the second residue 380A2 may be perpendicular to the upper surface of the first substrate 101. The sixth surface CS6 formed by the second contact electrode 262 and the third residue 380B1 and the seventh surface CS7 formed by the fourth residue 380B2 may be perpendicular to the upper surface of the first substrate 101.

The light-emitting element 300 according to one or more embodiments may include the first insulation film 380A and the second insulation film 380B to compensate for the inclined side surface and the step difference of the semiconductor core SC. In the light-emitting element 300 included in the display device 10, the first insulation film 380A and the second insulation film 380B may include the first residue 380A1 and the third residue 38081, respectively, located between the semiconductor core SC and the first insulation layer 510. The first contact electrode 261 and the second contact electrode 262, which are in contact with both ends of the light-emitting element 300, may be disposed to be in contact with the first residue 380A1 and the third residue 380B1, respectively, that are located between the semiconductor core SC and the first insulation layer 510. The first residue 380A1 and the third residue 38081 may fill an empty space that may be formed between both ends of the light-emitting element 300 and the first insulation layer 510, and may prevent disconnection of a material due to the empty space when the contact electrodes 261 and 262 are formed. That is, the light-emitting element 300 according to one or more embodiments includes the first insulation film 380A and the second insulation film 380B to form a smooth contact with the contact electrodes 261 and 262.

Further, the first contact electrode 261 and the second contact electrode 262 may also be in contact with the second residue 380A2 and the fourth residue 38082, respectively. According to one or more embodiments, the second residue 380A2 and the fourth residue 38082 may be portions of the insulation film 380 of the light-emitting element 300 that remain in the process of forming the contact electrodes 261 and 262 and are in direct contact with the second insulation layer 520. In the light-emitting element 300, the main body 300A of the semiconductor core SC may be exposed without being surrounded by the insulation film 380. Because the second residue 380A2 and the fourth residue 38082 are disposed between the second insulation layer 520 and the semiconductor core SC, the first contact electrode 261 and the second contact electrode 262 may be prevented from being in direct contact with the main body 300A. For example, the fourth residue 380B2 may prevent a short circuit between the first contact electrode 261 and the second contact electrode 262 by preventing the second contact electrode 262 from being in direct contact with the electrode layer 370 or the second semiconductor layer 320 of the main body 300A.

The second insulation layer 520 may be disposed to be around (e.g., to surround) the side surface of the light-emitting element 300. According to one or more embodiments, the second insulation layer 520 may be in direct contact with a portion of each of the main body 300A and the insulation film 380 of the semiconductor core SC at the side surface of the light-emitting element 300. The main body 300A of the semiconductor core SC may be exposed without being surrounded by the insulation film 380 and may be in direct contact with the second insulation layer 520. In particular, the main body 300A may also be in direct contact with the second insulation layer 520 disposed between the light-emitting element 300 and the first insulation layer 510 in addition to the second insulation layer 520 disposed on the light-emitting element 300.

The second insulation layer 520 may be formed to have a suitable width (e.g., a set or predetermined width) so that the insulation film 380 of the light-emitting element 300 may include the second residue 380A2 and the fourth residue 380B2. According to one or more embodiments, a width DW of the second insulation layer 520 may be greater than a width or a length HA of the main body 300A of the semiconductor core SC. Accordingly, in the semiconductor core SC, only the first end 300B and the second end 300C may be partially exposed, and the main body 300A may not be exposed.

According to one or more embodiments, because the light-emitting element 300 includes the insulation film 380, a space may not be formed between the semiconductor core SC and the first insulation layer 510, and the contact electrodes 261 and 262 in contact with both ends of the light-emitting element 300 may be prevented from being undercut that may occur between the light-emitting element 300 and the first insulation layer 510. The display device 10 may have a smooth contact surface between the light-emitting element 300 and each of the contact electrodes 261 and 262, and a material forming the contact electrodes 261 and 262 may be prevented from being disconnected.

In one or more embodiments, the light-emitting element 300 may be manufactured by an epitaxial growth method that forms the semiconductor layer by growing a semiconductor crystal. The light-emitting element 300 may be manufactured by sequentially forming the first semiconductor layer 310, the active layer 330, the second semiconductor layer 320, and the electrode layer 370 on a lower substrate, and then forming the insulation film 380 partially surrounding the outer surface (e.g., the outer peripheral or circumferential surface) of the first semiconductor layer 310, the active layer 330, the second semiconductor layer 320, and the electrode layer 370.

Hereinafter, a manufacturing process of the light-emitting element 300 according to one or more embodiments will be described with reference to other drawings.

FIGS. 7 to 14 are cross-sectional views illustrating a manufacturing process of the light-emitting element according to one or more embodiments.

Referring to FIGS. 7 to 14, the light-emitting element 300 according to one or more embodiments may be manufactured by growing semiconductor cores SC on a lower substrate and forming an insulation film 380 around (e.g.; surrounding) an outer surface (e.g., an outer peripheral or circumferential surface) of each of the semiconductor cores SC. In the process of forming the insulation film 380 the insulation film 380 may be formed such that an outer surface (e.g., an outer peripheral or circumferential surface) of the light-emitting element 300 has a flat surface even when a side surface of the semiconductor core SC is inclined or stepped.

Figure 7:
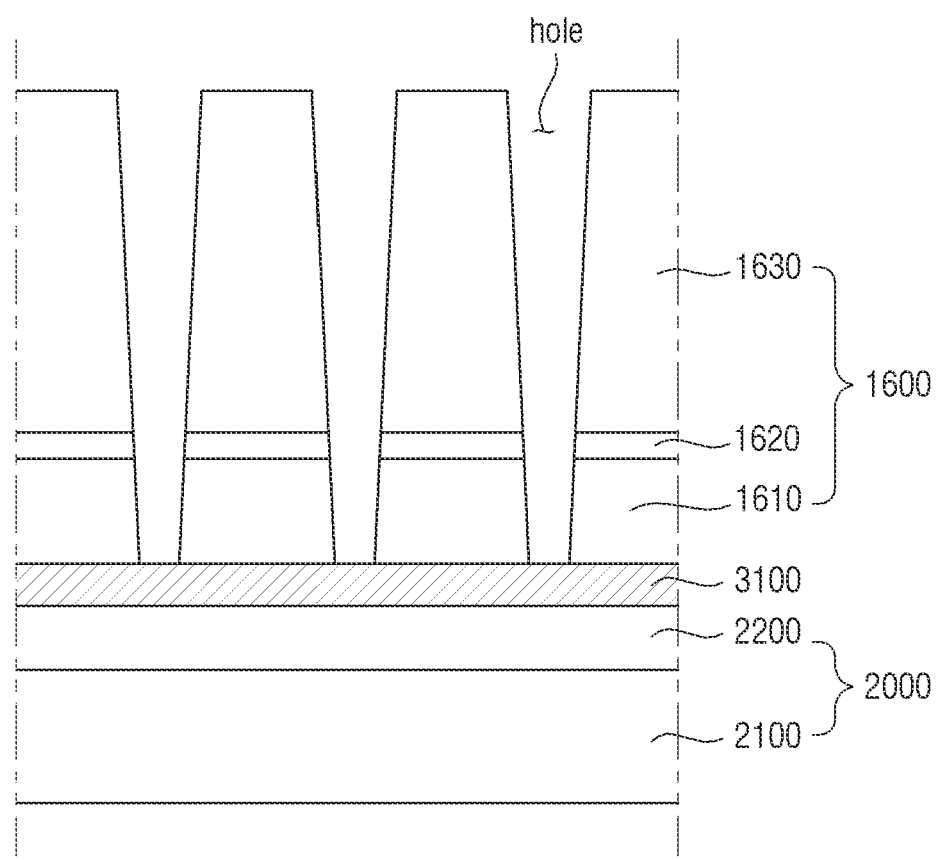
FIGS. 7 to 14 are cross-sectional views illustrating a manufacturing process of the light-emitting element according to one or more embodiments.

First, as shown in FIG. 7, a lower substrate 2000 including a base substrate 2100 and a buffer material layer 2200 formed on the base substrate 2100 is prepared, and a sub-semiconductor layer 3100 and a mask layer 1600 are formed on the lower substrate 2000.

The base substrate 2100 may include a sapphire ($Al_2O_3$) substrate and a transparent substrate such as glass. However, the present disclosure is not limited thereto, and the base substrate 2100 may be formed as a conductive substrate such as a GaN, SiC, ZnO, Si, GaP, or GaAs substrate. Hereinafter, a case in which the base substrate 2100 is a sapphire ($Al_2O_3$) substrate will be described as an example.

A plurality of semiconductor layers may be formed on the base substrate 2100. The plurality of semiconductor layers grown by an epitaxial method may be formed by growing a seed crystal. Here, the method of forming the semiconductor layers may include an electron beam deposition method, a physical vapor deposition (PVD) method, a chemical vapor deposition (CVD) method, a plasma laser deposition (PLD) method, a dual-type thermal evaporation method, a sputtering method, a metal-organic chemical vapor deposition method (MOCVD), or the like, and preferably, the MOCVD method. However, the present disclosure is not limited thereto.

Hereinafter, the method of forming the plurality of semiconductor layers, process conditions, and the like will be omitted in the description, and a sequence of the manufacturing method and a stacked structure of the light-emitting element 300 will be described in detail.

The buffer material layer 2200 may be formed on the base substrate 2100. In the drawing, one buffer material layer 2200 is illustrated as being stacked, but the present disclosure is not limited thereto, and a plurality of buffer layers may be formed. The buffer material layer 2200 may be disposed to reduce a lattice constant difference between a first semiconductor layer 310 and the base substrate 2100.

As an example, the buffer material layer 2200 may include an undoped semiconductor, may include substantially the same material as the first semiconductor layer 310, and may contain a material that is not doped with an n-type or p-type dopant. In one or more embodiments, the buffer material layer 2200 may include at least one selected from among undoped InAlGaN, GaN, AlGaN, InGaN, AlN, and InN, but the present disclosure is not limited thereto. In addition, the buffer material layer 2200 may be omitted depending on the base substrate 2100.

The sub-semiconductor layer 3100 may be formed on the buffer material layer 2200. The sub-semiconductor layer 3100 may include the same material as the first semiconductor layer 310. As an example, the sub-semiconductor layer 3100 may include an n-type semiconductor layer. The sub-semiconductor layer 3100 may provide a seed crystal of the first semiconductor layer 310 formed by an epitaxial growth method.

The mask layer 1600 may be formed on the sub-semiconductor layer 3100. The mask layer 1600 may provide a space in which the first semiconductor layer 310 grows. An etching hole exposing a portion of the sub-semiconductor layer 3100 may be formed in the mask layer 1600, and a crystal grown through the etching hole from the sub-semiconductor layer 3100 may form the first semiconductor layer 310. In one or more embodiments, the mask layer 1600 may include a first mask layer 1610, a second mask layer 1620, and a third mask layer 1630. The first mask layer 1610 may be formed on the sub-semiconductor layer 3100, and the second mask layer 1620 and the third mask layer 1630 may be sequentially formed on the first mask layer 1610.

A portion of the sub-semiconductor layer 3100 grown through the first mask layer 1610 and the second mask layer 1620 may be a third portion NR3 of the first semiconductor layer 310. The third portion NR3 may have substantially the same shape as the etching hole formed in the first mask layer 1610 and the second mask layer 1620. As will be described below; in the first semiconductor layer 310, the third portion NR3 may have a small width like the etching hole formed in the first mask layer 1610 and the second mask layer 1620, and a first portion NR1 and a second portion NR2 may be formed by further growing semiconductor crystals in a subsequent process. Accordingly, in the first semiconductor layer 310, the third portion NR3 may have a width less than that of the first portion NR1 and have a shape extending in one direction.

Further, in one or more embodiments, the first mask layer 1610 and the second mask layer 1620 may be formed to have a suitable thickness (e.g., a set or predetermined thickness) so that the third portion NR3 of the first semiconductor layer 310 has a specific length. The first mask layer 1610 may be thicker than the second mask layer 1620, and a thickness thereof may be greater than or equal to 300 nm. However, the present disclosure is not limited thereto.

The portion of the sub-semiconductor layer 3100 grown through the etching hole of the third mask layer 1630 may be the first portion NR1 and the second portion NR2 of the first semiconductor layer 310. However, the first portion NR1 and the second portion NR2 of the first semiconductor layer 310 may be formed by further depositing a material forming the first semiconductor layer 310 in a subsequent process, and may have a different shape from the etching hole formed in the third mask layer 1630. Accordingly, a diameter of the third portion NR3 of the first semiconductor layer 310 may be different from that of each of the first portion NR1 and the second portion NR2.

A material forming each of the first mask layer 1610, the second mask layer 1620, and the third mask layer 1630 is not particularly limited, and in one or more embodiments, each of the first mask layer 1610, the second mask layer 1620, and the third mask layer 1630 may include one of silicon oxide ($SiO_x$), silicon nitride ($SiN_x$), and silicon oxynitride ($SiO_xN_y$).

The etching hole exposes at least a partial area of the sub-semiconductor layer 3100 through the third mask layer 1630, the second mask layer 1620, and the first mask layer 1610. The first semiconductor layer 310 may be formed by growing a crystal through the etching hole from the sub-semiconductor layer 3100.

A plurality of etching holes may be formed in the mask layer 1600 to be spaced from each other. A separation distance between the etching holes and a diameter of each of the etching holes are not particularly limited. A diameter of the portion of the sub-semiconductor layer 3100 exposed by the etching hole may be less than the separation distance between the etching holes. In one or more embodiments, a ratio of the diameter of the portion exposed by the etching hole of the sub-semiconductor layer 3100 and the separation distance between the etching holes may be 1:2.5 to 1:3.

In one or more embodiments, an inner sidewall of the mask layer 1600 exposed by the etching hole may be formed to be inclined from an upper surface of the sub-semiconductor layer 3100. That is, the diameter of the etching hole may be reduced from the third mask layer 1630 toward the first mask layer 1610. Accordingly, the first semiconductor layer 310 formed along the etching hole may be formed such that an outer surface thereof is inclined. Furthermore, in the first semiconductor layer 310, the diameter of the third portion NR3 may be formed to be less than that of each of the first portion NR1 and the second portion NR2.

The process of forming the etching hole is not particularly limited, and may be performed through a typical process. For example, the process of forming the etching hole may be performed through a dry etching method, a wet etching method, a reactive ion etching (RIE) method, an inductively coupled plasma reactive ion etching (ICP-RIE) method, or the like.

Figure 8:
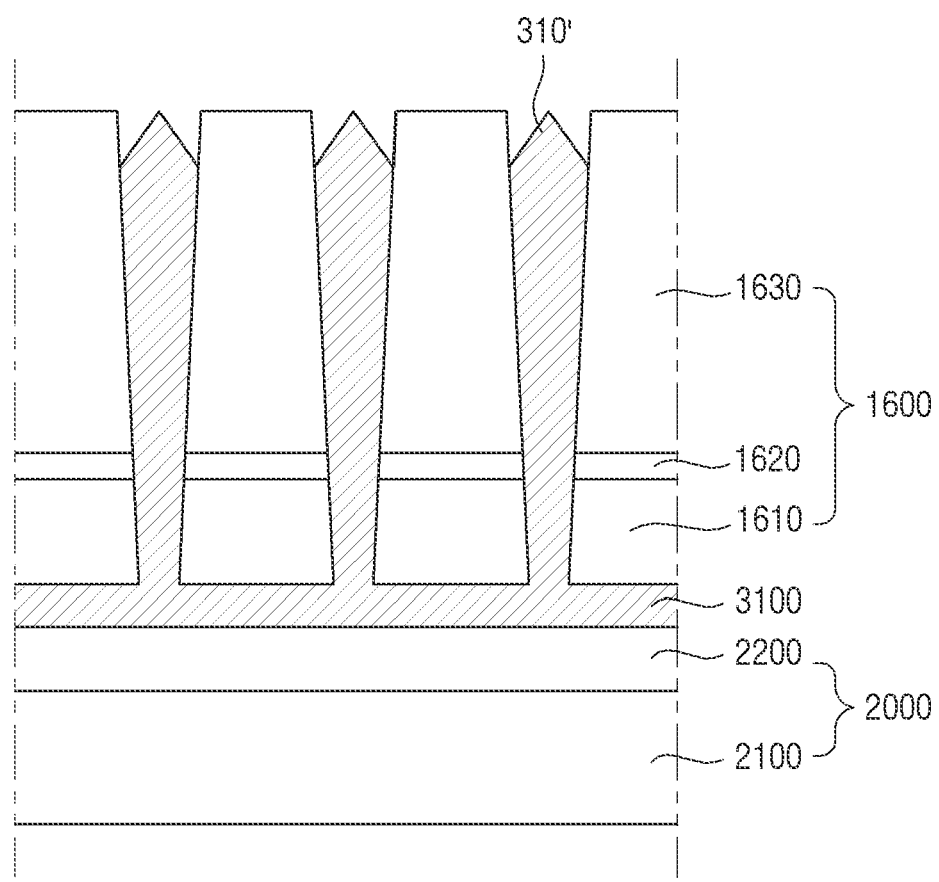
Figure 9:
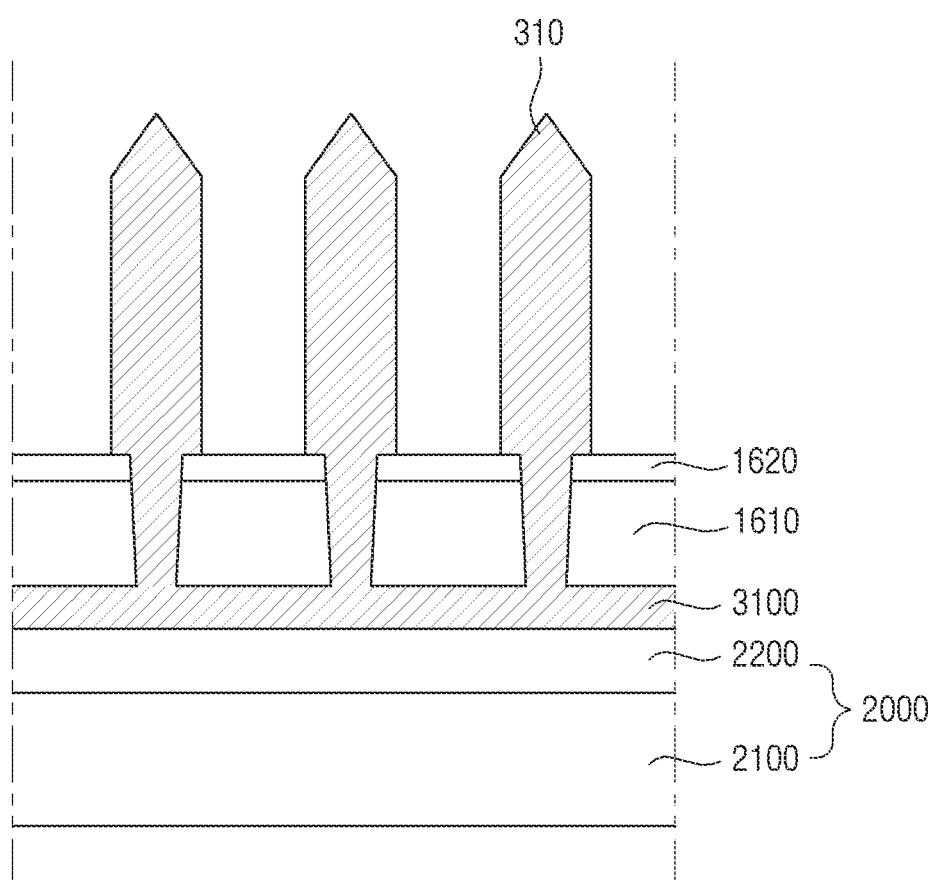

Next, referring to FIGS. 8 and 9, the first semiconductor layer 310 grown along the etching hole from the sub-semiconductor layer 3100 is formed. The process of forming the first semiconductor layer 310 includes growing a semiconductor crystal of the sub-semiconductor layer 3100 to form a first sub-semiconductor layer 310', removing the third mask layer 1630, and depositing a semiconductor material on the first sub-semiconductor layer 310' to form the first semiconductor layer 310. The process of removing the third mask layer 1630 may be a process that may be typically performed. As an example, the process may be performed through a reactive ion etching (RIE) method, an inductively coupled plasma reactive ion etching (ICP-RIE) method, or the like, but the present disclosure is not limited thereto. A detailed description thereof will be omitted.

First, as shown in FIG. 8, the semiconductor crystal of the sub-semiconductor layer 3100 is grown along the etching hole of the mask layer 1600 to form the first sub-semiconductor layer 310'. A side surface of the first sub-semiconductor layer 310' may have an inclined shape depending on the shape of the etching hole. That is, a width of the first sub-semiconductor layer 310' may be increased from a lower end thereof on which the first mask layer 1610 is located to an upper end thereof on which the third mask layer 1630 is located. However, an end of the semiconductor crystal in a direction in which the semiconductor crystal grows, that is, an area forming the second portion NR2 of the first semiconductor layer 310 may be reduced in width to have a conical shape.

Next, as shown in FIG. 9, the third mask layer 1630 is removed, and the first semiconductor layer 310 is formed by further depositing a material forming the first semiconductor layer 310. The material forming the first semiconductor layer 310 may be deposited only in an area exposed by removing the third mask layer 1630, and may not be deposited in an area surrounded by the first mask layer 1610 and the second mask layer 1620. Accordingly, the first semiconductor layer 310 may include the third portion NR3 having a relatively small width and the first portion NR1 and the second portion NR2 each having a relatively greater width.

Figure 10:
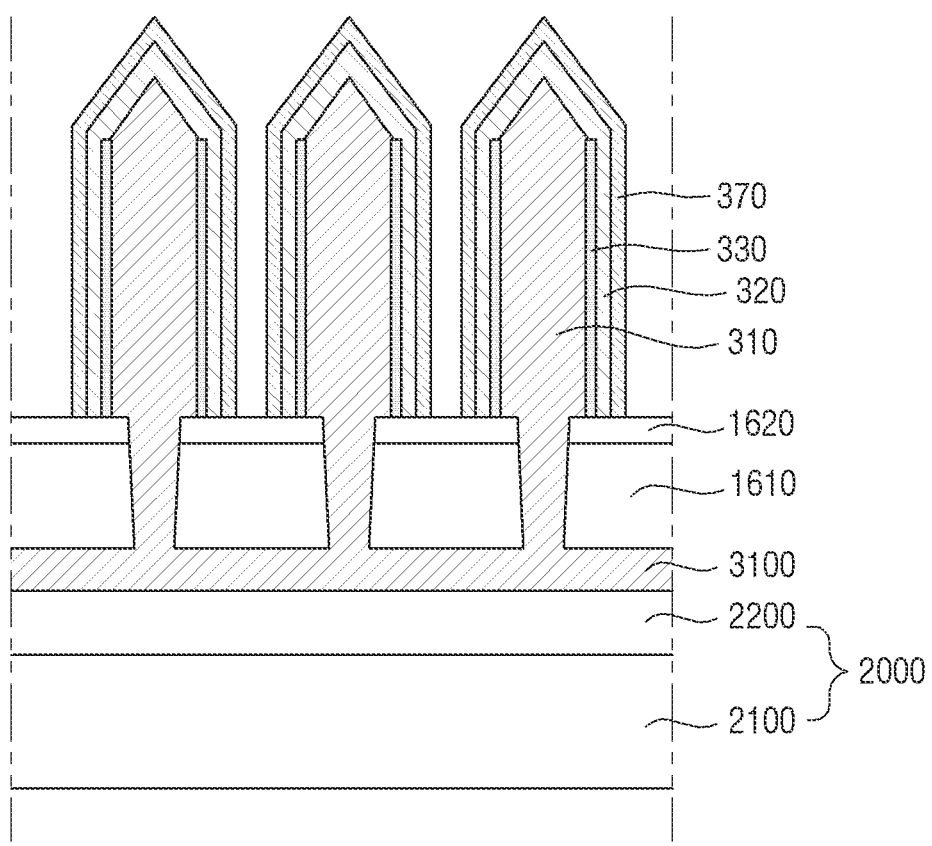

Next, referring to FIG. 10, an active layer 330, a second semiconductor layer 320, and an electrode layer 370 are formed on the exposed first and second portions NR1 and NR2 of the first semiconductor layer 310. The active layer 330 may be formed to be around (e.g., to surround) the first portion NR1 of the first semiconductor layer 310, and the second semiconductor layer 320 may be formed to be around (e.g., to surround) the entire exposed outer surface (e.g., an outer peripheral or circumferential surface) of the first semiconductor layer 310, including the active layer 330. The electrode layer 370 may be formed to be around (e.g., to surround) an outer surface (e.g., an outer peripheral or circumferential surface) of the second semiconductor layer 320. Because the third portion NR3 of the first semiconductor layer 310 is not exposed by being surrounded by the first mask layer 1610 and the second mask layer 1620, the active layer 330, the second semiconductor layer 320, and the electrode layer 370 may not be formed in the third portion NR3. The shape thereof may be the same as described above.

Figure 11:
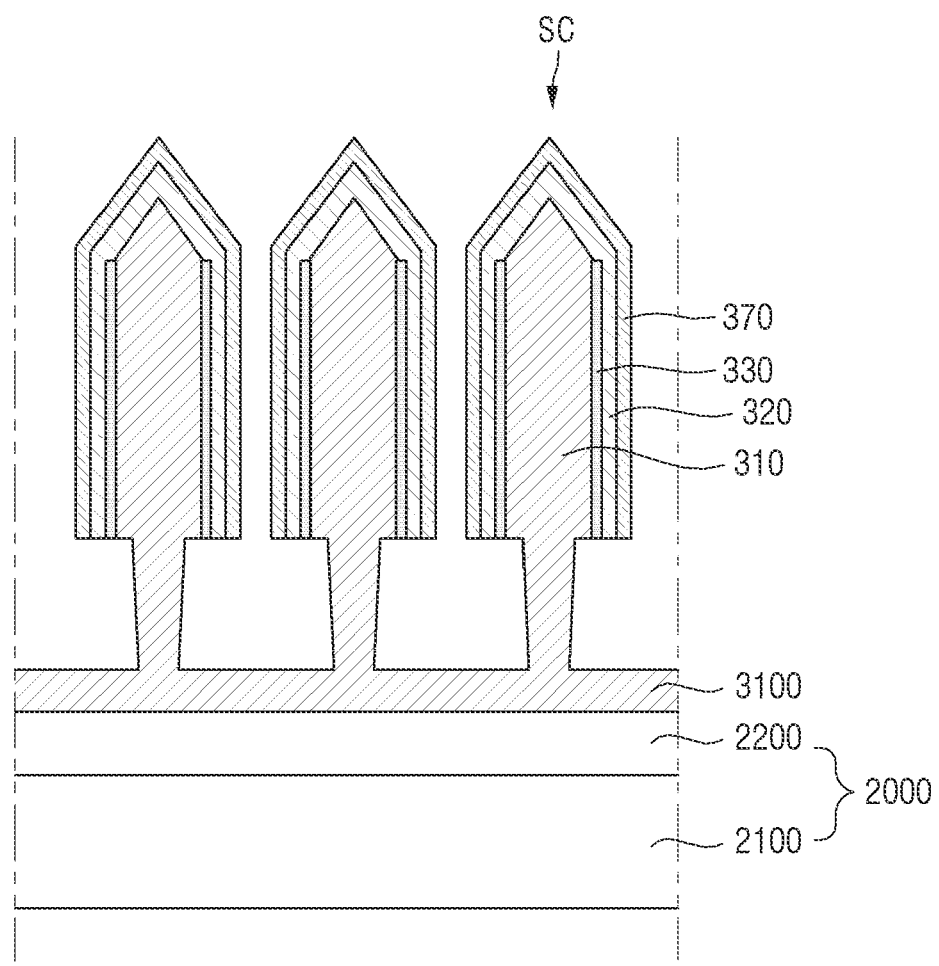

Next, referring to FIG. 11, the first mask layer 1610 and the second mask layer 1620 are removed to expose the third portion NR3 of the first semiconductor layer 310. The process of removing the first mask layer 1610 and the second mask layer 1620 may be performed through a typical process as described above. The semiconductor core SC may be formed on the lower substrate 2000 through the above-described process. The semiconductor cores SC may be spaced from each other depending on the locations of the etching holes formed in the mask layer 1600.

As described above, Because the first semiconductor layer 310 includes the first portion NR1, the third portion NR3, and the second portion NR2 having different widths from each other, the side surface of the semiconductor core SC may be inclined or stepped. The insulation film 380 may be formed on an outer surface (e.g., an outer peripheral or circumferential surface) of the semiconductor core SC to compensate for the step difference of the side surface of the semiconductor core SC.

Figure 12:
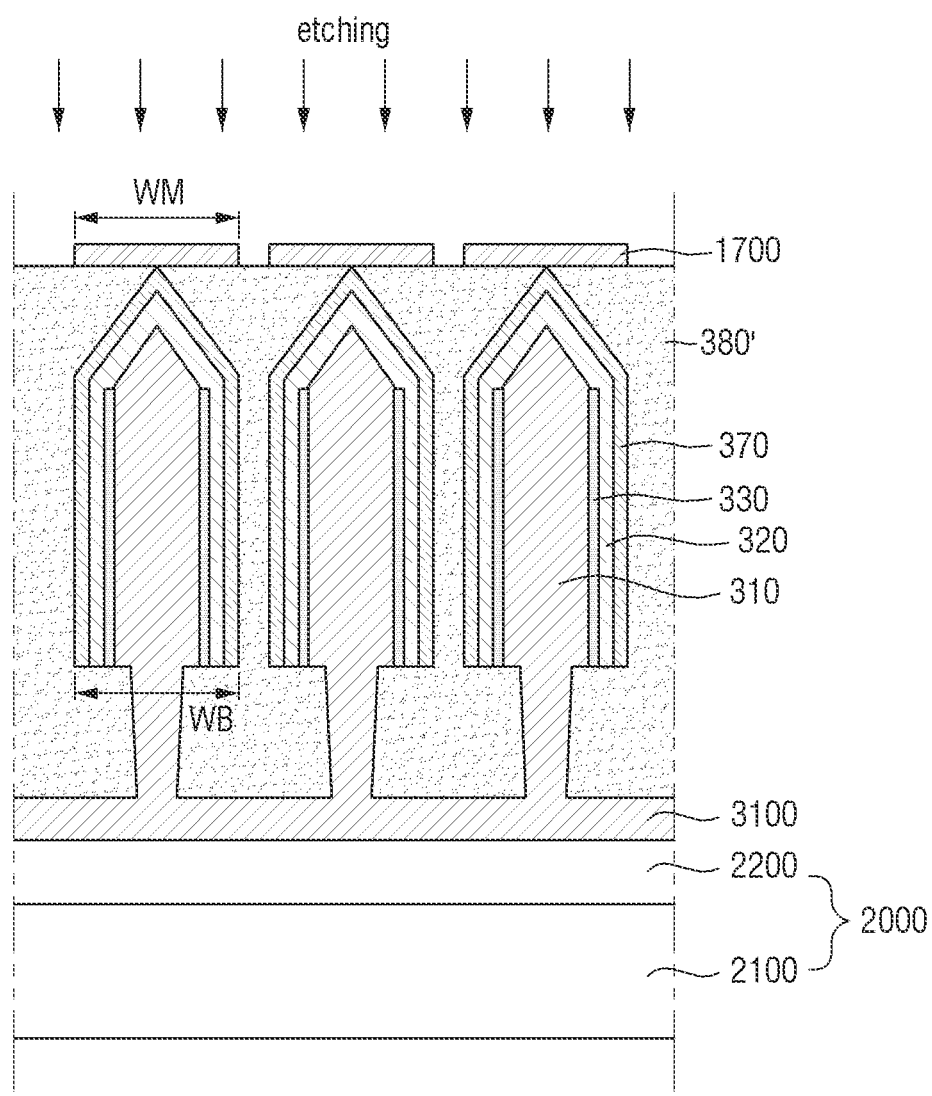
Figure 13:
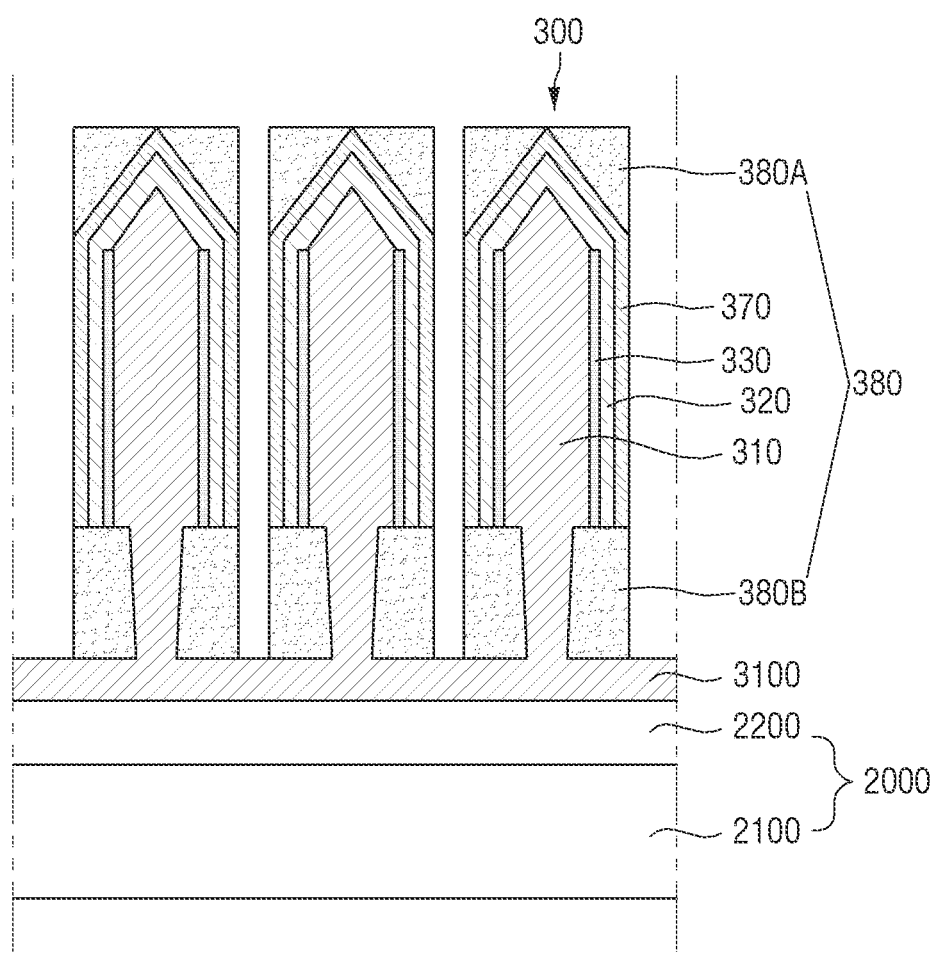

Next, referring to FIGS. 12 and 13, the insulation film 380 around (e.g., surrounding) a portion of the outer surface (e.g., the outer peripheral or circumferential surface) of the semiconductor core SC is formed. The process of forming the insulation film 380 may include forming an insulation material 380' formed to cover the plurality of semiconductor cores SC on the sub-semiconductor layer 3100, and partially etching the insulation material 380' to form the insulation film 380.

First, as shown in FIG. 12, the insulation material 380' formed to cover the plurality of semiconductor cores SC is formed on the sub-semiconductor layer 3100, and fourth mask layers 1700 are formed on the insulation material 380'. The insulation material 380' may be made of a material included in the insulation film 380. As an example, the insulation material 380' may be polyimide or the Ike as an organic insulation material. The insulation material 380' may be coated on the sub-semiconductor layer 3100 to cover the semiconductor cores SC. A height of the insulation material 380' may be substantially the same as a height of the semiconductor core SC, and the insulation film 380 formed in a subsequent process may be formed to be around (e.g., to surround) only a side surface of the first end 300B of the semiconductor core SC.

The fourth mask layers 1700 may be disposed to be spaced from each other to correspond to the locations of the semiconductor cores SC on the insulation material 380'. The fourth mask layers 1700 may be disposed to etch the insulation material 380', and as an example, the fourth mask layer 1700 may be a hard mask layer made of a material such as metal.

In one or more embodiments, a width WM of the fourth mask layer 1700 may be the same as a diameter WB of the main body 300A of the semiconductor core SC. The light-emitting element 300 is formed such that the insulation film 380 does not surround the main body 300A of the semiconductor core SC. This may be formed as the insulation material 380' surrounding the side surface of the main body 300A is removed because the width WM of the fourth mask layer 1700 is formed to be the same as the width of the main body 300A. However, the present disclosure is not limited thereto, and in one or more embodiments, the width WM of the fourth mask layer 1700 may be greater than the diameter WB of the main body 300A. In this case, the width WM of the fourth mask layer 1700 may be the same as a diameter WA of the light-emitting element 300.

Next, the insulation material 380' is etched along the fourth mask layer 1700 so that the insulation film 380 around (e.g., surrounding) a portion of the outer surface (e.g., an outer peripheral or circumferential surface) of the semiconductor core SC is formed. As shown in FIG. 13, the insulation film 380 is formed to be around (e.g., to surround inclined) or stepped both ends of the semiconductor core SC, and the insulation film 380 may not be formed on the outer surface (e.g., the outer peripheral or circumferential surface) of the main body 300A.

Figure 14:
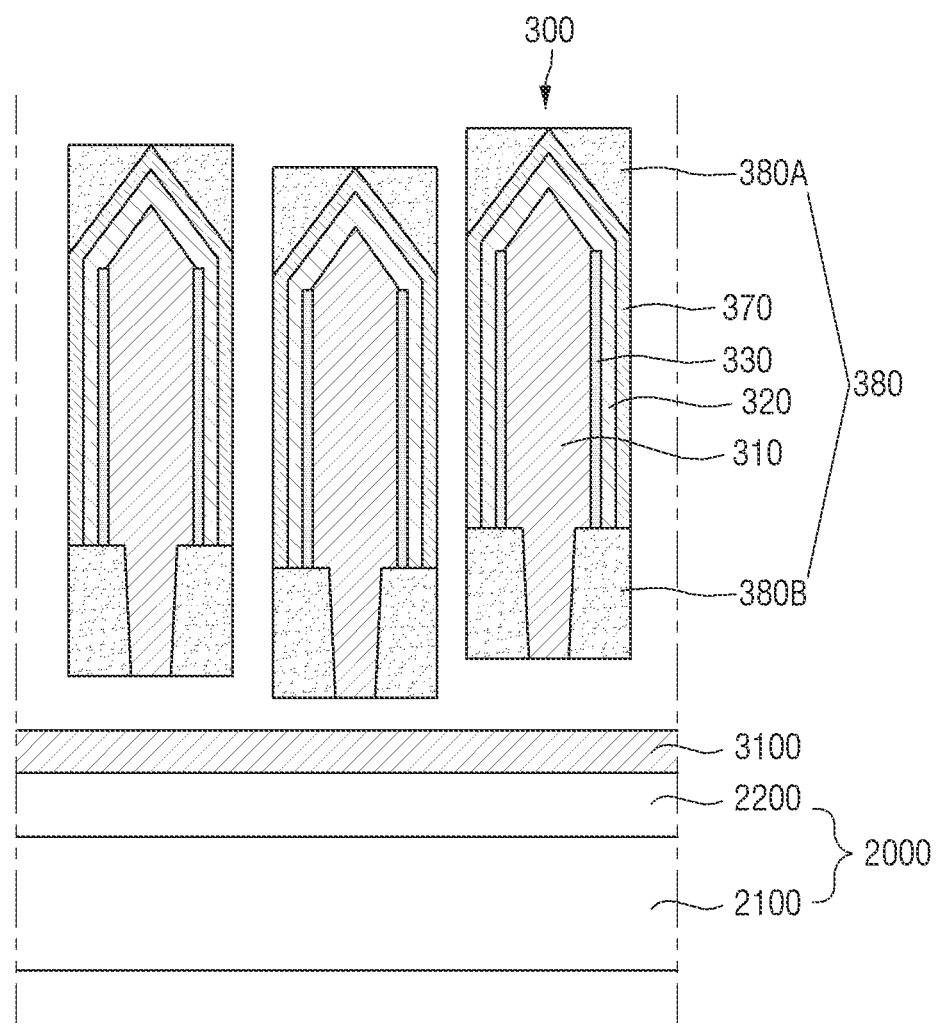

Finally, referring to FIG. 14, the semiconductor core SC on which the insulation film 380 is formed may be separated from the sub-semiconductor layer 3100, thereby manufacturing the light-emitting element 300. As an example, the process of separating the semiconductor core SC may be performed through a physical separation method. Here, because the second insulation film 380B is disposed to be around (e.g., surround) the second end 300C that is a portion at which the semiconductor core SC is connected to the sub-semiconductor layer 3100, it is possible to prevent the second end 300C or the first semiconductor layer 310 from being damaged when the semiconductor core SC is separated.

The light-emitting element 300 according to one or more embodiments may be manufactured through the above-described processes. The display device 10 may include the light-emitting element 300 disposed between the first electrode 210 and the second electrode 220. Hereinafter, a manufacturing process of the display device 10 according to one or more embodiments will be described with reference to other drawings.

FIGS. 15 to 21 are cross-sectional views illustrating a portion of a manufacturing process of the display device according to one or more embodiments.

Figure 15:
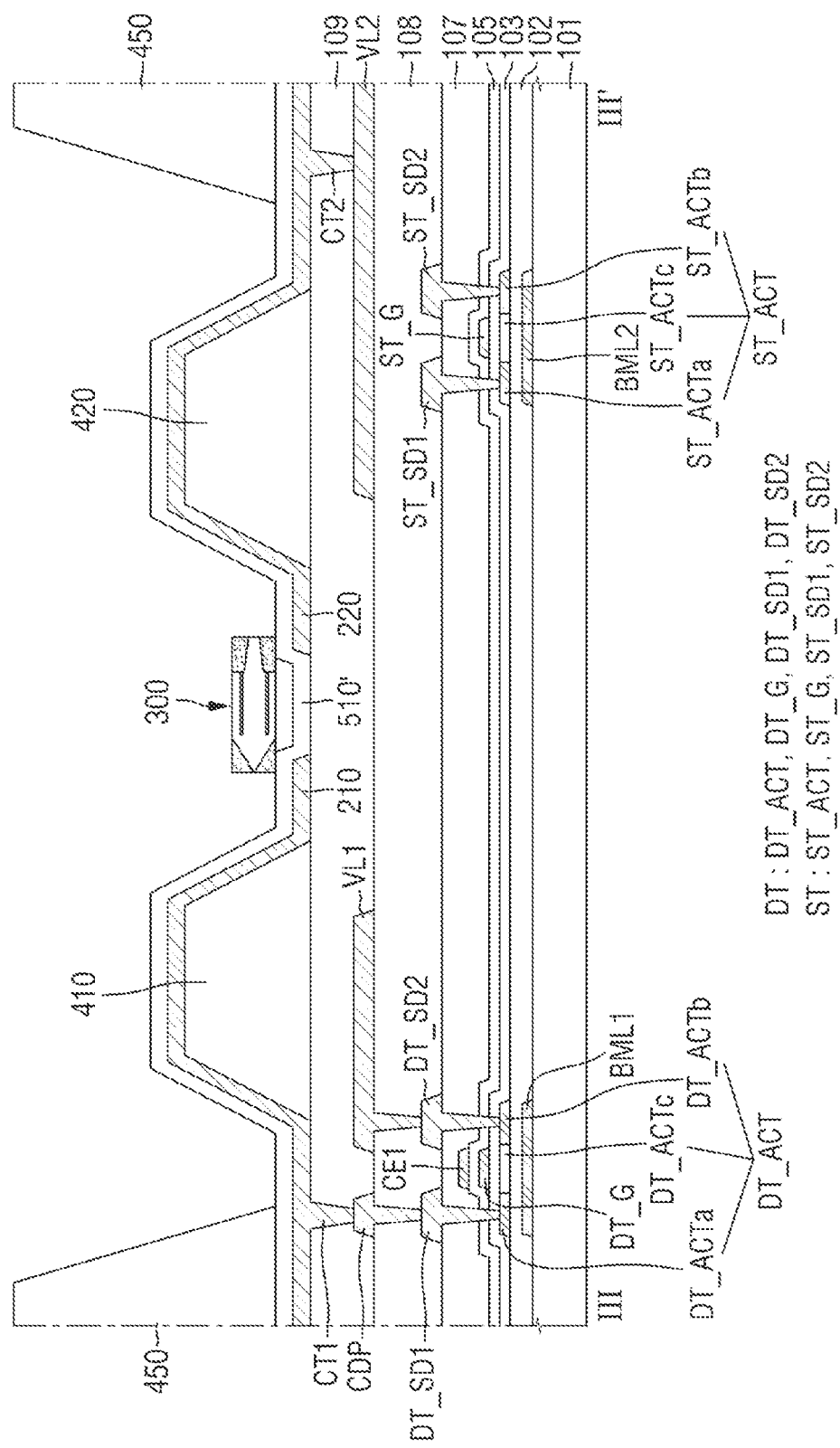
FIGS. 15 to 21 are cross-sectional views illustrating a portion of a manufacturing process of the display device according to one or more embodiments.

First, referring to FIG. 15, a first electrode 210 and a second electrode 220 are prepared, and light-emitting elements 300 are disposed between the first electrode 210 and the second electrode 220. The first electrode 210 and the second electrode 220 may be disposed on a first substrate 101. However, as shown in the drawing, a plurality of conductive layers and an insulation layer may be disposed between the first substrate 101, and the first electrode 210 and the second electrode 220. Because descriptions thereof are the same as described above, detailed descriptions thereof will be omitted.

In one or more embodiments, a first insulation material layer 510' covering the first electrode 210 and the second electrode 220 is disposed on the first electrode 210 and the second electrode 220, and an outer bank 450 is disposed on the first insulation material layer 510' The first insulation material layer 510' may expose a portion of an upper surface of each of the electrodes 210 and 220 in a subsequent process, and may form the first insulation layer 510 of FIG. 3.

The light-emitting element 300 may be disposed on the first insulation material layer 510' between the first electrode 210 and the second electrode 220. In one or more embodiments, the light-emitting elements 300 are prepared in a state of being dispersed in an ink, and may be sprayed onto the first substrate 101 by a printing process using an inkjet printing device. The light-emitting elements 300 dispersed in the ink and sprayed on the electrodes 210 and 220 may be placed between the electrodes 210 and 220 by an alignment signal applied to each of the electrodes 210 and 220. For example, when the alignment signal is applied to the first electrode 210 and the second electrode 220, an electric field may be generated in the ink sprayed above the electrodes 210 and 220. As an example, the alignment signal may be an alternating current (AC) voltage, and the AC voltage may have a voltage of +/−10 to 50 V and a frequency of 10 kHz to 1 MHz.

When the electric field is generated between the first electrode 210 and the second electrode 220, the light-emitting elements 300 dispersed in the ink may receive a dielectrophoretic force due to the electric field. The light-emitting element 300 receiving the dielectrophoretic force may be placed between the first electrode 210 and the second electrode 220 while an orientation direction and a location are changed by the dielectrophoretic force.

Figure 16:
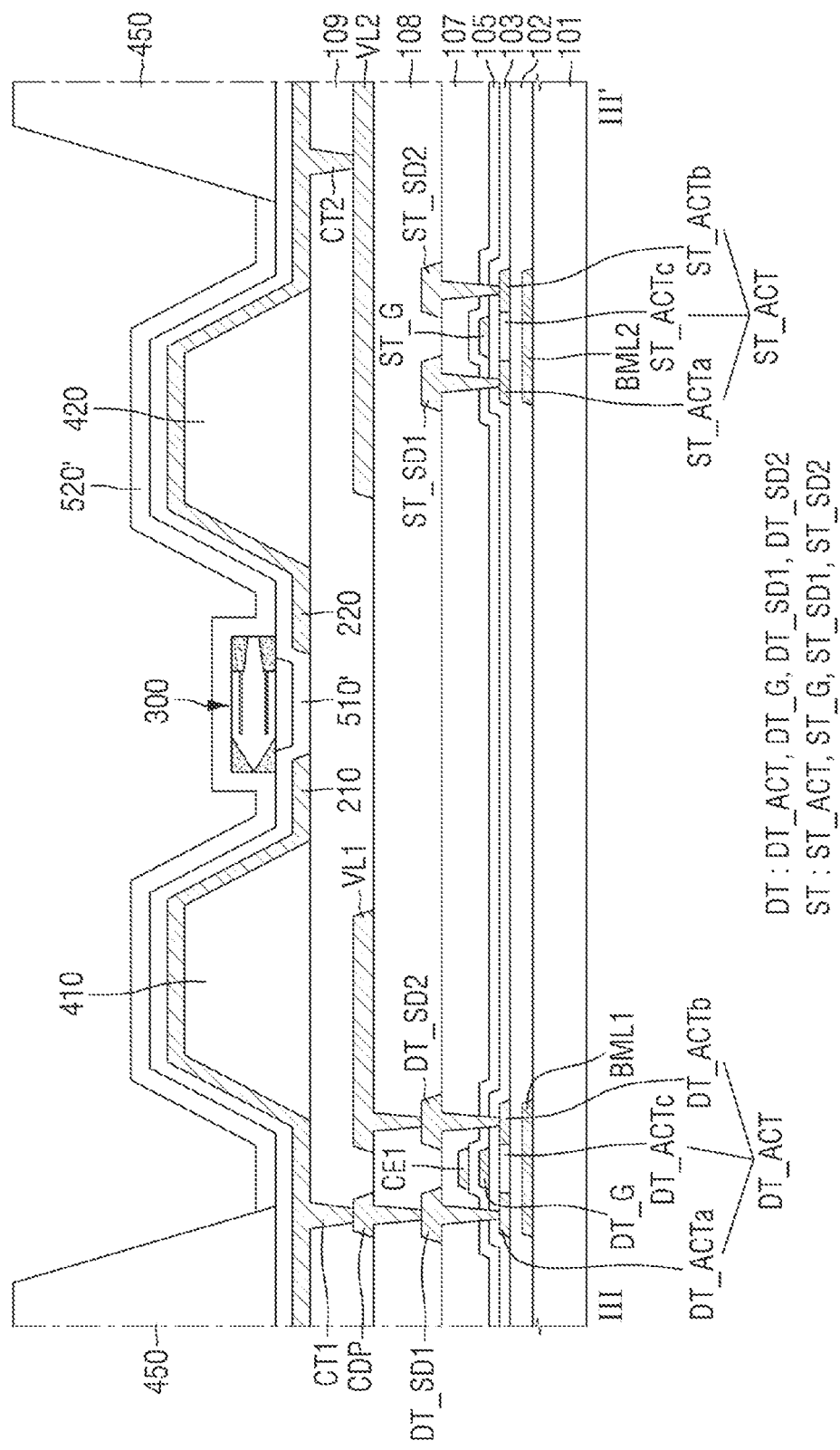

Next, referring to FIG. 16, a second insulation material layer 520' is formed on the first insulation material layer 510' and the light-emitting elements 300. The second insulation material layer 520' may fix the location of each of the light-emitting elements 300 disposed between the electrodes 210 and 220. The second insulation material layer 520' may be patterned in a subsequent process to form a second insulation layer 520.

Figure 17:
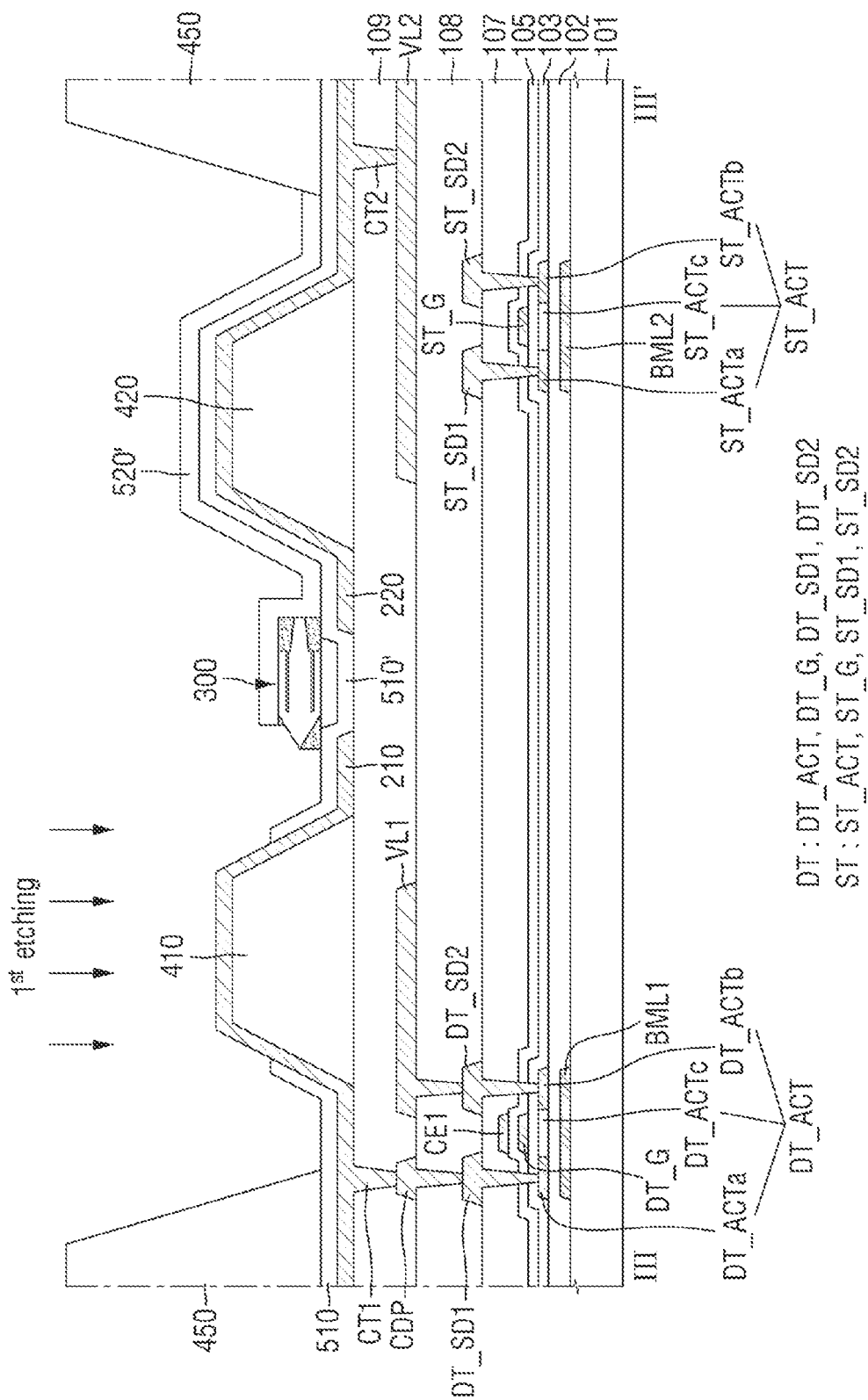

Next, referring to FIG. 17, the first insulation material layer 510' and the second insulation material layer 520' are partially patterned ("1$^{st}$ etching" in FIG. 17) to expose a portion of the upper surface of the first electrode 210 and one end of the light-emitting element 300. A portion of the first electrode 210 disposed on a first inner bank 410 may be partially exposed, and as one end of the light-emitting element 300 facing (e.g., opposing) the first electrode 210, a first end 300B of a semiconductor core SC may be exposed. Here, in the light-emitting element 300, a first insulation film 380A may be partially removed to form a first residue 380A1 and a second residue 380A2.

Figure 18:
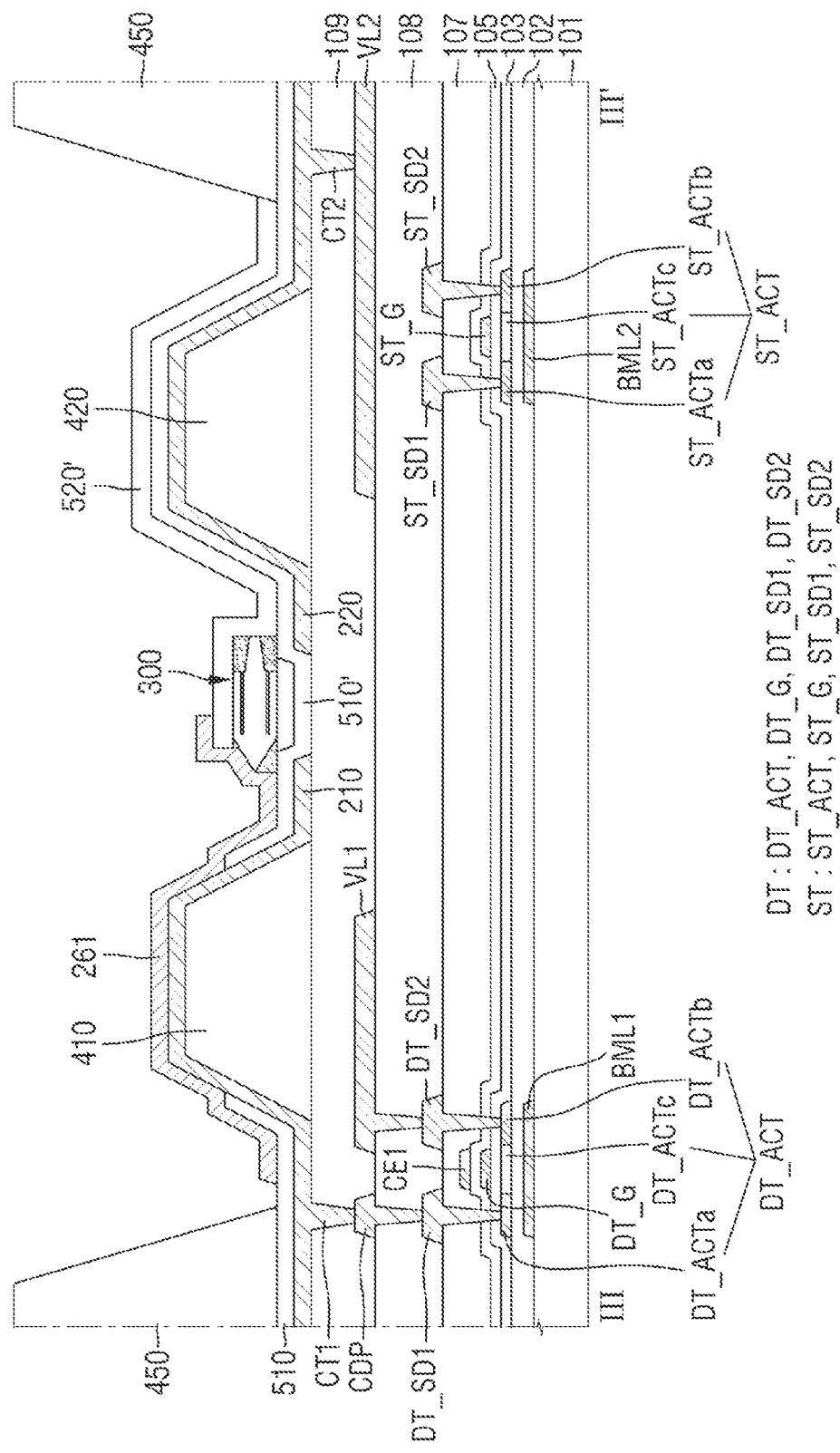

Next, referring to FIG. 18, a first contact electrode 261 in contact with the exposed first electrode 210 and the exposed one end of the light-emitting element 300 is formed. The first contact electrode 261 may be disposed to be in contact with the first insulation material layer 510', one end of the light-emitting element 300, and a portion of the second insulation material layer 520', including the exposed first electrode 210. The description of the arrangement of the first contact electrode 261 is the same as described above.

Figure 19:
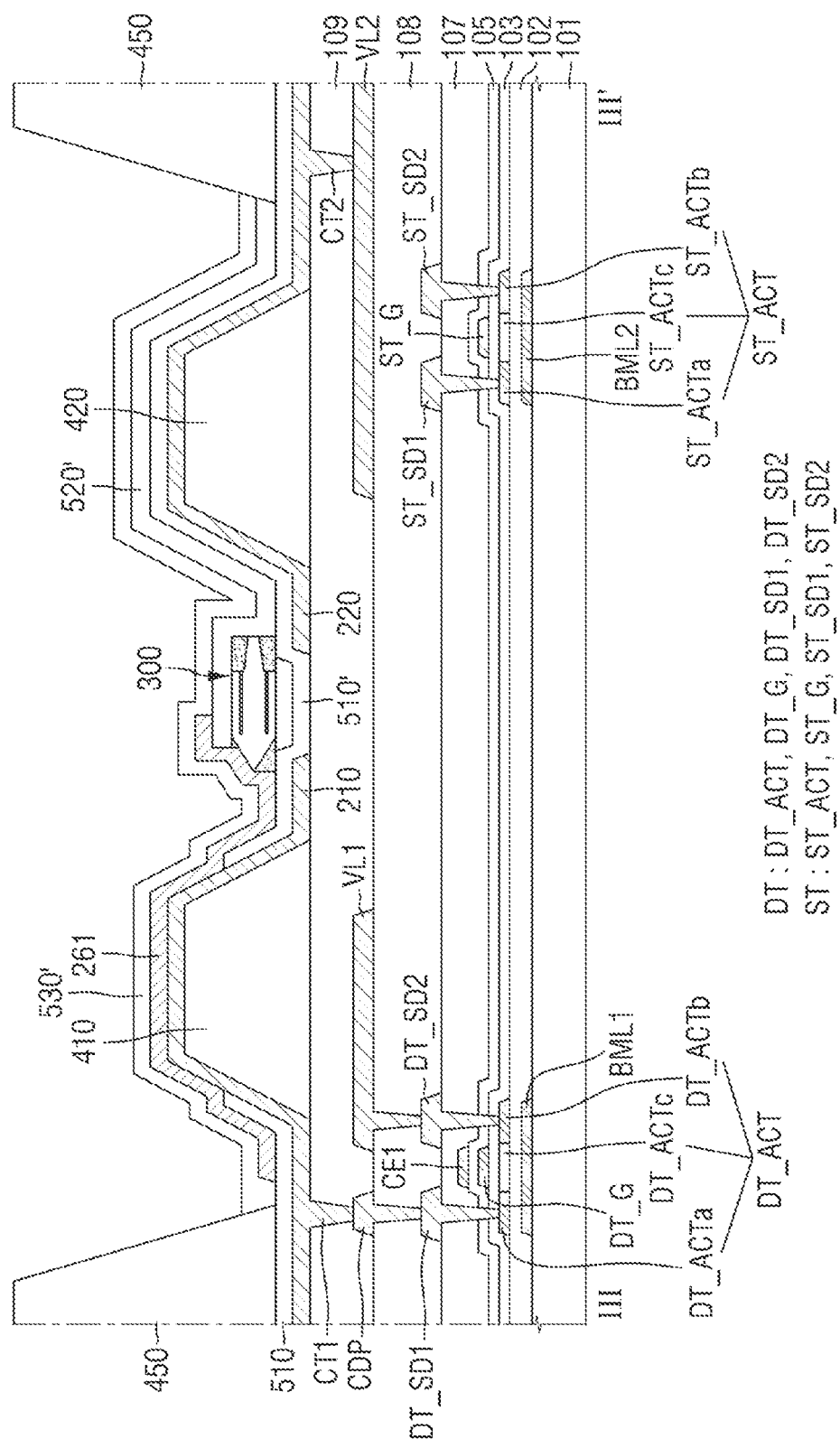

Next, referring to FIG. 19, a third insulation material layer 530' is formed on the first contact electrode 261 and the second insulation material layer 520'. The third insulation material layer 530' may be patterned in a subsequent process to form a third insulation layer 530. The third insulation material layer 530' may protect the first contact electrode 261 and concurrently (e.g., simultaneously) insulate the first contact electrode 261 from the second contact electrode 262.

Figure 20:
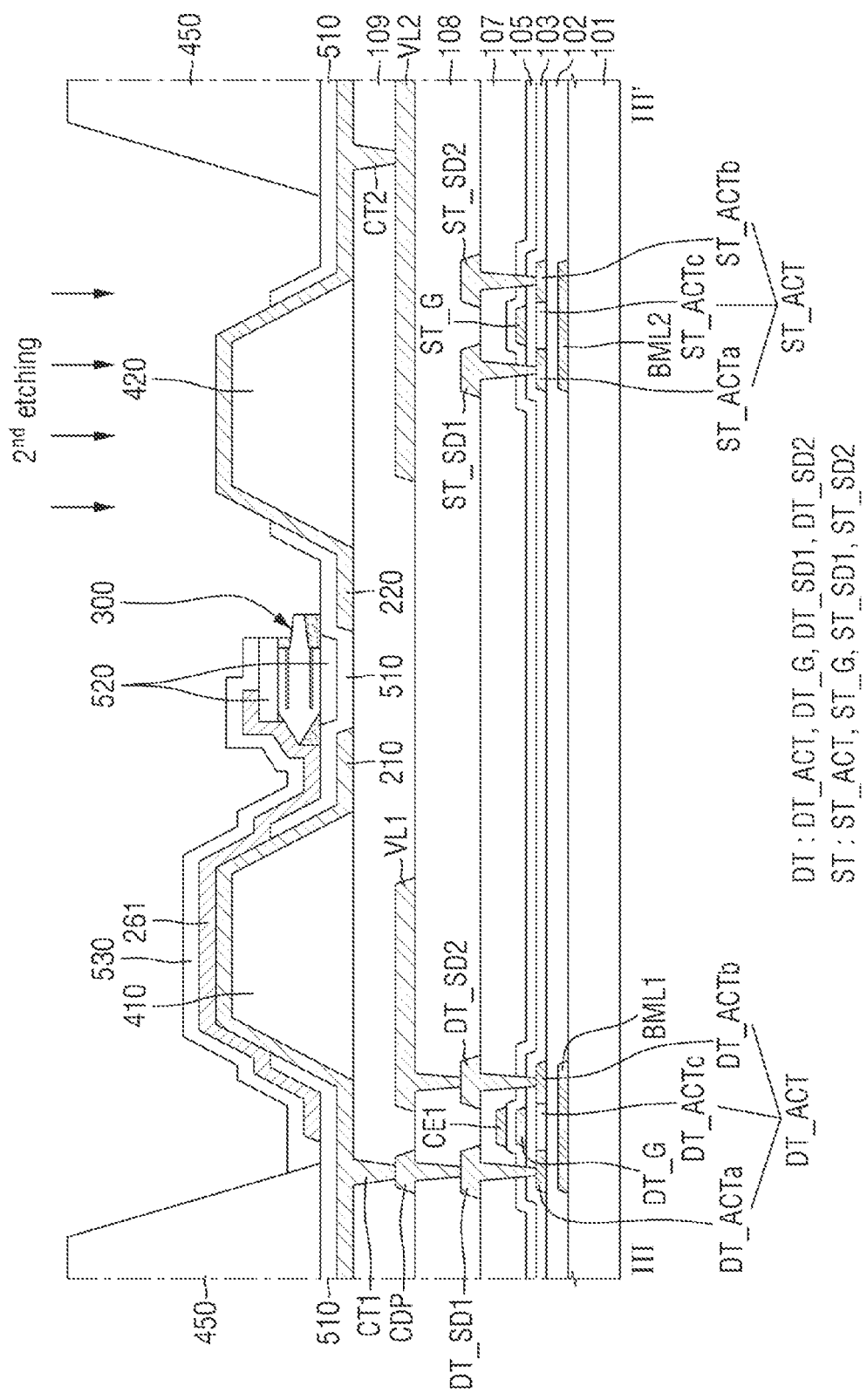

Next, referring to FIG. 20, the first insulation material layer 510', the second insulation material layer 520', and the third insulation material layer 530' are partially patterned ("$2^{nd}$ etching" in FIG. 20) to expose a portion of the upper surface of the second electrode 220 and the other end of the light-emitting element 300. A portion of the second electrode 220 disposed on a second inner bank 420 may be partially exposed, and as the other end of the light-emitting element 300 facing (e.g., opposing) the second electrode 220, the second end 300C of the semiconductor core SC may be exposed. Here, in the light-emitting element 300, the second insulation film 380B may be partially removed to form a third residue 380B1 and a fourth residue 380B2. In addition, the first insulation material layer 510', the second insulation material layer 520', and the third insulation material layer 530' may form the first insulation layer 510, the second insulation layer 520, and the third insulation layer 530, respectively.

Figure 21:
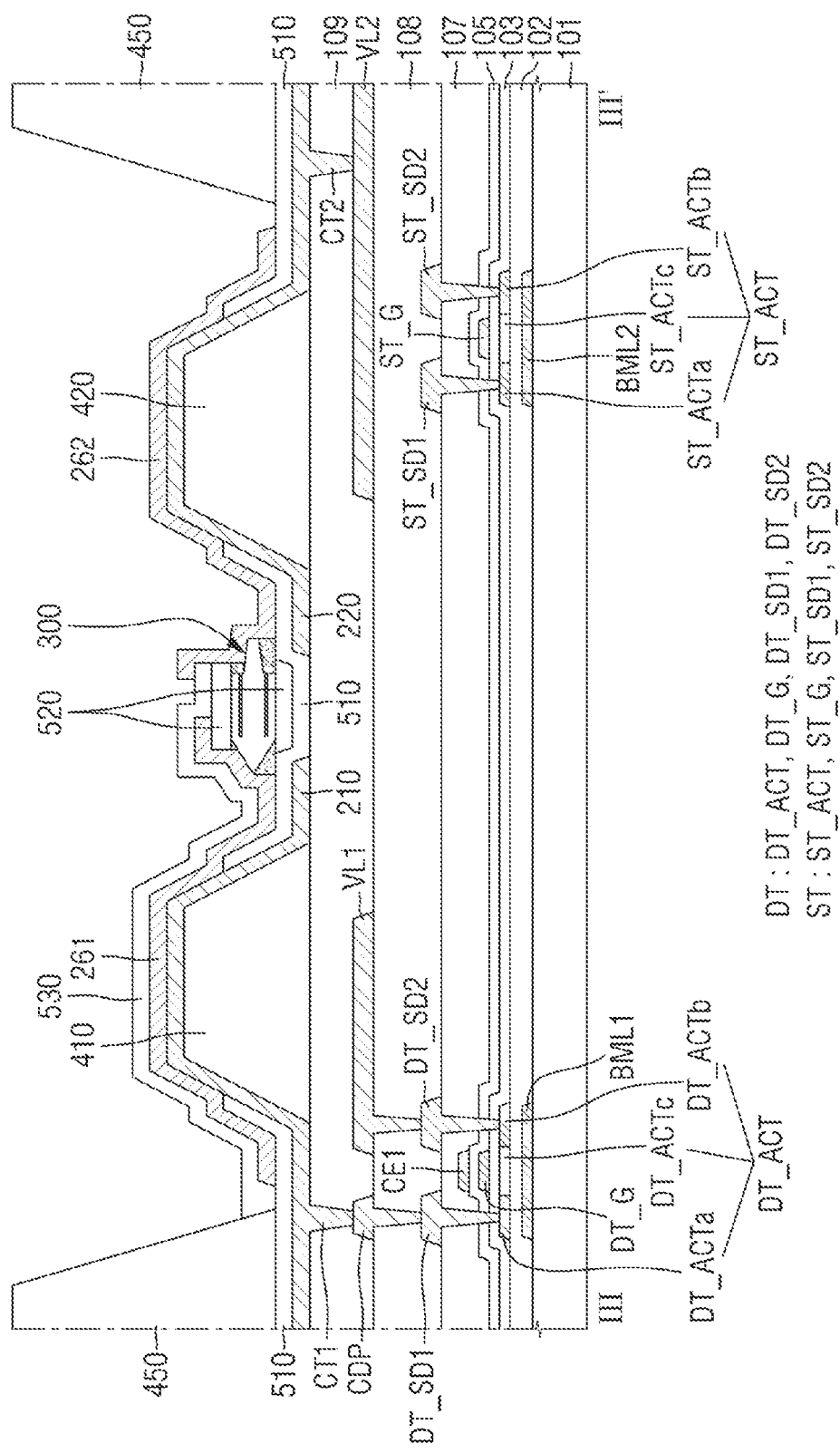

Next, referring to FIG. 21, a second contact electrode 262 in contact with the exposed second electrode 220 and the exposed other end of the light-emitting element 300 is formed. The second contact electrode 262 may be disposed to be in contact with the first insulation layer 510, the other end of the light-emitting element 300, the second insulation layer 520, and a portion of the third insulation layer 530, including the exposed second electrode 220. The description of the arrangement of the second contact electrode 262 is the same as described above.

Last, although not shown in the drawing, a fourth insulation layer 550 is formed thereon, covering the second contact electrode 262 and the third insulation layer 530. The display device 10 according to one or more embodiments can be manufactured through the above-described processes.

Hereinafter, various embodiments of the light-emitting element 300 and the display device 10 according to one or more embodiments will be described.

Figure 22:
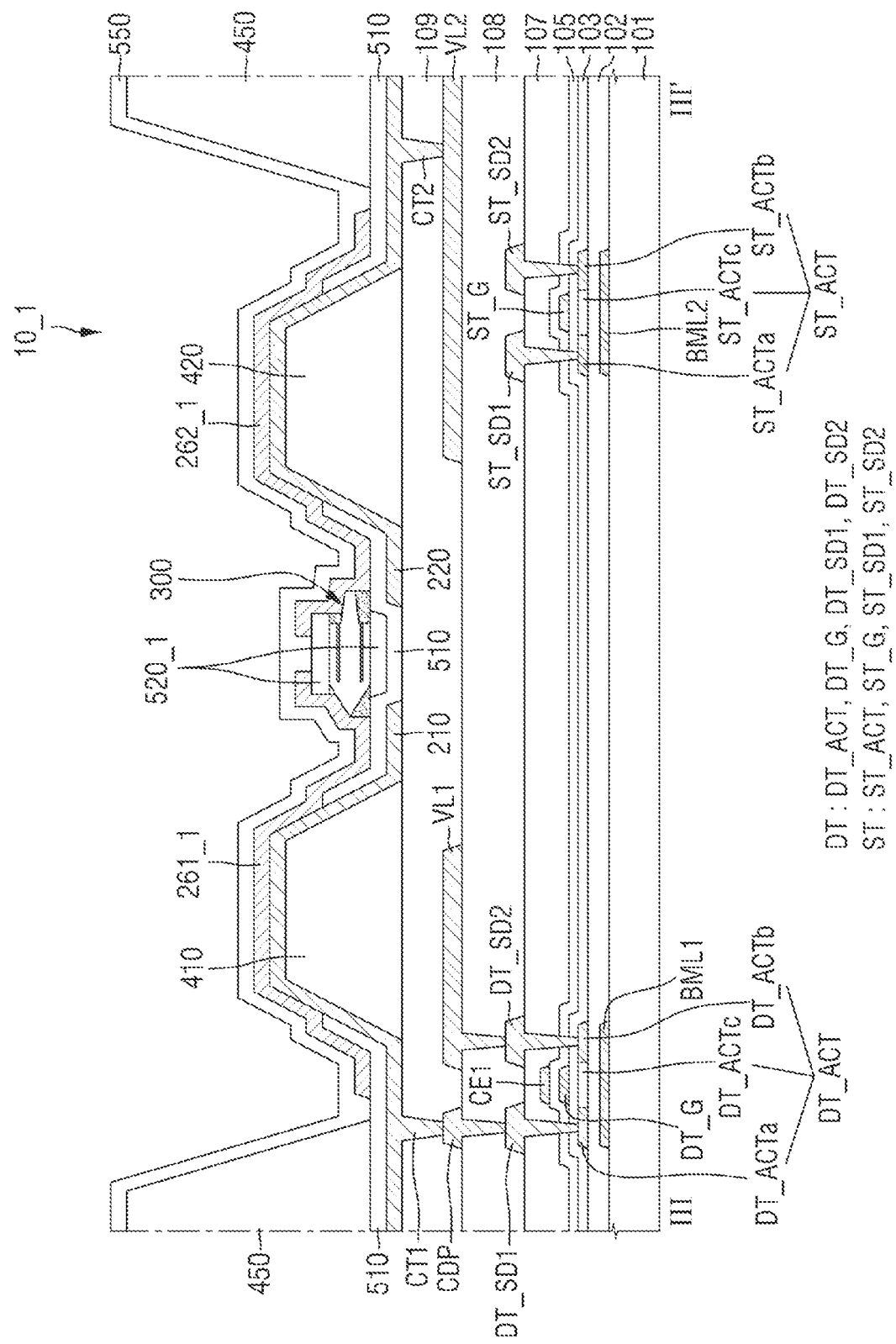
FIG. 22 is a cross-sectional view illustrating a portion of a display device according to one or more embodiments.

FIG. 22 is a cross-sectional view illustrating a portion of a display device according to one or more embodiments.

Referring to FIG. 22, in a display device 10_1 according to one or more embodiments, a third insulation layer 530 may be omitted. The display device 10_1 of FIG. 22 is different from that of embodiment of FIG. 3 in that the third insulation layer 530 is omitted. Hereinafter, repeated descriptions will be omitted, and descriptions will be provided based on differences from the above-described contents.

In the display device 10_1 according to one or more embodiments, the third insulation layer 530 is omitted, and a portion of a second contact electrode 262_1 may be disposed directly on a second insulation layer 520_1. A first contact electrode 261_1 and the second contact electrode 262_1 may be disposed to be spaced from each other on a second insulation layer 520_1. For example, a side surface of the first contact electrode 261_1 and a side surface of the second contact electrode 262_1, which are spaced from each other and face (e.g., oppose) each other, may be disposed on the second insulation layer 520_1. The first contact electrode 261_1 may be in contact with one end of a light-emitting element 300, a first electrode 210, and the second insulation layer 520_1, and the second contact electrode 262_1 may be in contact with the other end of the light-emitting element 300, a second electrode 220, and the second insulation layer 52_1.

According to one or more embodiments, the second insulation layer 520_1 may include an organic insulation material, and the first contact electrode 261_1 and the second contact electrode 262_1 may be formed together in the same process.

Figure 23:
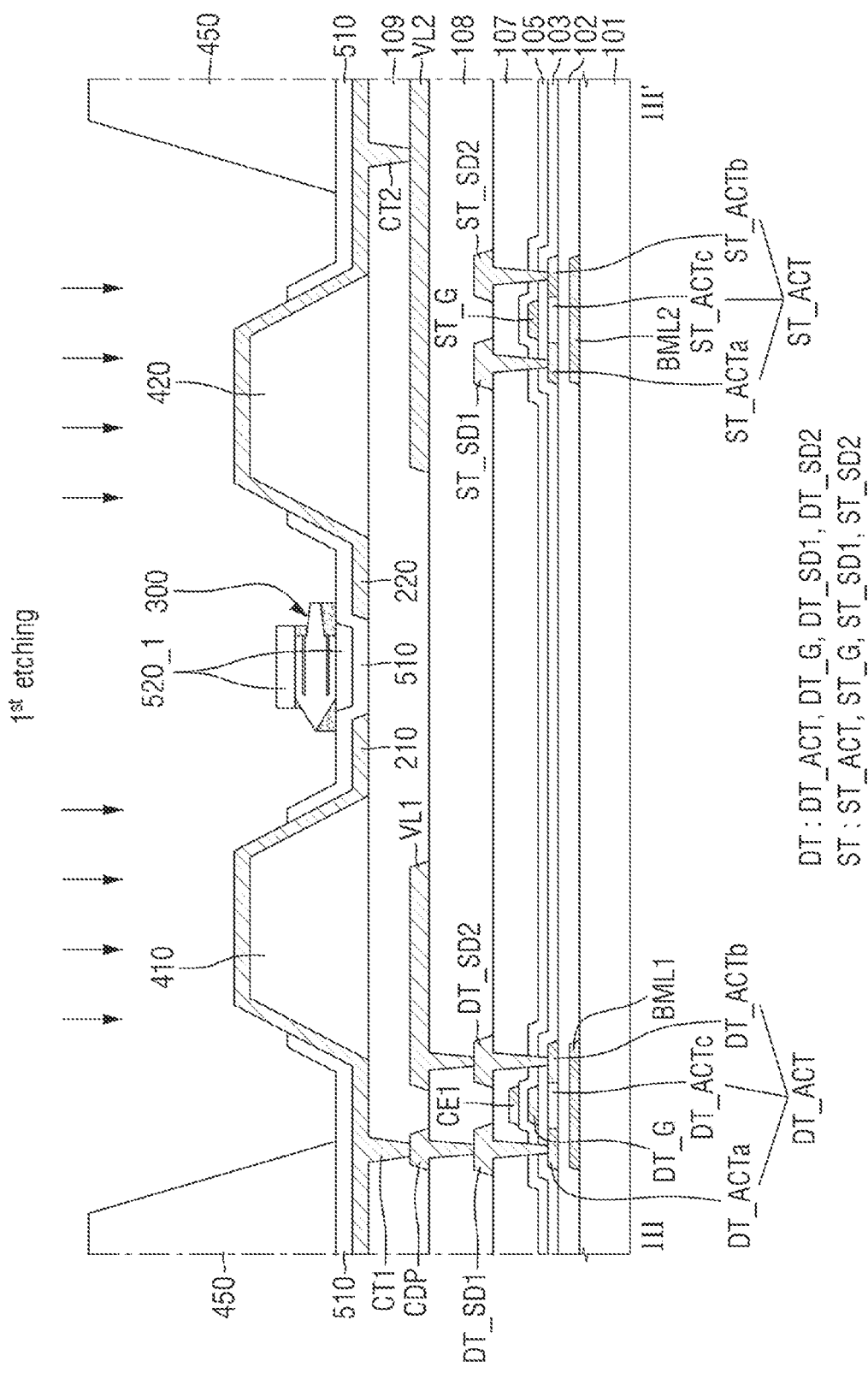
FIG. 23 is a cross-sectional view illustrating a portion of a manufacturing process of the display device of FIG. 22.

FIG. 23 is a cross-sectional view illustrating a portion of a manufacturing process of the display device of FIG. 22.

Referring to FIG. 23, a process of forming a second insulation material layer 520' configured to fix the light-emitting element 300 and then partially patterning a first insulation material layer 510' and the second insulation material layer 520' may be performed during the manufacturing process of the display device 10_1. Here, the first insulation material layer 510' and the second insulation material layer 520' may be patterned so that a portion of an upper surface of each of a first electrode 210 and a second electrode 220 is concurrently (e.g., simultaneously) exposed ("$1^{st}$ etching" in FIG. 23), and subsequently, the first contact electrode 261_1 and the second contact electrode 262_1 may be formed in the same process. At this point, a portion of each of a first insulation film 380A and a second insulation film 380B of the light-emitting element 300 may be concurrently (e.g., simultaneously) removed. Other descriptions may be the same as those described above, and thus, a detailed description thereof will be omitted.

In one or more embodiments, when the second insulation layer 520 includes an organic insulation material, the second insulation material layer 520' located between both ends of the light-emitting element 300 and the first electrode 210 and the second electrode 220 may not be removed in the process of exposing both ends of the light-emitting element 300. The display device 10 according to one or more embodiments may further include portions of the second insulation layer 520 disposed between both ends of the light-emitting element 300 and the electrodes 210 and 220.

Figure 24:
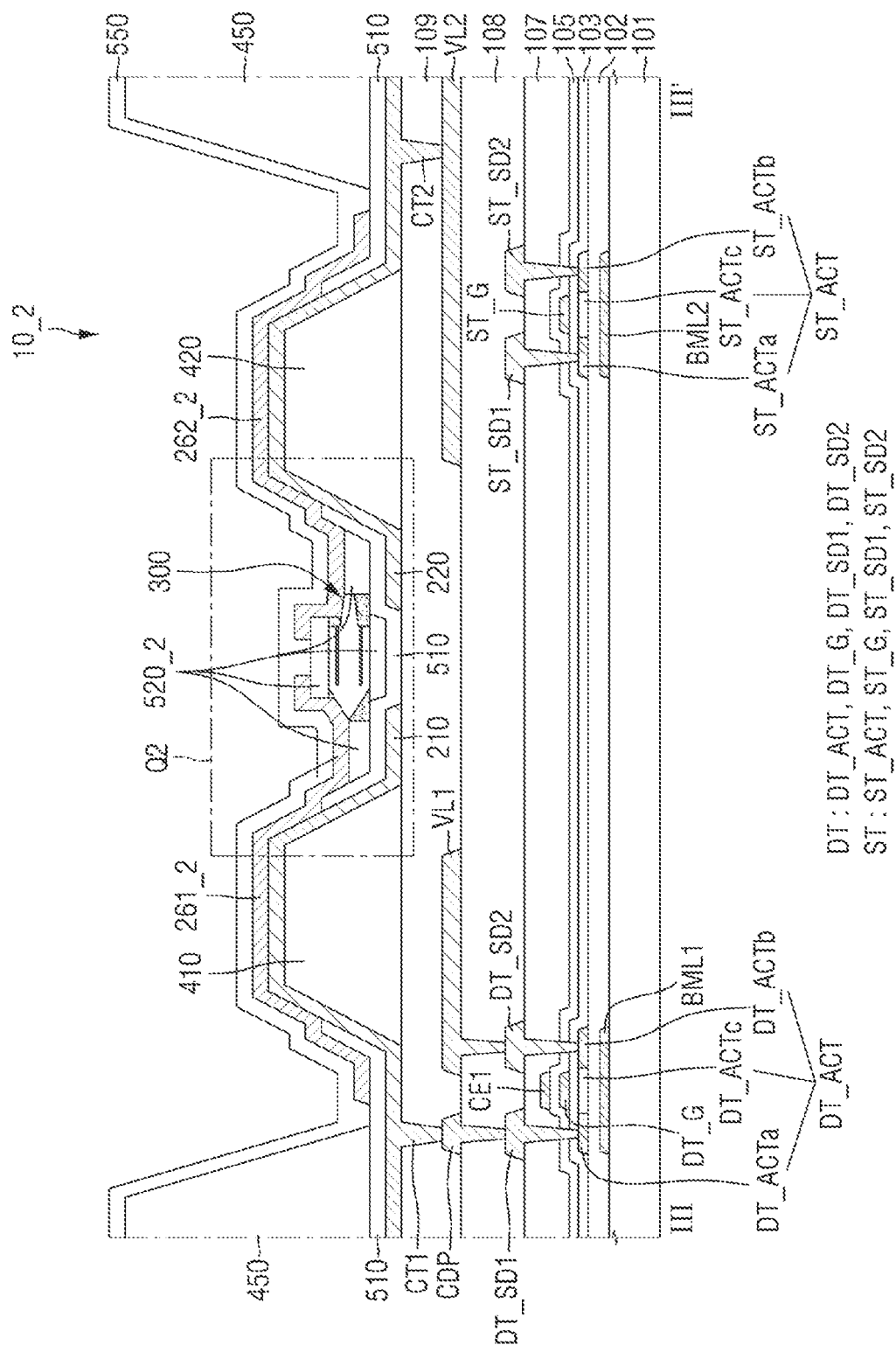
FIG. 24 is a cross-sectional view illustrating a portion of a display device according to one or more embodiments.
Figure 25:
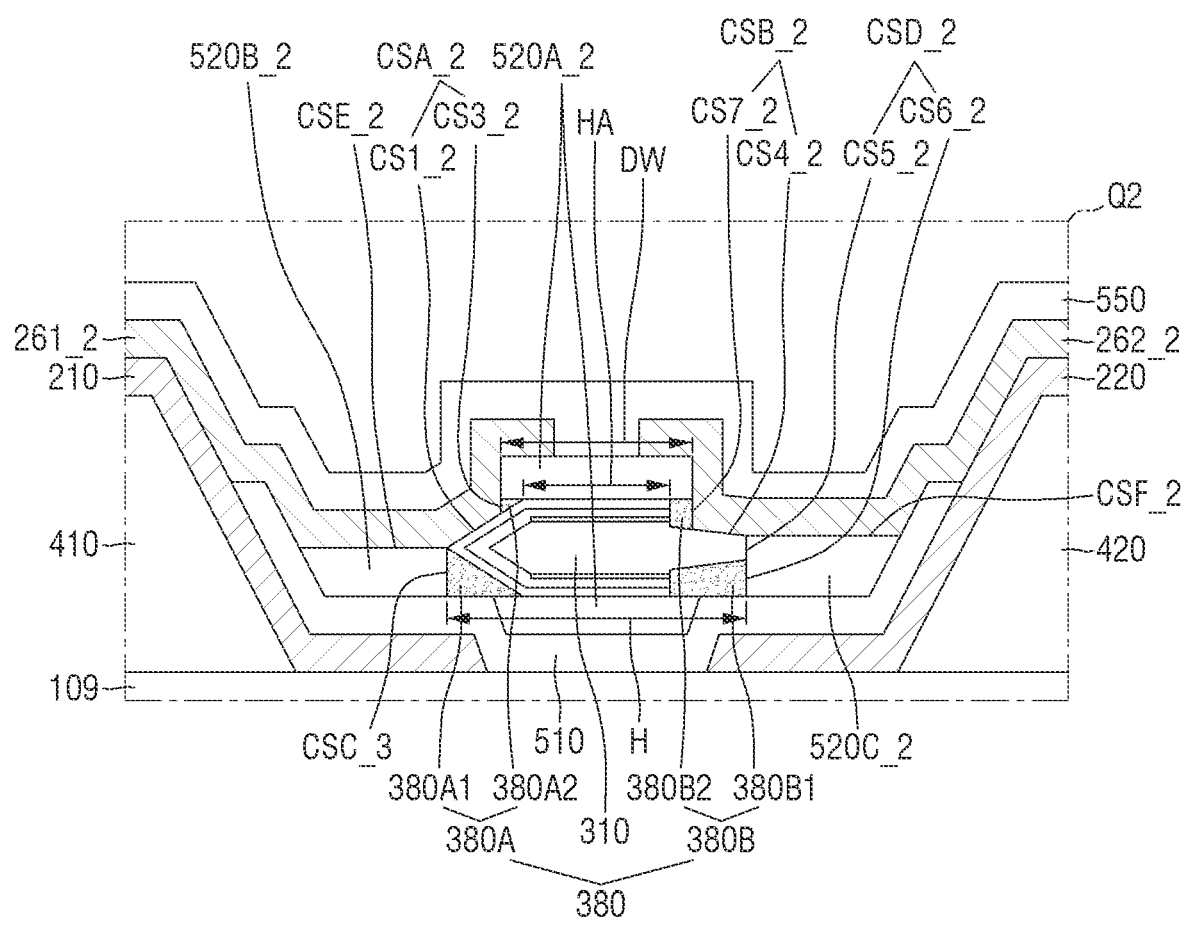
FIG. 25 is an enlarged view of portion Q2 of FIG. 24.

FIG. 24 is a cross-sectional view illustrating a portion of a display device according to one or more embodiments. FIG. 25 is an enlarged view of portion Q2 of FIG. 24.

Referring to FIGS. 24 and 25, in a display device 10_2 according to one or more embodiments, a second insulation layer 520_2 may further include portions disposed between both ends of a light-emitting element 300 and a first electrode 210 and a second electrode 220 to be partially in contact with both ends of the light-emitting element 300. The display device 10_2 of FIG. 24 is different from that of the embodiment of FIG. 22 in that the shape of the second insulation layer 520_2 is different. Hereinafter, repeated descriptions will be omitted, and descriptions will be provided based on differences from the above-described contents.

The second insulation layer 520_2 may further include portions disposed between both ends of the light-emitting element 300 and the electrodes 210 and 220, in addition to a portion around (e.g., surrounding) a side surface of the light-emitting element 300, for example, an exposed main body 300A of a semiconductor core Sc. According to one or more embodiments, the second insulation layer 520_2 may include a first insulation pattern 520A_2 disposed to cover an outer surface (e.g., an outer peripheral or circumferential surface) of the light-emitting element 300, a second insulation pattern 520B_2 that is in contact with one end of the light-emitting element 300 and disposed between the first electrode 210 and the light-emitting element 300, and a third insulation pattern 520C_2 that is in contact with the other end of the light-emitting element 300 and disposed between the second electrode 220 and the light-emitting element 300.

The first insulation pattern 520A_2 may have substantially the same shape as the second insulation layer 520_1 of FIG. 22. The first insulation pattern 520A_2 may be disposed to be around (e.g., surround) a portion of the outer surface (e.g., an outer peripheral or circumferential surface) of the light-emitting element 300, and may have a pattern shape extending in the second direction DR2 in each sub-pixel PXn. A description thereof will be omitted.

The second insulation pattern 5208_2 and the third insulation pattern 520C_2 include the same material as the first insulation pattern 520A_2, and may be disposed between the light-emitting element 300 and the electrodes 210 and 220. The second insulation pattern 520B_2 and the third insulation pattern 520C_2 may each have a pattern shape extending in the second direction DR2 in each sub-pixel PXn, like the first insulation pattern 520A_2.

As shown in FIG. 23, after disposing the light-emitting element 300, a second insulation material layer 520_1 configured to fix the light-emitting element 300 may be patterned such that both ends of the light-emitting element 300 are completely exposed. However, the present disclosure is not limited thereto, and when the second insulation material layer 52_1 is patterned to expose only a portion of both ends of the light-emitting element 300, portions disposed between both ends of the light-emitting element 300 and the electrodes 210 and 220 may be left without being removed.

For example, in one end of the light-emitting element 300 facing (e.g., opposing) the first electrode 210, a first end 300B of the semiconductor core SC may be exposed. A portion of the first insulation film 380A of the light-emitting element 300 may be partially removed to form a first residue 380A1 and a second residue 380A2. However, a portion of the second insulation material layer 520_2 disposed between one end of the light-emitting element 300 and the first electrode 210 may not be removed and may be left as the second insulation pattern 520B_2, and an upper surface or a cross-sectional side surface of the first residue 380A1 may not be exposed. Accordingly, in the light-emitting element 300 according to one or more embodiments, the first residue 380A1 may be in direct contact with the second insulation pattern 5208_2 of the second insulation layer 520_2 to form a third contact surface CSC_3. The third contact surface CSC_3 may be the second surface CS2 (see FIG. 6) forming the first residue 380A1.

Similarly, in the other end of the light-emitting element 300 facing the second electrode 220, a second end 300C of the semiconductor core SC may be exposed. A portion of the second insulation film 380B of the light-emitting element 300 may be partially removed to form a third residue 38081 and a fourth residue 380B2. However, a portion of the second insulation material layer 520_2 disposed between the other end of the light-emitting element 300 and the second electrode 220 may not be removed and may be left as the third insulation pattern 520_2, and a lower surface of a first semiconductor layer 310, which is a lower surface of the second end 300C, and a lower surface or a cross-sectional side surface of the third residue 380B1 may not be exposed. Accordingly, in the light-emitting element 300 according to one or more embodiments, the second end 300C and the third residue 38081 may be in direct contact with the third insulation pattern 520C_2 of the second insulation layer 520_2 to form a fourth contact surface CSD_2. The fourth contact surface CSD_2 may include a fifth surface CS5_2 formed by the second end 300C of the semiconductor core SC and a sixth surface CS6_2 formed by the third residue 38081 of the second insulation film 380B.

A first contact surface CSA_2 (e.g., CS1_2, CS3_2) formed by contacting one end of the light-emitting element 300 and a first contact electrode 261_2 may not include the second surface CS1_2 formed by the first contact electrode 261_2 and the first residue 380A1. In addition, a second contact surface CSB_2 (e.g., CS7_2, CS4_2) formed by contacting the other end of the light-emitting element 300 and a second contact electrode 262_2 may not include the fifth surface CS5_2 and the sixth surface CS6_2 formed by the second contact electrode 262_2 and the lower surface of the second end 300C and the third residue 380C1.

In one or more embodiments, the first contact electrode 261_2 and the second contact electrode 262_2 may not be in contact with the first residue 380A1 and the third residue 380B1 but may be in contact with the second insulation pattern 520B_2 and the third insulation pattern 520C_2, respectively. According to one or more embodiments, the first contact electrode 261_2 may be in contact with the second insulation pattern 520B_2 to form a fifth contact surface CSE_2, and the second contact electrode 262_2 may be in contact with the third insulation pattern 520C_2 to form a sixth contact surface CSF_2. The fifth contact surface CSE_2 and the sixth contact surface CSF_2 may form a surface parallel to an upper surface of the first substrate 101.

The second insulation pattern 520B_2 and the third insulation pattern 520C_2 may compensate for a step difference between the light-emitting element 300 and the first insulation layer 510. Because the second insulation pattern 520B_2 and the third insulation pattern 520C_2 are disposed between both ends of the light-emitting element 300 and the electrodes 210 and 220, respectively, a height between an upper surface of the first insulation pattern 520A_2 and an upper surface of each of the second insulation pattern 520B_2 and the third insulation pattern 520C_2 may be reduced. This may reduce a step difference between portions covered by the first contact electrode 261_2 and the second contact electrode 262_2 and more effectively prevent disconnection of materials forming the contact electrodes 261_2 and 262_2.

Figure 26:
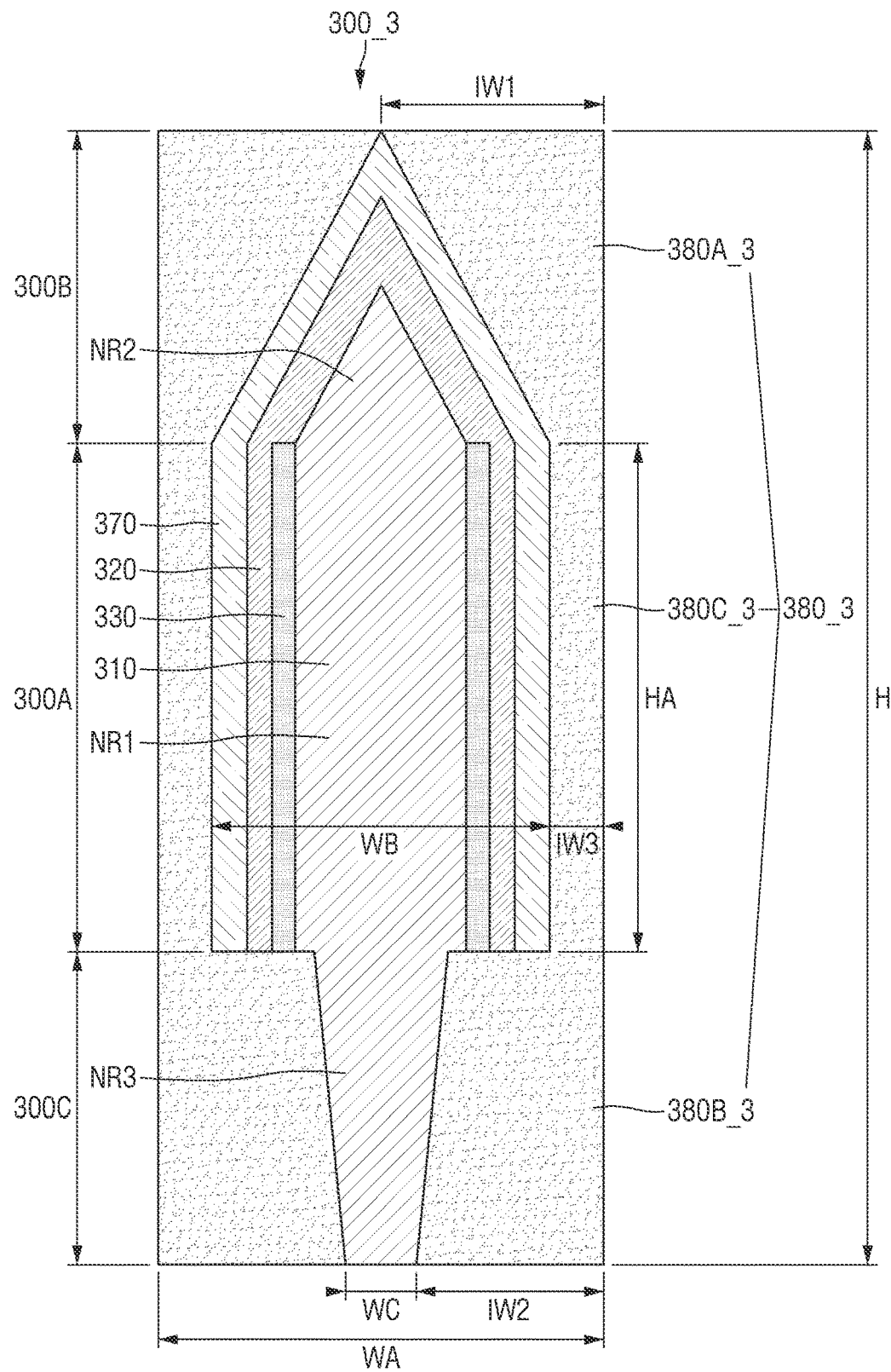
FIG. 26 is a schematic cross-sectional view of a light-emitting element according to one or more embodiments.

FIG. 26 is a schematic cross-sectional view of a light-emitting element according to one or more embodiments.

Referring to FIG. 26, in a light-emitting element 300_3 according to one or more embodiments, an insulation film 380_3 may further include a portion around (e.g., surrounding) an outer surface (e.g., an outer peripheral or circumferential surface) of a main body 300A of a semiconductor core SC. In the light-emitting element 300_3, the insulation film 380_3 may be formed to have a greater thickness or diameter and thus surround the outer surface (e.g., an outer peripheral or circumferential surface) of the main body 300A of the semiconductor core SC. The light-emitting element 300_3 of FIG. 26 is different from that of the embodiment of FIG. 5 in that the shape of the insulation film 380_3 is different. Hereinafter, repeated descriptions will be omitted, and descriptions will be provided based on differences from the above-described contents.

In the light-emitting element 300_3 according to one or more embodiments, the insulation film 380_3 may further include a third insulation film 380C_3 surrounding the outer surface (e.g. an outer peripheral or circumferential surface) of the main body 300A of the semiconductor core SC in addition to a first insulation film 380A_3 and a second insulation film 380B_3. In the light-emitting element 300_3 of the present embodiment, the insulation film 380_3 may be disposed to be around (e.g., to surround) the entire side surface of the semiconductor core SC. The first insulation film 380A_3, the second insulation film 380B_3 and the third insulation film 380C_3 may be integrated with each other to form a substantially single insulation film 380_3, and may refer to portions of the semiconductor core SC according to the location of the semiconductor core SC.

The first insulation film 380A_3 and the second insulation film 380B_3 may each have a shape similar to that of the light-emitting element 300 of FIG. 5. The first insulation film 380A_3 may be around (e.g., may surround) a first end 300B of the semiconductor core SC, and the second insulation film 380B_3 may be around (e.g., may surround) a second end 300C of the semiconductor core SC. However, a cross-sectional outer surface of each of the first insulation film 380A_3, the second insulation film 380B_3, and the third insulation film 380C_3 may be collinear so that the light-emitting element 300_3 has a constant diameter and has a flat cross-sectional surface formed thereon. That is, a maximum thickness IW1 of the first insulation film 380A_3 and a maximum thickness IW2 of the second insulation film 380B_3 may be increased than those of the embodiment of FIG. 5.

The third insulation film 380C_3 may have a constant thickness IW3 and may be around (e.g., may surround) the outer surface (e.g. an outer peripheral or circumferential surface) of the main body 300A. Unlike the first insulation film 380A_3 and the second insulation film 380B_3, the outer surface of the main body 300A is not inclined so that the third insulation film 380C_3 may have a constant thickness. During a manufacturing process of the light-emitting element 300_3, the light-emitting element 300_3 may be manufactured by adjusting a width of a fourth mask layer 1700 and a separation distance between the semiconductor cores SC formed on a sub-semiconductor layer 3100.

Figure 27:
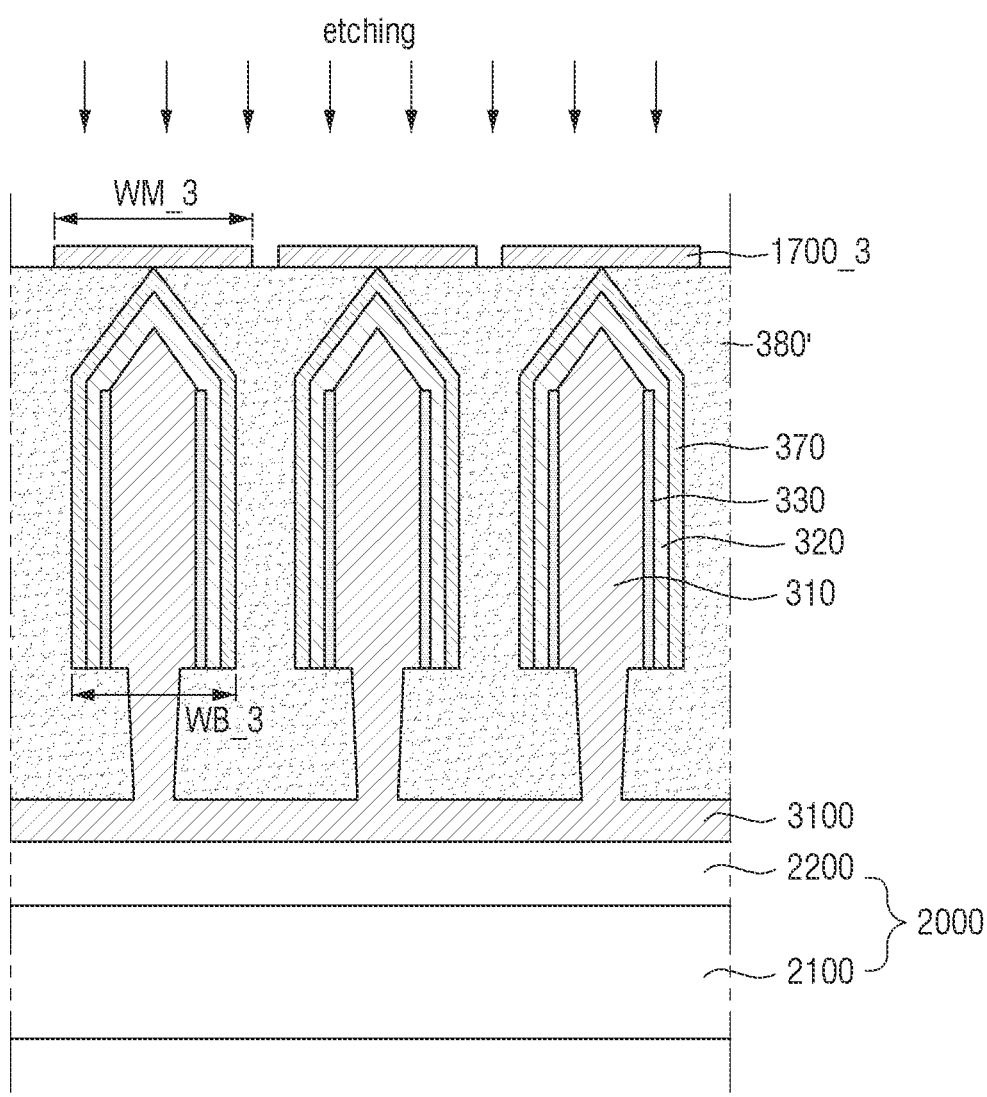
FIG. 27 is a cross-sectional view illustrating a portion of a manufacturing process of the light-emitting element of FIG. 26.

FIG. 27 is a cross-sectional view illustrating a portion of a manufacturing process of the light-emitting element of FIG. 26.

Referring to FIG. 27, according to one or more embodiments, during a manufacturing process of the light-emitting element 300_3, a width WM_3 of a fourth mask layer 1700_3 may be greater than a width WB_3 of the main body 300A of the semiconductor core SC in a process of etching an insulation material 380' covering the semiconductor core SC. Accordingly, a portion of the insulation material 380' may remain on an outer surface (e.g., an outer peripheral or circumferential surface) of the main body 300A of the semiconductor core SC to form the third insulation film 380C_3. In the case of the present embodiment, the separation distance between the semiconductor cores SC may be greater than that of the embodiment of FIG. 12.

Figure 28:
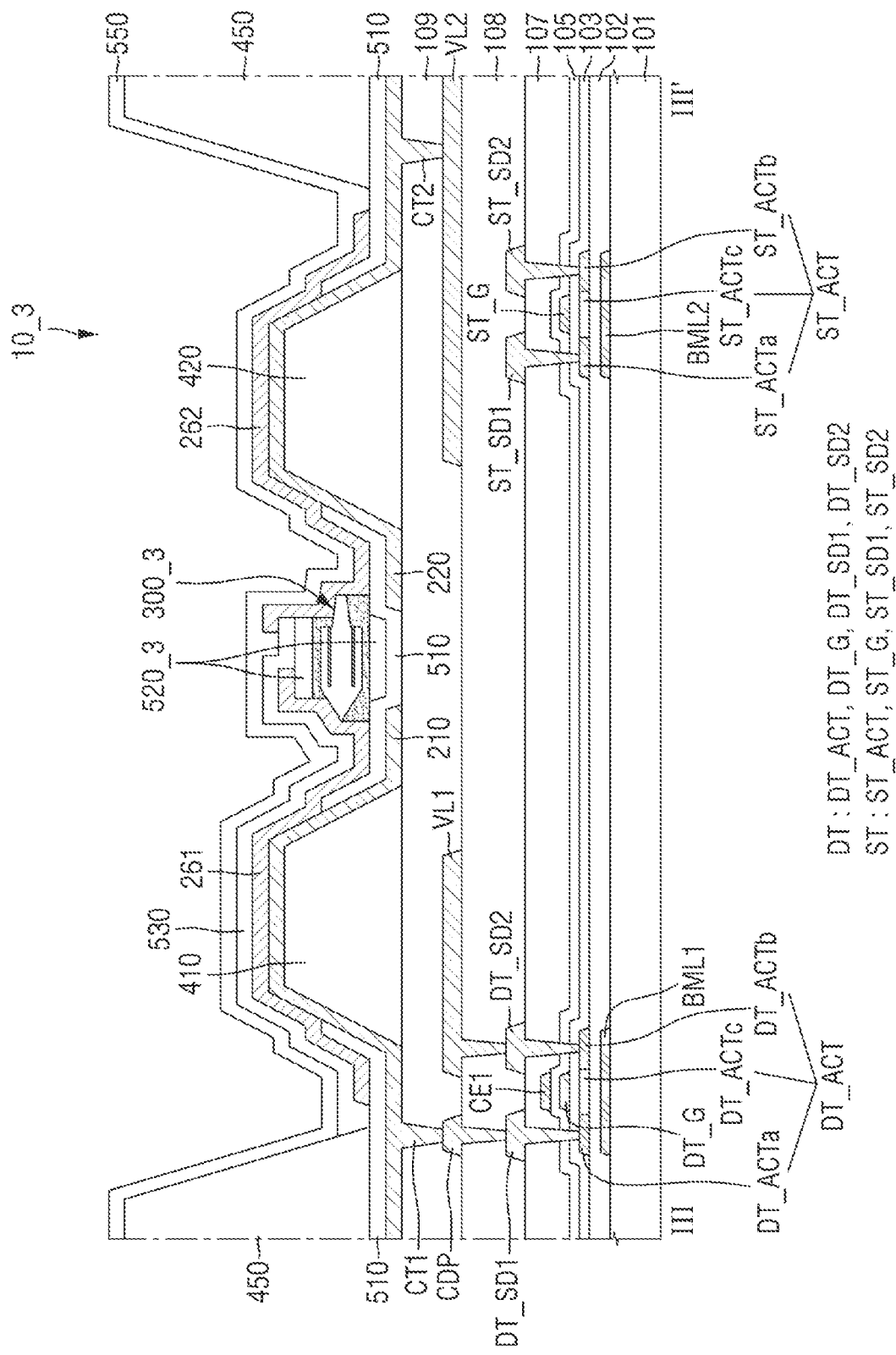
FIG. 28 is a cross-sectional view illustrating a portion of a display device including the light-emitting element of FIG. 26.

FIG. 28 is a cross-sectional view illustrating a portion of a display device including the light-emitting element of FIG. 26.

Referring to FIG. 28, a display device 10_3 according to one or more embodiments may include the light-emitting element 300_3 of FIG. 26, and a second insulation layer 520_3 may be in direct contact with the third insulation film 380C_3 of the light-emitting element 300_3. In the light-emitting element 300_3 of FIG. 26, because the main body 300A is not exposed, the second insulation layer 520_3 disposed on the light-emitting element 300_3 may be in direct contact with the third insulation film 380C_3. Other descriptions may be the same as described above.

In one or more embodiments, the insulation film 380 of the light-emitting element 300 may serve to protect the semiconductor core SC. However, as described above, the insulation film 380 may include an organic insulation material, and may further include inorganic insulation particles to improve durability of the insulation film 380.

Figure 29:
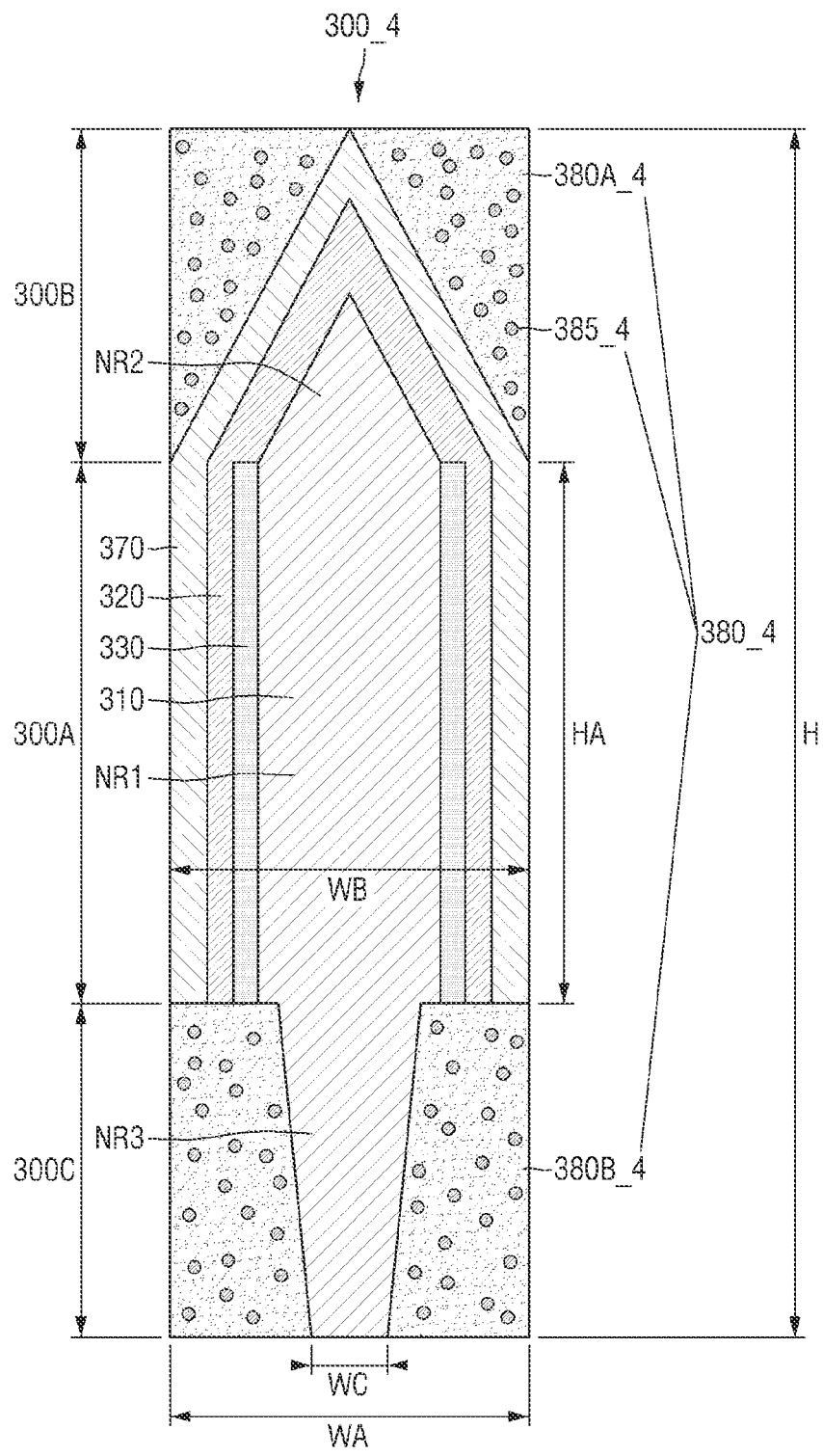
FIG. 29 is a schematic cross-sectional view of a light-emitting element according to one or more embodiments.

FIG. 29 is a schematic cross-sectional view of a light-emitting element according to one or more embodiments.

Referring to FIG. 29, in a light-emitting element 300_4 according to one or more embodiments, an insulation film 380_4 may further include inorganic particles 385_4. The inorganic particles 385_4 may be an inorganic insulation material, and for example, the inorganic particles 385_4 may be silicon oxide ($SiO_x$), silicon nitride ($SiN_x$), silicon oxynitride ($SiO_xN_y$), aluminum nitride ($Al_xN_y$), aluminum oxide ($Al_xO_y$), or the like.

As described above, in some cases, the insulation film 380_4 may include an organic insulation material. In this case, the insulation film 380_4 may be freely modified in thickness and shape, which may be suitable for the light-emitting element 300_4 to have a constant diameter, but the insulation film 380_4 may have lower durability than when the inorganic insulation material is included. In the light-emitting element 300_4 according to one or more embodiments, the insulation film 380_4 including an organic insulation material may further include the inorganic particles 385_4 dispersed in the organic insulation material. The inorganic particles 385_4 may have a transparent material so that light emitted from the active layer 330 may be smoothly emitted. In addition, in some cases, the inorganic particles 385_4 may be scatterers that scatter incident light.

In one or more embodiments, the inorganic particles 385_4 may be included in an insulation material 380' covering a semiconductor core SC during a manufacturing process of the light-emitting element 300_4. Other descriptions may be the same as those described above, and thus, a detailed description thereof will be omitted.

In one or more embodiments, as in the embodiment of FIGS. 24 and 25, when the display device 10_:2 further includes the second insulation pattern 520B_2 and the third insulation pattern 520C_2, in the light-emitting element 300, the insulation film 380 may not necessarily be formed to compensate for the inclined or stepped side surface of the semiconductor core SC. In this case, the insulation film 380 of the light-emitting element 300 may include inorganic insulation particles and have the form of a single layer formed along the outer surface of the semiconductor core SC.

Figure 30:
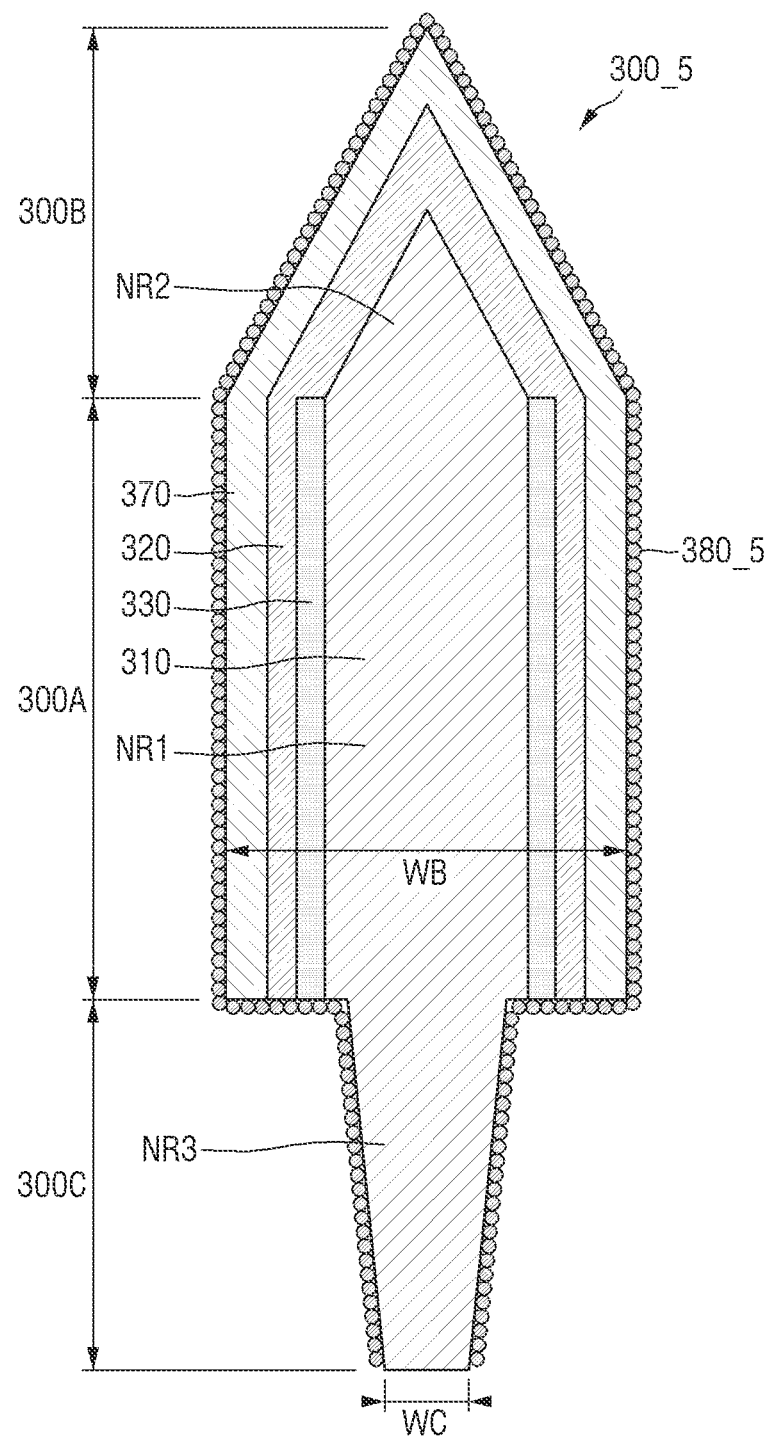
FIG. 30 is a schematic cross-sectional view of a light-emitting element according to one or more embodiments.

FIG. 30 is a schematic cross-sectional view of a light-emitting element according to one or more embodiments.

Referring to FIG. 30, a light-emitting element 300_5 according to one or more embodiments may include an insulation film 380_5 made of inorganic insulation particles. In the light-emitting element 300_5 of FIG. 30, the insulation film 380_5 may be made of the inorganic particles 385_4 of FIG. 29, and the insulation film 380_5 may be formed in an inclined or stepped structure according to the shape of an outer surface of a semiconductor core SC. In the light-emitting element 300_5, the insulation film 380_5 may have a constant thickness, and have an inclined or stepped side surface like the semiconductor core SC. However, as in the embodiment of FIGS. 24 and 25, when the second insulation layers 520_2 are disposed between both ends of the light-emitting element 300 and the electrodes 210 and 220, the material of the contact electrodes 261 and 262 may be prevented from being disconnected. In this case, the light-emitting element 300 may include the insulation film 380_5 that has high durability by including inorganic insulation particles like the light-emitting element 3005 of FIG. 30.

In the light-emitting element 300_5 of FIG. 30, the inorganic insulation particles 385_4 may be included in a dispersed state in the insulation material 380' covering the semiconductor core SC during a manufacturing process of the light-emitting element 300_5. The inorganic insulation particles 385_4 may be adsorbed on the outer surface (e.g., the outer peripheral or circumferential surface) of the semiconductor core SC, and thereafter, an insulation film 380', which is an organic insulation material, may be removed to form the insulation film 380_5 in which the inorganic insulation particles are formed as a single layer. The insulation film 380_5 is formed through adsorption by dispersing the inorganic insulation particles in the insulation material 380' without forming the inorganic insulation particles using physical or chemical vapor deposition. The insulation film 380_5 may also be smoothly formed on a third end 300C covered by the step difference of the semiconductor core SC and a lower surface of a main body 300A. In the drawing, the insulation film 380_5 is illustrated as being formed as one inorganic insulation particle forming one layer; but the present disclosure is not limited thereto. The insulation film 380_5 may be formed of a plurality of layers of inorganic insulation particles. However, because the insulation film 380_5 includes the same type of inorganic insulation particles, the inorganic insulation particles may be substantially formed as a single layer. Other descriptions may be the same as those described above, and thus, a detailed description thereof will be omitted.

In one or more embodiments, the display device 10 according to one or more embodiments may include electrodes 210 and 220 having different shapes from those of FIGS. 2 and 3.

Figure 31:
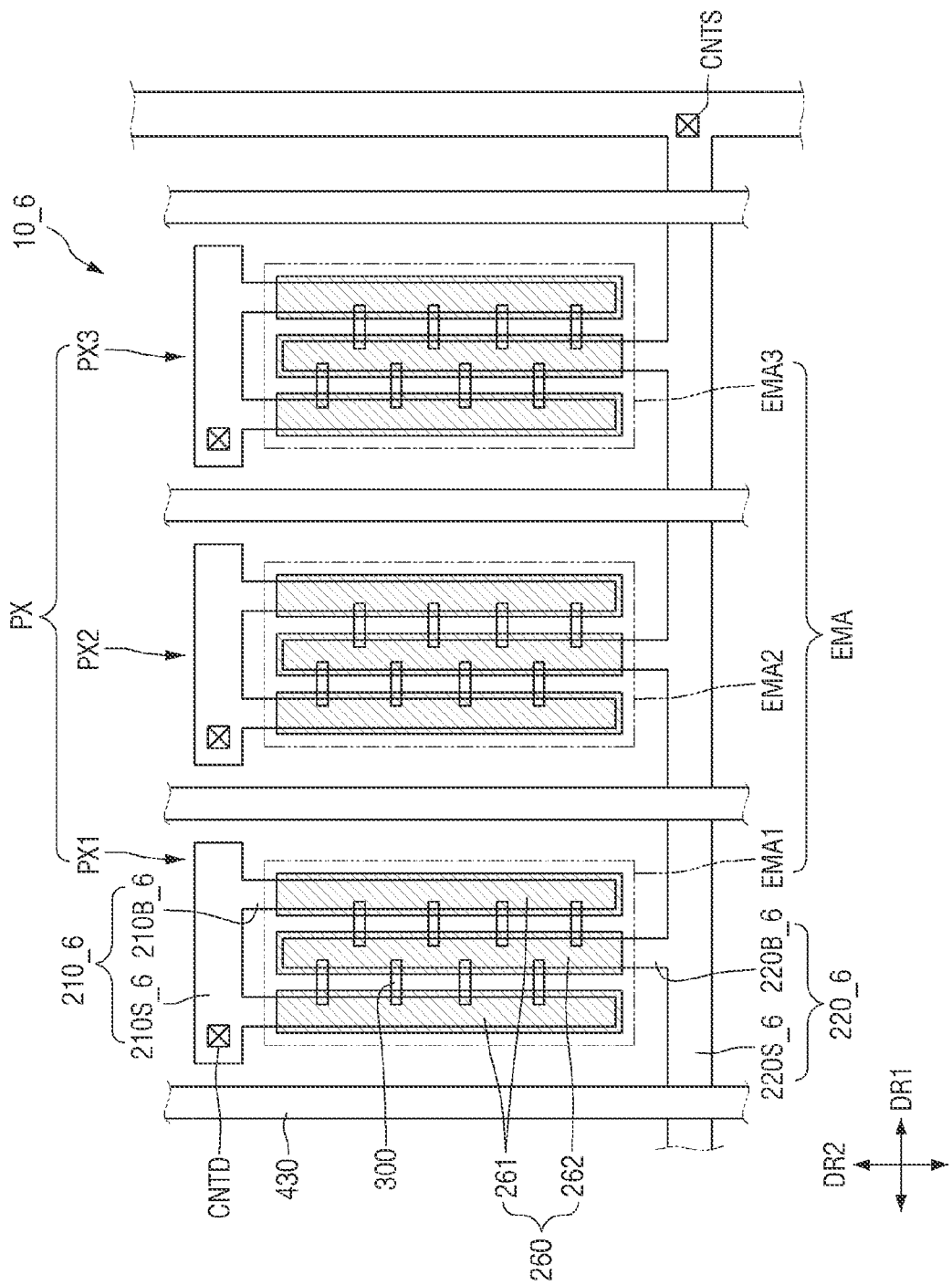
FIG. 31 is a plan view illustrating one pixel of a display device according to one or more embodiments.

FIG. 31 is a plan view illustrating one pixel of a display device according to one or more embodiments.

Referring to FIG. 31, in a display device 10_6 according to one or more embodiments, each of a first electrode 210_6 and a second electrode 220_6 may further include a portion extending in the first direction DR1. The display device 10_6 in FIG. 16 is different from the display device 10 of FIG. 2 in that shapes of the first electrode 210_6 and the second electrode 220_6 are different. Hereinafter, repeated descriptions will be omitted, and descriptions will be provided based on differences from the above-described contents.

In the display device 10_6 of FIG. 31, the first electrode 210_6 and the second electrode 220_6 may respectively include electrode stem portions 210S_6 and 220S_6 extending in the first direction DR1 and one or more electrode branch portions 210B_6 and 220B_6 respectively branched from the electrode stem portions 210S_6 and 220S_6 in the second direction DR2.

In one or more embodiments, the first electrode 210_6 may include a first electrode stem portion 210S_6 disposed to extend in the first direction DR1 and one or more first electrode branch portions 210B_6 branched from the first electrode stem portion 210S_6 to extend in the second direction DR2.

Both ends of the first electrode stem portion 210S_6 of any one pixel may be spaced from each other between the sub-pixels PXn and terminated, and placed on the substantially same straight line with the first electrode stem portion 210S_6 of an adjacent sub-pixel PXn in the same row (e.g., which is adjacent in the first direction DR1). Because both ends of each of the first electrode stem portions 210S_6 disposed in each sub-pixel PXn are spaced from each other, an electrical signal may be independently transmitted to each of the first electrode branch portions 210B_6.

The first electrode branch portion 210B_6 is branched from at least a portion of the first electrode stem portion 210S_6 and disposed to extend in the second direction DR2. However, the first electrode branch portion 2108_6 may be terminated in a state of being spaced from a second electrode stem portion 220S_6 disposed to face (e.g., oppose) the first electrode stem portion 210S_6.

The second electrode 220_6 may include the second electrode stem portion 220S_6 disposed to extend in the first direction DR1 and one or more second electrode branch portions 2208_6 branched from the second electrode stem portion 220S_6 to extend in the second direction DR2. The second electrode stem portion 220S_6 may be disposed to be spaced from and face (e.g., oppose) the first electrode stem portion 210S_6, and the second electrode branch portion 220B_6 may be disposed to be spaced from and face (e.g., oppose) the one or more first electrode branch portions 210B_6.

Unlike the first electrode stem portion 210S_6, the second electrode stem portion 220S_6 may be disposed to extend in the first direction DR1 to cross each of the sub-pixels PXn. The second electrode stem portion 220S_6 crossing each sub-pixel PXn may be connected to a peripheral portion of a display area DPA, in which each of the pixels PX or sub-pixels PXn is disposed, or connected to a portion extending from a non-display area NDA in one direction.

The second electrode branch portion 220B_6 may be branched from the second electrode stem portion 220S_6 in the second direction DR2, and terminated in a state being spaced from the first electrode stem portion 210S. Because the second electrode branch portion 220B_6 is disposed to be spaced from and face (e.g., oppose) the first electrode branch portion 210B_6, an area in which the light-emitting elements 300 are disposed may be formed between the second electrode branch portions 220B_6 and the first electrode branch portions 210B_6.

In the drawing, it is illustrated that two first electrode branch portions 210B_6 and one second electrode branch portion 220B_6 are disposed in one sub-pixel PXn, and the first electrode 210_6 is disposed in a shape surrounding an outer surface of the second electrode branch portion 220B_6. However, the present disclosure is not limited thereto. In the display device 10_6, a larger or smaller number of electrode branch portions 2108_6 and 220B_6 may be disposed in each sub-pixel PXn. In this case, the first electrode branch portions 210B_6 and the second electrode branch portions 220B_6 may be alternately disposed to be spaced from each other.

The light-emitting elements 300 may be disposed between the first electrode branch portion 210B_6 and the second electrode branch portion 220B_6, and the first contact electrode 261 and the second contact electrode 262 may be disposed on the first electrode branch portion 210B_6 and the second electrode branch portion 220B_6, respectively. The display device 10_6 of FIG. 31 includes a larger number of electrodes 210_6 and 220_6 or electrode branch portions 210B_6 and 220B_6 in one sub-pixel PXn, and a larger number of light-emitting elements 300 may be disposed. In addition, descriptions of the other members are the same as those described above with reference to FIGS. 2 and 3, and thus detailed descriptions thereof will be omitted.

Figure 32:
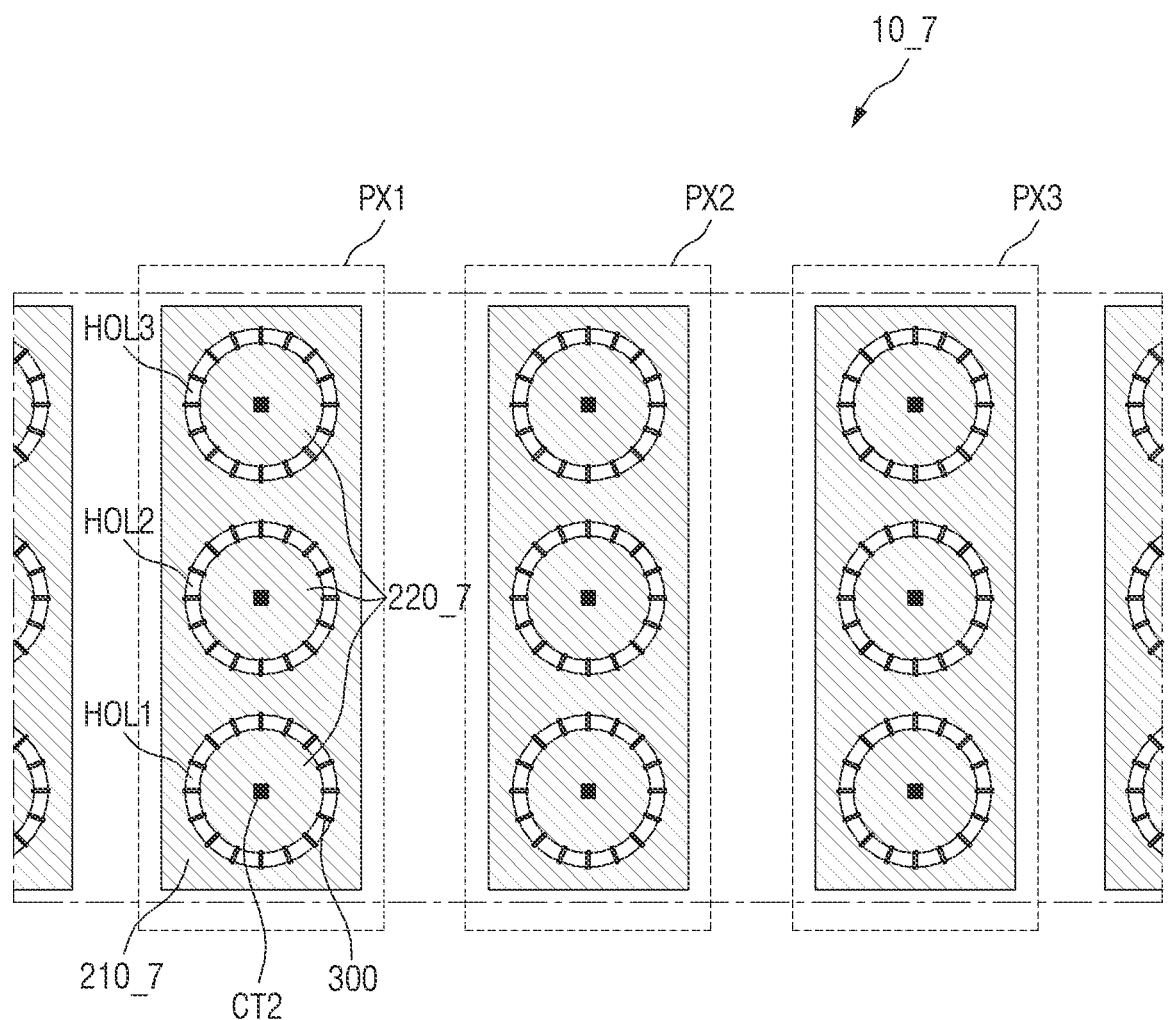
FIG. 32 is a plan view illustrating one pixel of a display device according to one or more embodiments.

FIG. 32 is a plan view illustrating one pixel of a display device according to one or more embodiments.

Referring to FIG. 32, in a display device 10_7 according to one or more embodiments, at least a partial area of each of a first electrode 210_7 and a second electrode 220_7 may include a curved shape, and the curved area of the first electrode 210_7 may be spaced from and face (e.g., oppose) the curved area of the second electrode 220_7. The display device 10_7 in FIG. 32 is different from the display device 10 of FIG. 2 in that shapes of the first electrode 210_7 and the second electrode 220_7 are different. Hereinafter, repeated descriptions will be omitted, and descriptions will be provided based on differences from the above-described contents.

The first electrode 210_7 of the display device 10_7 in FIG. 32 may include a plurality of holes HOL. As an example; as shown in the drawing, the first electrode 210_7 may include a first hole HOL1, a second hole HOL2, and a third hole HOL3 arranged along the second direction DR2. However, the present disclosure is not limited thereto, and the first electrode 210_7 may include a larger or smaller number of holes HOL, or only one hole HOL. Hereinafter, an example in which the first electrode 210_7 includes the first hole HOL1, the second hole HOL2, and the third hole HOL3 will be described.

In one or more embodiments, the first hole HOL1, the second hole HOL2, and the third hole HOL3 may each have a circular planar shape. Accordingly, the first electrode 210_7 may include a curved area formed by each hole HOL and may face (e.g., oppose) the second electrode 220_7 at the curved area. However, the above description is illustrative, and the present disclosure is not limited thereto. A shape of each of the first hole HOL1, the second hole HOL2, and the third hole HOL3 is not limited as long as the shape can provide a space in which the second electrode 220_7 is disposed as will be described below. For example, each of the first hole HOL1, the second hole HOL2, and the third hole HOL3 may have a planar shape such as an elliptical shape, a polygonal shape of a rectangular shape or more, and the like.

A plurality of second electrodes 220_7 may be disposed in each sub-pixel PXn. For example, in each sub-pixel PXn, three second electrodes 220_7 may be disposed corresponding to the first to third holes HOL1 to HOL3 of the first electrode 210_7. The second electrode 220_7 may be located in each of the first to third holes HOL1 to HOL3 and may be surrounded by the first electrode 210_7.

In one or more embodiments, each of the holes HOL of the first electrode 210_7 may have an outer surface with a curved shape, and the second electrode 220_7 disposed in correspondence with the hole HOL of the first electrode 210_7 may have an outer surface with a curved shape and may be spaced from and face (e.g., oppose) the first electrode 210_7. As shown in FIG. 32, the first electrode 210_7 includes holes HOL each having a circular shape in a plan view, and the second electrode 220_7 may have a circular shape in a plan view. In the first electrode 210_7, a curved surface of an area in which the hole HOL is formed may be spaced from and face (e.g., oppose) the curved outer surface of the second electrode 220_7. As an example, the first electrode 210_7 may be disposed to surround the outer surface of the second electrode 220_7.

As described above, light-emitting elements 300 may be disposed between the first electrode 210_7 and the second electrode 220_7. The display device 10_7 according to the present embodiment may include the second electrode 220_7 having a circular shape, and the first electrode 210_7 disposed to be around (e.g., to surround) second electrode 220_7, and the plurality of light-emitting elements 300 may be arranged along the curved outer surface of the second electrode 220_7. As described above, because each of the light-emitting elements 300 has a shape extending in one direction, the light-emitting elements 300 arranged along the curved outer surface of the second electrode 220_7 in each sub-pixel PXn may be disposed such that extending directions thereof are directed in different directions. Each of the sub-pixels PXn may have various emission directions according to the direction in which the extending direction of the light-emitting element 300 is directed. In the display device 10_7 according to the present embodiment, the first electrode 210_7 and the second electrode 220_7 are disposed to have a curved shape, and thus the light-emitting elements 300 disposed therebetween may be disposed to be directed in different directions, so that lateral visibility of the display device 10_7 may be improved.

In concluding the detailed description, those skilled in the art will appreciate that many variations and modifications can be made to the described embodiments without substantially departing from the principles and scope of the present disclosure. Therefore, the embodiments of the present disclosure are used in a generic and descriptive sense only and not for purposes of limitation.

What is claimed is:

1. A light-emitting element extending in one direction, comprising:
   a semiconductor core comprising a main body extending in the one direction, a first end connected to one side of the main body and having an inclined side surface, and a second end connected to an other side of the main body and having a width less than that of the main body; and
   an insulation film around at least a portion of an outer surface of the semiconductor core,
   wherein the insulation film comprises a first insulation film around the first end of the semiconductor core and a second insulation film around the second end of the semiconductor core, and
   a diameter of an outer surface of the first insulation film is the same as a diameter of an outer surface of the second insulation film.

2. The light-emitting element of claim 1, wherein;
   a thickness of each of the first insulation film and the second insulation film increases as a distance from the main body increases; and
   a maximum thickness of the first insulation film is greater than a maximum thickness of the second insulation film.

3. The light-emitting element of claim 2, wherein, in the semiconductor core;
   an outer surface of the main body is exposed; and
   outer surfaces of the first insulation film, the second insulation film, and the main body are collinear in cross section.

4. The light-emitting element of claim 2, wherein;
the insulation film further comprises a third insulation film around an outer surface of the main body of the semiconductor core; and
outer surfaces of the first insulation film, the second insulation film, and the third insulation film are collinear in cross section.

5. The light-emitting element of claim 4, wherein the third insulation film has a constant thickness.

6. The light-emitting element of claim 2, wherein the insulation film further comprises inorganic particles.

7. The light-emitting element of claim 1, wherein the semiconductor core comprises a first semiconductor layer, an active layer around at least a partial area of the first semiconductor layer, and a second semiconductor layer around the active layer and a partial area of the first semiconductor layer.

8. The light-emitting element of claim 7, wherein the first semiconductor layer comprises a first portion extending in the one direction, a second portion located on one side of the first portion, and a third portion located on an other side of the first portion and extending in the one direction,
wherein the second portion has a shape in which an outer surface thereof is inclined.

9. The light-emitting element of claim 8, wherein;
a diameter of the third portion is less than a diameter of the first portion, and
an outer surface of the third portion is recessed from an outer surface of the first portion toward a center of the first semiconductor layer.

10. The light-emitting element of claim 8, wherein the active layer surrounds an outer surface of the first portion.

11. A display device comprising:
a substrate;
a first electrode on the substrate;
a second electrode on the substrate and spaced from the first electrode;
a first insulation layer between the first electrode and the second electrode and covering at least a portion of each of the first electrode and the second electrode; and
a light-emitting element on the first insulation layer between the first electrode and the second electrode and extending in one direction,
wherein the light-emitting element comprises:
a semiconductor core comprising a main body extending in the one direction, a first end connected to one side of the main body and having an inclined side surface, and a second end connected to an other side of the main body and having a width less than that of the main body; and
an insulation film around at least a portion of an outer surface of the semiconductor core,
wherein the insulation film comprises a first insulation film partially surrounding the first end of the semiconductor core and a second insulation film partially surrounding the second end of the semiconductor core.

12. The display device of claim 11, wherein;
the first insulation film is located such that at least a portion of the first end is exposed;
the second insulation film is located such that at least a portion of the second end is exposed; and
the display device further comprises a first contact electrode in contact with the exposed first end and the first electrode and a second contact electrode in contact with the exposed second end and the second electrode.

13. The display device of claim 12, wherein:
the light-emitting element is located such that at least a portion of the first end of the semiconductor core is on the first electrode and at least a portion of the second end thereof is on the second electrode; and
at least a portion of each of the first insulation film and the second insulation film is in direct contact with the first insulation layer.

14. The display device of claim 13, wherein the first insulation film comprises a first residue located between the first end and the first insulation layer.

15. The display device of claim 14, wherein;
the light-emitting element comprises a first surface in which the first contact electrode is in contact with the first end, and a second surface in which the first contact electrode is in contact with the first residue; and
the second surface is not parallel to an upper surface of the substrate.

16. The display device of claim 12, further comprising a second insulation layer on the light-emitting element,
wherein a width of the second insulation layer is greater than a length of the main body of the semiconductor core.

17. The display device of claim 16, wherein the first insulation film further comprises a second residue located between the second insulation layer and the first end.

18. The display device of claim 17, wherein the light-emitting element further comprises a third surface in which the first contact electrode is in contact with the second residue,
wherein the third surface is perpendicular to an upper surface of the substrate.

19. The display device of claim 16, wherein the second insulation layer further comprises an insulation pattern located between the first end of the semiconductor core and the first electrode.

20. The display device of claim 19, wherein the first contact electrode is in contact with an upper surface of the insulation pattern.

* * * * *